(12) United States Patent
Makino et al.

(10) Patent No.: US 11,518,827 B2
(45) Date of Patent: Dec. 6, 2022

(54) CURABLE COMPOSITION, METHOD FOR PRODUCING CURABLE COMPOSITION, FILM, COLOR FILTER, METHOD FOR MANUFACTURING COLOR FILTER, SOLID-STATE IMAGING ELEMENT, AND IMAGE DISPLAY DEVICE

(71) Applicant: FUJIFILM Corporation, Tokyo (JP)

(72) Inventors: Masaomi Makino, Haibara-gun (JP); Yushi Kaneko, Haibara-gun (JP); Akio Mizuno, Haibara-gun (JP); Yasuhiro Sawamura, Haibara-gun (JP); Hiroaki Idei, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 17/143,622

(22) Filed: Jan. 7, 2021

(65) Prior Publication Data

US 2021/0122850 A1 Apr. 29, 2021

Related U.S. Application Data

(63) Continuation of application No. PCT/JP2019/028596, filed on Jul. 22, 2019.

(30) Foreign Application Priority Data

Jul. 26, 2018 (JP) .............................. JP2018-140255

(51) Int. Cl.
| | |
|---|---|
| *C08F 2/46* | (2006.01) |
| *C08F 2/50* | (2006.01) |
| *C08G 61/04* | (2006.01) |
| *C08F 22/26* | (2006.01) |
| *C08F 2/06* | (2006.01) |
| *C08K 5/00* | (2006.01) |
| *C08K 5/02* | (2006.01) |
| *C08K 5/101* | (2006.01) |
| *G03F 7/00* | (2006.01) |
| *G03F 7/028* | (2006.01) |

(52) U.S. Cl.
CPC ................ *C08F 22/26* (2013.01); *C08F 2/06* (2013.01); *C08F 2/50* (2013.01); *C08K 5/0025* (2013.01); *C08K 5/0041* (2013.01); *C08K 5/02* (2013.01); *C08K 5/101* (2013.01); *G03F 7/0007* (2013.01); *G03F 7/028* (2013.01)

(58) Field of Classification Search
CPC .......... G08F 22/26; G08F 265/06; G08F 2/50; G08F 2/06; G08F 222/1006; G08F 222/102; G08F 220/30; G08F 220/40; G08F 220/06; G08F 220/20; G08F 220/14; G08F 224/00; C09D 151/003; C09B 69/10; H01L 27/146; G03F 7/0007; G03F 7/027; G03F 7/105; G03F 7/033; G03F 7/0388; G03F 7/028; G03F 7/032; G02B 5/20; C08K 5/101; C08K 5/0041; C08K 5/0025; C08K 5/02
USPC ........... 522/36, 33, 6, 189, 184, 71, 1; 520/1
See application file for complete search history.

(56) References Cited

U.S. PATENT DOCUMENTS

| | | | |
|---|---|---|---|
| 2012/0112142 A1 | 5/2012 | Fujie et al. | |
| 2012/0264039 A1 | 10/2012 | Ito et al. | |
| 2014/0045106 A1* | 2/2014 | Fujita | ........................ F21K 9/60 |
| | | | 106/287.18 |
| 2015/0004538 A1 | 1/2015 | Kawamura et al. | |

FOREIGN PATENT DOCUMENTS

| | | | |
|---|---|---|---|
| JP | 2011-174036 A | | 9/2011 |
| JP | 2013-209639 A | | 10/2013 |
| JP | 2015-151530 A | | 8/2015 |
| JP | 2017-201003 | * | 11/2017 |
| JP | 2017-201003 A | | 11/2017 |
| WO | 2010/110199 A1 | | 9/2010 |
| WO | 2017/086245 A1 | | 5/2017 |
| WO | 2017/221620 A1 | | 12/2017 |
| WO | WO-2020110873 A1 * | 6/2020 | ............. C09B 47/04 |

OTHER PUBLICATIONS

Makino et al, WO 2020110873 Machine Translation, priority date Nov. 27, 2018 (Year: 2018).*
Taniguchi et al, JP 2017-201003 Machine Translation, Nov. 9, 2017 (Year: 2017).*
Office Action dated Jan. 11, 2022, issued by the Japanese Patent Office in Japanese application No. 2020-532375.
International Search Report dated Oct. 8, 2019, issued by the International Searching Authority in application No. PCT/JP2019/028596.
Written Opinion dated Oct. 8, 2019, issued by the International Searching Authority in application No. PCT/JP2019/028596.
International Preliminary Report on Patentability dated Jan. 26, 2021, issued by the International Bureau in application No. PCT/JP2019/028596.

* cited by examiner

*Primary Examiner* — Jessica Whiteley
(74) *Attorney, Agent, or Firm* — Sughrue Mion, PLLC

(57) ABSTRACT

The present invention provides a curable compound including a pigment, a compound A, a photopolymerization initiator, a curable compound other than the compound A, and a resin, in which a content of the compound A in a total solid content of the curable composition is 1 to 15 mass %. The compound A is a compound having each of a coloring agent partial structure, an acid group or a basic group, and a curable group. The present invention further provides a method for producing the curable composition, a film formed of the curable composition, a color filter, a method for manufacturing a color filter, a solid-state imaging element, and an image display device.

17 Claims, No Drawings

CURABLE COMPOSITION, METHOD FOR PRODUCING CURABLE COMPOSITION, FILM, COLOR FILTER, METHOD FOR MANUFACTURING COLOR FILTER, SOLID-STATE IMAGING ELEMENT, AND IMAGE DISPLAY DEVICE

CROSS-REFERENCE TO RELATED APPLICATIONS

This application is a Continuation of PCT International Application No. PCT/JP2019/028596 filed on Jul. 22, 2019, which claims priority under 35 U.S.C § 119(a) to Japanese Patent Application No. 2018-140255 filed on Jul. 26, 2018. Each of the above application(s) is hereby expressly incorporated by reference, in its entirety, into the present application.

BACKGROUND OF THE INVENTION

1. Field of the Invention

The present invention relates to a curable composition including a pigment. The present invention further relates to a method for producing a curable composition, a film formed of a curable composition, a color filter, a method for manufacturing a color filter, a solid-state imaging element, and an image display device.

2. Description of the Related Art

In recent years, as a digital camera, a mobile phone with a camera, and the like have been further spreading, there has been a greatly increasing demand for a solid-state imaging element such as a charge coupled device (CCD) image sensor. A color filter has been used as a key device in a display or an optical element.

The color filter has been manufactured using a curable composition including a colorant and a curable compound. In addition, in a case where a pigment is used as the colorant, the pigment is generally dispersed in the curable composition using a pigment derivative, a dispersant, or the like (see JP2015-151530A).

On the other hand, JP2013-209639A discloses an invention relating to a toner including an azo pigment and an azo compound in which a predetermined azo coloring agent structure is bonded to a repeating unit derived from a styrene compound, a (meth)acrylic acid compound, a (meth)acrylic acid ester compound, or a (meth)acrylic acid amide compound.

SUMMARY OF THE INVENTION

In recent years, a film used for a color filter or the like has been required to be thinner. In order to achieve a thin film while maintaining desired spectral performance, it is necessary to increase concentration of the colorant in the curable composition used for film formation. However, in a case where the concentration of the colorant in the curable composition is increased, since the contents other than the colorant are relatively small, curability tends to be insufficient. In addition, in a case where a pigment is used as the colorant, dispersibility of the pigment tends to be insufficient. Therefore, in the curable composition including a pigment, it is required to achieve both dispersibility of the pigment and curability at a higher level.

Accordingly, an object of the present invention is to provide a curable composition having excellent dispersibility of a pigment and curability, a method for producing the curable composition, a film formed of the curable composition, a color filter, a method for manufacturing a color filter, a solid-state imaging element, and an image display device.

According to the studies conducted by the present inventors, it has been found that the above-described object can be achieved by adopting the following configuration, thereby leading to the completion of the present invention. Therefore, the present invention provides the following.

<1> A curable compound comprising:
  a pigment;
  a compound A having each of a coloring agent partial structure, an acid group or a basic group, and a curable group;
  a photopolymerization initiator;
  a curable compound other than the compound A; and
  a resin,
  in which a content of the compound A in a total solid content of the curable composition is 1 to 15 mass %.

<2> The curable composition according to <1>,
  in which the coloring agent partial structure included in the compound A is a partial structure derived from a coloring agent selected from a benzimidazolone coloring agent, a benzimidazolinone coloring agent, a quinophthalone coloring agent, a phthalocyanine coloring agent, an anthraquinone coloring agent, a diketopyrrolopyrrole coloring agent, a quinacridone coloring agent, an azo coloring agent, an isoindolinone coloring agent, an isoindoline coloring agent, a dioxazine coloring agent, a perylene coloring agent, and a thioindigo coloring agent.

<3> The curable composition according to <1> or <2>,
  in which the acid group included in the compound A is at least one selected from a carboxyl group, a sulfo group, a phosphoric acid group, and salts thereof, and the basic group included in the compound A is at least one selected from an amino group, a pyridyl group, salts thereof, a salt of an ammonium group, and a phthalimidomethyl group.

<4> The curable composition according to any one of <1> to <3>,
  in which the curable group included in the compound A is at least one selected from an ethylenically unsaturated bonding group and a cyclic ether group.

<5> The curable composition according to any one of <1> to <4>,
  in which the compound A is a compound having each of the coloring agent partial structure, the basic group, and the curable group.

<6> The curable composition according to any one of <1> to <5>,
  in which the compound A is a compound represented by any one of Formulae (A1) to (A3),

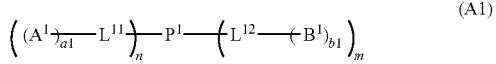

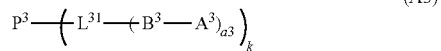

in Formula (A1), $P^1$ represents the coloring agent partial structure, $L^{11}$ represents an a1+1 valent linking group, $L^{12}$ represents a b1+1 valent linking group, $A^1$ represents the curable group, $B^1$ represents the acid group or the basic group, and a1, b1, n, and m each independently represent an integer of 1 or more, in Formula (A2), $P^2$ represents the coloring agent partial structure, $L^{21}$ represents an a2+b2+1 valent linking group, $A^2$ represents the curable group, $B^2$ represents the acid group or the basic group, and a2, b2, and j each independently represent an integer of 1 or more, and in Formula (A3), $P^3$ represents the coloring agent partial structure, $L^{31}$ represents an a3+1 valent linking group, $A^3$ represents the curable group, $B^3$ represents the acid group or the basic group, and a3 and k each independently represent an integer of 1 or more.

<7> The curable composition according to <6>, in which $L^{11}$, $L^{12}$, $L^{21}$, and $L^{31}$ are each independently represented by any one of Formulae (L-1) to (L-5),

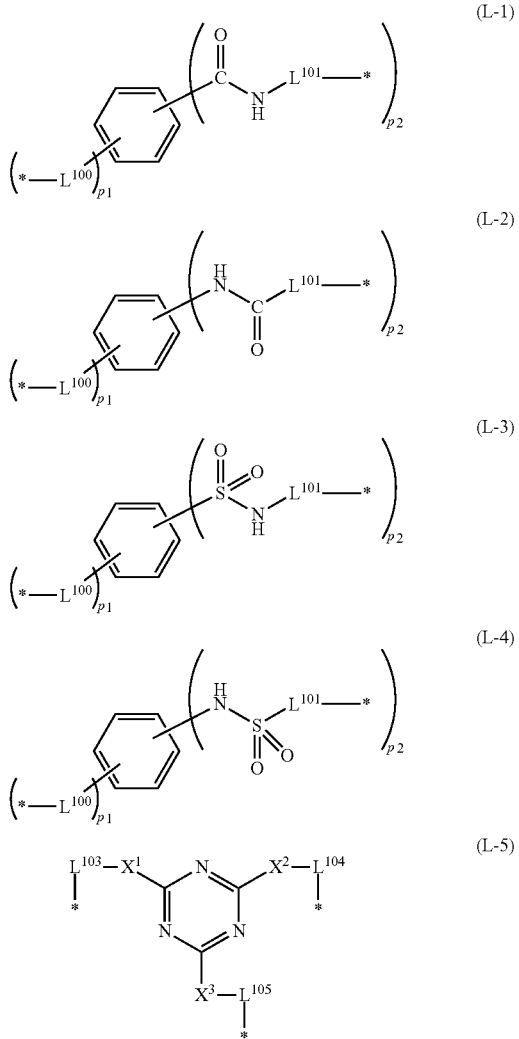

in the formulae, * represents a bonding hand, p1 represents an integer of 0 to 5 and p2 represents an integer of 1 to 6, in which p1+p2 is an integer of 2 to 6, $L^{100}$ to $L^{105}$ each independently represent a single bond or a divalent linking group, and $X^1$, $X^2$, and $X^3$ each independently represent —O—, —S—, or —$NR^{L1}$—, in which $R^{L1}$ represents a hydrogen atom, an alkyl group, or an aryl group.

<8> The curable composition according to any one of <1> to <7>, in which the resin includes a resin having an acid group.

<9> The curable composition according to any one of <1> to <8>, in which the pigment includes a chromatic pigment.

<10> The curable composition according to any one of <1> to <9>, in which the pigment includes a green pigment.

<1> The curable composition according to any one of <1> to <10>, in which the curable composition includes two or more kinds of the pigment.

<12> The curable composition according to anyone of <1> to <11>, in which the curable compound includes a polyfunctional polymerizable monomer.

<13> The curable composition according to any one of <1> to <12>, further comprising:

an organic solvent.

<14> The curable composition according to any one of <1> to <13>, in which the curable composition is used for forming a pixel of a color filter.

<15> The curable composition according to <14>, in which the curable composition is used for forming a green pixel.

<16> A method for producing the curable composition according to any one of <1> to <15>, the method comprising:

a step of dispersing the pigment in a presence of the compound A having each of a coloring agent partial structure, an acid group or a basic group, and a curable group, and the resin.

<17> A film which is formed from the curable composition according to any one of <1> to <15>.

<18> A color filter comprising:

the film according to <17>.

<19> A method for manufacturing a color filter, comprising:

a step of forming a curable composition layer on a support using the curable composition according to any one of <1> to <15>; and a step of forming a pattern on the curable composition layer by a photolithography method.

<20> A solid-state imaging element comprising:

the film according to <17>.

<21> An image display device comprising:

the film according to <17>.

According to the present invention, it is possible to provide a curable composition having excellent dispersibility of a pigment and curability, a method for producing the curable composition, a film formed of the curable composition, a color filter, a method for manufacturing a color filter, a solid-state imaging element, and an image display device.

DESCRIPTION OF THE PREFERRED EMBODIMENTS

Hereinafter, the details of the present invention will be described.

In the present specification, numerical ranges represented by "to" include numerical values before and after "to" as lower limit values and upper limit values.

In the present specification, unless specified as a substituted group or as an unsubstituted group, a group (atomic group) denotes not only a group (atomic group) having no substituent but also a group (atomic group) having a substituent. For example, "alkyl group" denotes not only an alkyl group having no substituent (unsubstituted alkyl group) but also an alkyl group having a substituent (substituted alkyl group).

In the present specification, unless specified otherwise, "exposure" denotes not only exposure using light but also drawing using a corpuscular beam such as an electron beam or an ion beam. Examples of the light used for exposure include an actinic ray or radiation, for example, a bright light spectrum of a mercury lamp, a far ultraviolet ray represented by excimer laser, an extreme ultraviolet ray (EUV ray), an X-ray, or an electron beam.

In the present specification, "(meth)acrylate" denotes either or both of acrylate and methacrylate, "(meth)acryl" denotes either or both of acryl and methacryl, and "(meth)acryloyl" denotes either or both of acryloyl and methacryloyl.

In the present specification, in a structural formula, Me represents a methyl group, Et represents an ethyl group, Bu represents a butyl group, and Ph represents a phenyl group.

In the present specification, a weight-average molecular weight and a number-average molecular weight are values in terms of polystyrene through measurement by a gel permeation chromatography (GPC) method.

In the present specification, near-infrared rays denote light having a wavelength in a range of 700 to 2500 nm.

In the present specification, a total solid content denotes the total mass of all the components of the composition excluding a solvent.

In the present specification, a pigment means a compound which is hardly dissolved in a solvent. For example, as the pigment, both of the solubility in 100 g of water at 23° C. and 100 g of propylene glycol monomethyl ether acetate at 23° C. is preferably 0.1 g or less and more preferably 0.01 g or less.

In the present specification, the term "step" denotes not only an individual step but also a step which is not clearly distinguishable from another step as long as an effect expected from the step can be achieved.

<Curable Composition>

The curable compound according to an embodiment of the present invention includes a pigment, a compound A having each of a coloring agent partial structure, an acid group or a basic group, and a curable group, a photopolymerization initiator, a curable compound other than the above-described compound A; and a resin, in which a content of the compound A in a total solid content of the curable composition is 1 to 15 mass %.

The curable composition according to the embodiment of the present invention has excellent dispersibility of the pigment and curability. The reason for obtaining such an effect is assumed as follows. It is assumed that the coloring agent partial structure included in the compound A interacts with the pigment and is adsorbed to the pigment. In addition, it is assumed that the acid group or the basic group included in the compound A interacts with the resin and is adsorbed to the resin. Therefore, in the curable composition, it is assumed that a pigment-compound A-resin network is easily formed and aggregation of the pigment is suppressed, and excellent dispersibility of the pigment is obtained. In addition, since the compound A has the curable group, it is assumed that curability of the film obtained by reacting the compound A in the vicinity of the pigment can be further enhanced.

The curable composition according to the embodiment of the present invention can be used for a color filter, a near-infrared transmission filter, a near-infrared cut filter, a black matrix, a light-shielding film, a refractive index adjusting film, a microlens, and the like. In particular, the curable composition according to the embodiment of the present invention can be preferably used as a curable composition for forming a pixel of a color filter, and can be more preferably used as a curable composition for forming a green pixel of a color filter. In addition, the curable composition according to the embodiment of the present invention can also be used as a composition for forming a color microlens. Examples of a method for manufacturing the color microlens include the method described in JP2018-010162A.

Hereinafter, the respective components used in the curable composition according to the embodiment of the present invention will be described.

<<Pigment>>

The curable composition according to the embodiment of the present invention contains a pigment. Examples of the pigment include a white pigment, a black pigment, a chromatic pigment, and a near-infrared absorbing pigment. In the present invention, the white pigment includes not only a pure white pigment but also a bright gray (for example, grayish-white, light gray, and the like) pigment close to white. In addition, the pigment may be an inorganic pigment or an organic pigment, but from the viewpoint that dispersion stability is more easily improved, an organic pigment is preferable. In addition, the pigment is preferably a pigment including a chromatic pigment and more preferably a pigment including a green pigment. In addition, as the pigment, a material in which an inorganic pigment or an organic-inorganic pigment is substituted with an organic chromophore can also be used. By substituting an inorganic pigment or an organic-inorganic pigment with an organic chromophore, color tone design can be easily performed.

The average primary particle diameter of the pigment is preferably 1 to 200 nm. The lower limit is preferably 5 nm or more and more preferably 10 nm or more. The upper limit is preferably 180 nm or less, more preferably 150 nm or less, and still more preferably 100 nm or less. In a case where the average primary particle diameter of the pigment is within the above-described range, dispersion stability of the pigment in the curable composition is good. In the present invention, the primary particle diameter of the pigment can be determined from an image obtained by observing primary particles of the pigment using a transmission electron microscope. Specifically, a projected area of the primary particles of the pigment is determined, and the corresponding equivalent circle diameter is calculated as the primary particle diameter of the pigment. In addition, the average primary particle diameter in the present invention is the arithmetic average value of the primary particle diameters with respect to 400 primary particles of the pigment. In addition, the primary particle of the pigment refers to a particle which is independent without aggregation.

(Chromatic Pigment)

The chromatic pigment is not particularly limited, and a known chromatic pigment can be used. Examples of the chromatic pigment include a pigment having a maximum absorption wavelength in a wavelength range of 400 to 700 nm. Examples thereof include a yellow pigment, an orange pigment, a red pigment, a green pigment, a violet pigment, and a blue pigment. Specific examples of these pigments include the following pigments.

Color Index (C. I.) Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, 214, 231, and 232 (all of which are yellow pigments);

C. I. Pigment Orange 2, 5, 13, 16, 17:1, 31, 34, 36, 38, 43, 46, 48, 49, 51, 52, 55, 59, 60, 61, 62, 64, 71, and 73 (all of which are orange pigments);

C. I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, 279, and 294 (all of which are red pigments);

C. I. Pigment Green 7, 10, 36, 37, 58, 59, 62, and 63 (all of which are green pigments);

C. I Pigment Violet 1, 19, 23, 27, 32, 37, 42, 60, and 61 (all of which are violet pigments); and C. I. Pigment Blue 1, 2, 15, 15:1, 15:2, 15:3, 15:4, 15:6, 16, 22, 29, 60, 64, 66, 79, 80, 87, and 88 (all of which are blue pigments).

In addition, as the green pigment, a halogenated zinc phthalocyanine pigment having an average number of halogen atoms in one molecule of 10 to 14, an average number of bromine atoms in one molecule of 8 to 12, and an average number of chlorine atoms in one molecule of 2 to 5 can also be used. Specific examples thereof include compounds described in WO2015/118720A. In addition, as the green pigment, compounds described in CN2010-6909027A, a phthalocyanine compound having a phosphoric acid ester as a ligand, or the like can also be used.

In addition, as the blue pigment, an aluminum phthalocyanine compound having a phosphorus atom can also be used. Specific examples thereof include the compounds described in paragraphs "0022" to "0030" of JP2012-247591A and paragraph "0047" of JP2011-157478A.

In addition, as the yellow pigment, pigments described in JP2017-201003A and pigments described in JP2017-197719A can be used. In addition, as the yellow pigment, a metal azo pigment which includes at least one kind of an anion selected from an azo compound represented by Formula (I) or an azo compound having a tautomeric structure of the azo compound represented by Formula (I), two or more kinds of metal ions, and a melamine compound can also be used.

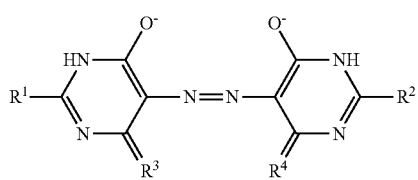

(I)

In the formula, $R^1$ and $R^2$ each independently represent —OH or —$NR^5R^6$, and $R^3$ and $R^4$ each independently represent =O or =$NR^7$, in which $R^5$ to $R^7$ each independently represent a hydrogen atom or an alkyl group. The number of carbon atoms in the alkyl group represented by $R^5$ to $R^7$ is preferably 1 to 10, more preferably 1 to 6, and still more preferably 1 to 4. The alkyl group may be linear, branched, or cyclic, and is preferably linear or branched and more preferably linear. The alkyl group may have a substituent. The substituent is preferably a halogen atom, a hydroxy group, an alkoxy group, a cyano group, or an amino group.

With regard to the metal azo pigment, reference can be made to the description in paragraphs "0011" to "0062" and "0137" to "0276" of JP2017-171912A, paragraphs "0010" to "0062" and "0138" to "0295" of JP2017-171913A, paragraphs "0011" to "0062" and "0139" to "0190" of JP2017-171914A, and paragraphs "0010" to "0065" and "0142" to "0222" of JP2017-171915A, the contents of which are incorporated herein by reference.

In addition, as the yellow pigment, compounds described in JP2018-062644A can also be used. These compounds can also be used as a pigment derivative.

As the red pigment, diketopyrrolopyrrole-based pigments described in JP2017-201384A, in which the structure has at least one substituted bromine atom, diketopyrrolopyrrole-based pigments described in paragraphs "0016" to "0022" of JP6248838B, and the like can also be used. In addition, as the red pigment, a compound having a structure that an aromatic ring group in which a group bonded with an oxygen atom, a sulfur atom, or a nitrogen atom is introduced to an aromatic ring is bonded to a diketopyrrolopyrrole skeleton can also be used. As the compound, a compound represented by Formula (DPP1) is preferable, and a compound represented by Formula (DPP2) is more preferable.

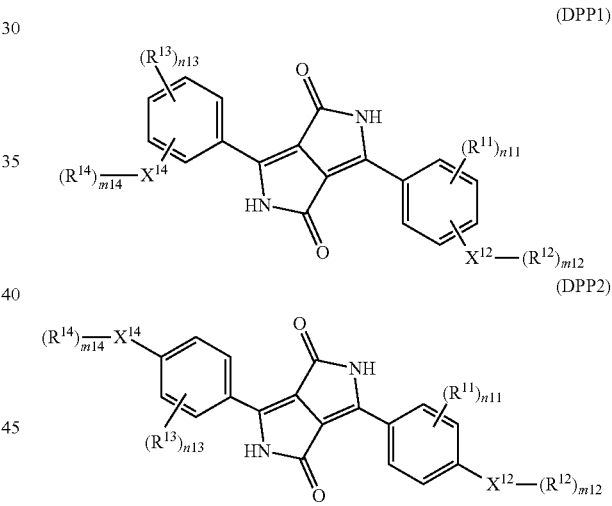

In the formulae, $R^{11}$ and $R^{13}$ each independently represent a substituent, $R^{12}$ and $R^{14}$ each independently represent a hydrogen atom, an alkyl group, an aryl group, or a heteroaryl group, n11 and n13 each independently represent an integer of 0 to 4, $X^{12}$ and $X^{14}$ each independently represent an oxygen atom, a sulfur atom, or a nitrogen atom, in a case where $X^{12}$ is an oxygen atom or a sulfur atom, m12 represents 1, in a case where $X^{12}$ is a nitrogen atom, m12 represents 2, in a case where $X^{14}$ is an oxygen atom or a sulfur atom, m14 represents 1, and in a case where $X^{14}$ is a nitrogen atom, m14 represents 2. Examples of the substituent represented by $R^{11}$ and $R^{13}$ include the groups in a substituent T described later, and preferred specific examples thereof include an alkyl group, an aryl group, a halogen atom, an acyl group, an alkoxycarbonyl group, an aryloxycarbonyl group, a heteroaryloxycarbonyl group, an amide group, a cyano group, a nitro group, a trifluoromethyl group, a sulfoxide group, and a sulfo group.

In the present invention, the chromatic pigment may be used in combination of two or more kinds thereof.

(White Pigment)

Examples of the white pigment include titanium oxide, strontium titanate, barium titanate, zinc oxide, magnesium oxide, zirconium oxide, aluminum oxide, barium sulfate, silica, talc, mica, aluminum hydroxide, calcium silicate, aluminum silicate, hollow resin particles, and zinc sulfide. The white pigment is preferably particles having a titanium atom, more preferably titanium oxide. In addition, the white pigment is preferably a particle having a refractive index of 2.10 or more with respect to light having a wavelength of 589 nm. The above-mentioned refractive index is preferably 2.10 to 3.00 and more preferably 2.50 to 2.75.

In addition, as the white pigment, the titanium oxide described in "Titanium Oxide-Physical Properties and Applied Technology, written by Manabu Kiyono, pages 13 to 45, published in Jun. 25, 1991, published by Shuppan Co., Ltd." can also be used.

The white pigment is not limited to a compound formed of a single inorganic substance, and may be particles combined with other materials. For example, it is preferable to use a particle having a pore or other materials therein, a particle having a number of inorganic particles attached to a core particle, or a core-shell composite particle composed of a core particle formed of polymer particles and a shell layer formed of inorganic fine nanoparticles. With regard to the core-shell composite particle composed of a core particle formed of polymer particles and a shell layer formed of inorganic fine nanoparticles, reference can be made to, for example, the descriptions in paragraphs "0012" to "0042" of JP2015-047520A, the contents of which are incorporated herein by reference.

As the white pigment, hollow inorganic particles can also be used. The hollow inorganic particles refer to inorganic particles having a structure with a cavity therein, and the cavity is enclosed by an outer shell. As the hollow inorganic particles, hollow inorganic particles described in JP2011-075786A, WO2013/061621A, JP2015-164881A, and the like can be used, the contents of which are incorporated herein by reference.

(Black Pigment)

The black pigment is not particularly limited, and a known black pigment can be used. Examples thereof include carbon black, titanium black, and graphite, and carbon black or titanium black is preferable and titanium black is more preferable. The titanium black is black particles containing a titanium atom, and is preferably lower titanium oxide or titanium oxynitride. The surface of the titanium black can be modified, as necessary, according to the purpose of improving dispersibility, suppressing aggregating properties, and the like. For example, the surface of the titanium black can be coated with silicon oxide, titanium oxide, germanium oxide, aluminum oxide, magnesium oxide, or zirconium oxide. In addition, a treatment with a water-repellent substance as described in JP2007-302836A can be performed. Examples of the black pigment include Color Index (C. I.) Pigment Black 1 and 7. It is preferable that the titanium black has a small primary particle diameter of the individual particles and has a small average primary particle diameter. Specifically, the average primary particle diameter thereof is preferably 10 to 45 nm. The titanium black can be used as a dispersion. Examples thereof include a dispersion which includes titanium black particles and silica particles and in which the content ratio of Si atoms to Ti atoms is adjusted to a range of 0.20 to 0.50. With regard to the dispersion, reference can be made to the description in paragraphs "0020" to "0105" of JP2012-169556A, the contents of which are incorporated herein by reference. Examples of a commercially available product of the titanium black include Titanium black 10S, 12S, 13R, 13M, 13M-C, 13R-N, 13M-T (trade name; manufactured by Mitsubishi Materials Corporation) and Tilack D (trade name; manufactured by Akokasei Co., Ltd.).

(Near-Infrared Absorbing Pigment)

The near-infrared absorbing pigment is preferably an organic pigment. In addition, the near-infrared absorbing pigment preferably has a maximum absorption wavelength in a wavelength range of more than 700 nm and 1400 nm or less. In addition, the maximum absorption wavelength of the near-infrared absorbing pigment is preferably 1200 nm or less, more preferably 1000 nm or less, and still more preferably 950 nm or less. In addition, in the near-infrared absorbing pigment, $A_{550}/A_{max}$, which is a ratio of an absorbance $A_{550}$ at a wavelength of 550 nm to an absorbance $A_{max}$ at the maximum absorption wavelength, is preferably 0.1 or less, more preferably 0.05 or less, still more preferably 0.03 or less, and particularly preferably 0.02 or less. The lower limit is not particularly limited, but for example, may be 0.0001 or more or may be 0.0005 or more. In a case where the ratio of the above-described absorbance is within the above-described range, a near-infrared absorbing pigment excellent in visible transparency and near-infrared shielding properties can be obtained. In the present invention, the maximum absorption wavelength of the near-infrared absorbing pigment and values of absorbance at each wavelength are values obtained from an absorption spectrum of a film formed by using a curable composition including the near-infrared absorbing pigment.

The near-infrared absorbing pigment is not particularly limited, and examples thereof include a pyrrolopyrrole compound, a rylene compound, an oxonol compound, a squarylium compound, a cyanine compound, a croconium compound, a phthalocyanine compound, a naphthalocyanine compound, a pyrylium compound, an azurenium compound, an indigo compound, and a pyrromethene compound. Among these, at least one compound selected from a pyrrolopyrrole compound, a squarylium compound, a cyanine compound, a phthalocyanine compound, or a naphthalocyanine compound is preferable, and a pyrrolopyrrole compound or a squarylium compound is still more preferable, and a pyrrolopyrrole compound is particularly preferable.

The content of the pigment in the total solid content of the curable composition is preferably 5 mass % or more, more preferably 10 mass % or more, still more preferably 20 mass % or more, and even more preferably 30 mass % or more, and particularly preferably 40 mass % or more. The upper limit is preferably 90 mass % or less, more preferably 80 mass % or less, and still more preferably 70 mass % or less.

<<Dye>>

The curable composition according to the embodiment of the present invention can contain a dye. As the dye, a known dye can be used without any particular limitation. The dye may be a chromatic dye or may be a near-infrared absorbing dye. Examples of the chromatic dye include a pyrazoleazo compound, an anilinoazo compound, a triarylmethane compound, an anthraquinone compound, an anthrapyridone compound, a benzylidene compound, an oxonol compound, a pyrazolotriazoleazo compound, a pyridoneazo compound, a cyanine compound, a phenothiazine compound, a pyrrolopyrazoleazomethine compound, a xanthene compound, a phthalocyanine compound, a benzopyran compound, an indigo compound, and a pyrromethene compound. In addition, thiazole compounds described in JP2012-158649A, azo compounds described in JP2011-184493A, or azo compounds described in JP2011-145540A can also be used. In addition, as yellow dyes, quinophthalone compounds described in paragraphs "0011" to "0034" of JP2013-054339A, quinophthalone compounds described in paragraphs "0013" to "0058" of JP2014-026228A, or the like can also be used. Examples of the near-infrared absorbing dye include a pyrrolopyrrole compound, a rylene compound, an oxonol compound, a squarylium compound, a cyanine compound, a croconium compound, a phthalocyanine compound, a naphthalocyanine compound, a pyrylium compound, an azurenium compound, an indigo compound, and a pyrromethene compound. In addition, squarylium compounds described in JP2017-197437A, squarylium compounds described in paragraphs "0090" to "0107" of WO2017/213047A, pyrrole ring-containing compounds described in paragraphs "0019" to "0075" of JP2018-054760A, pyrrole ring-containing compounds described in paragraphs "0078" to "0082" of JP2018-040955A, pyrrole ring-containing compounds described in paragraphs "0043" to "0069" of JP2018-002773A, squarylium compounds having an aromatic ring at the amide α-position described in paragraphs "0024" to "0086" of JP2018-041047A, amide-linked squarylium compounds described in JP2017-179131A, compounds having a pyrrole bis-type squarylium skeleton or a croconium skeleton described in JP2017-141215A, dihydrocarbazole bis-type squarylium compounds described in JP2017-082029A, asymmetric compounds described in paragraphs "0027" to "0114" of JP2017-068120A, pyrrole ring containing compounds (carbazole type) described in JP2017-067963A, and phthalocyanine compounds described in JP6251530B.

The content of the dye in the total solid content of the curable composition is preferably 1 mass % or more, more preferably 5 mass % or more, and particularly preferably 10 mass % or more. The upper limit is not particularly limited, but is preferably 70 mass % or less, more preferably 65 mass % or less, and still more preferably 60 mass % or less.

In addition, the content of the dye is preferably 5 to 50 parts by mass with respect to 100 parts by mass of the pigment. The upper limit is preferably 45 parts by mass or less and more preferably 40 parts by mass or less. The lower limit is preferably 10 parts by mass or more and still more preferably 15 parts by mass or more.

In addition, it is also possible that the curable composition according to the embodiment of the present invention does not substantially contain the dye. The case where the curable composition according to the embodiment of the present invention does not substantially include the dye means that the content of the dye in the total solid content of the curable composition according to the embodiment of the present invention is preferably 0.1 mass % or less, more preferably 0.05 mass % or less, and particularly preferably 0 mass %.

<<Compound A>>

The curable composition according to the embodiment of the present invention contains a compound A having each of a coloring agent partial structure, an acid group or a basic group, and a curable group. The compound A can be used as a dispersion aid for pigments.

The coloring agent partial structure included in the compound A is preferably a partial structure derived from a coloring agent selected from a benzimidazolone coloring agent, a benzimidazolinone coloring agent, a quinophthalone coloring agent, a phthalocyanine coloring agent, an anthraquinone coloring agent, a diketopyrrolopyrrole coloring agent, a quinacridone coloring agent, an azo coloring agent, an isoindolinone coloring agent, an isoindoline coloring agent, a dioxazine coloring agent, a perylene coloring agent, and a thioindigo coloring agent, and from the reason that the effects of the present invention are more significantly and easily obtained, more preferably a partial structure derived from a coloring agent selected from a benzimidazolone coloring agent, a benzimidazolinone coloring agent, a phthalocyanine coloring agent, a diketopyrrolopyrrole coloring agent, and an azo coloring agent, and still more preferably a partial structure derived from a coloring agent selected from a benzimidazolinone coloring agent and an azo coloring agent.

The coloring agent partial structure preferably has a structure represented by any one of Formulae (Pg-1) to (Pg-10), or a structure obtained by removing one or more hydrogen atoms from these structures, and more preferably has a structure represented by any one of Formula (Pg-1), Formula (Pg-2), Formula (Pg-3), Formula (Pg-5), or Formula (Pg-7), or a structure obtained by removing one or more hydrogen atoms from these structures. In Formula (Pg-3), M represents a metal atom, a metal oxide, or a metal halide.

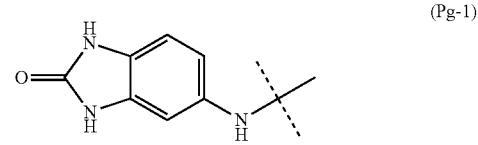

(Pg-1)

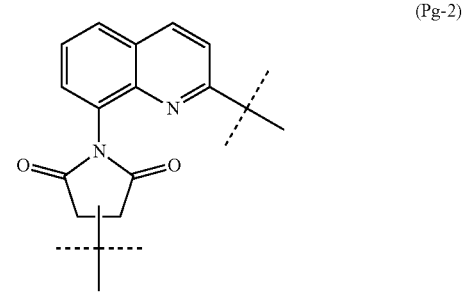

(Pg-2)

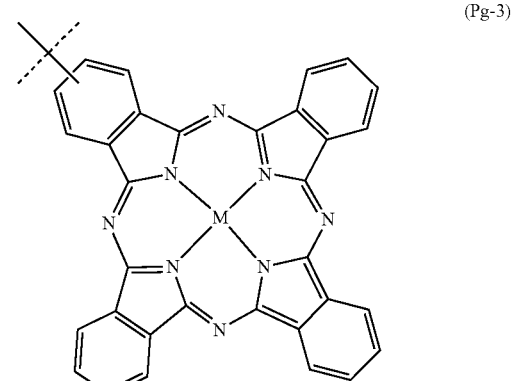

(Pg-3)

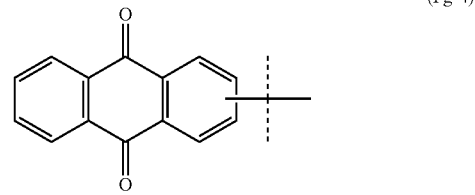

(Pg-4)

(Pg-5)
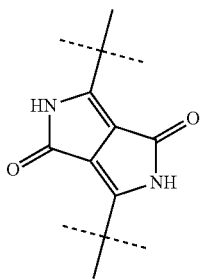

(Pg-6)
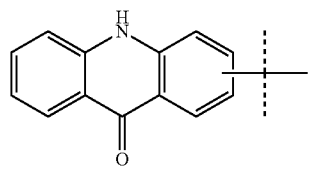

(Pg-7)
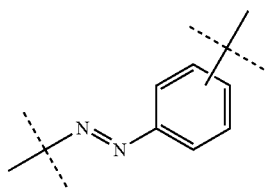

(Pg-8)
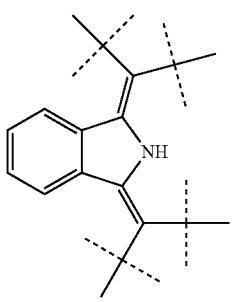

(Pg-9)
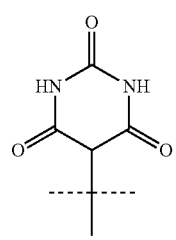

(Pg-10)
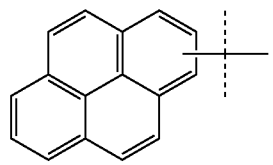

The number of coloring agent partial structures included in the compound A may be 1, or may be 2 or more.

The acid group included in the compound A is preferably at least one selected from a carboxyl group, a sulfo group, a phosphoric acid group, and salts thereof, and more preferably at least one selected from a carboxyl group, a sulfo group, and salts thereof. Examples of an atom or atomic group constituting the salts include alkali metal ions ($Li^+$, $Na^+$, $K^+$, and the like), alkaline earth metal ions ($Ca^{2+}$, $Mg^{2+}$, and the like), an ammonium ion, an imidazolium ion, a pyridinium ion, and a phosphonium ion.

The basic group included in the compound A is preferably at least one selected from an amino group, a pyridyl group, salts thereof, a salt of an ammonium group, and a phthalimidomethyl group, more preferably at least one selected from an amino group, a salt of an amino group, and a salt of an ammonium group, and still more preferably an amino group or a salt of an amino group. Examples of the amino group include $-NH_2$, a dialkylamino group, an alkylarylamino group, a diarylamino group, and a cyclic amino group. The dialkylamino group, alkylarylamino group, diarylamino group, and cyclic amino group may further have a substituent. Examples of the substituent include the substituent T described later and a curable group. Examples of an atom or atomic group constituting the salts include a hydroxide ion, a halogen ion, a carboxylate ion, a sulfonate ion, and a phenoxide ion.

The number of acid groups or basic groups included in the compound A may be 1, or may be 2 or more. In a case where the number of acid groups or basic groups included in the compound A is 1, more excellent curability is obtained. In addition, in a case where the number of acid groups or basic groups included in the compound A is 2 or more, dispersibility of the pigment can be more improved. In addition, in a case where the number of acid groups or basic groups included in the compound A is 2 or more, from the viewpoint of dispersibility, it is preferable to include only two or more acid groups or include only two or more basic groups. In addition, it is preferable that the compound A has a basic group.

The number of acid groups or basic groups included in the compound A is preferably 1 to 4, more preferably 1 to 3, and still more preferably 1 or 2. In a case where the number of acid groups or basic groups is within the above-described range, affinity between the compound A and the resin is more improved, and dispersibility of the pigment in the composition can be more improved.

The curable group included in the compound A is preferably at least one selected from an ethylenically unsaturated bonding group and a cyclic ether group, and from the reason that more excellent curability is easily obtained, is preferably an ethylenically unsaturated bonding group. Examples of the ethylenically unsaturated bonding group include a vinyl group, a styryl group, an allyl group, a (meth)acryloyl group, a (meth)acrylamide group, and a maleimide group, and a (meth)acryloyl group is preferable. Examples of the cyclic ether group include an epoxy group and an oxetanyl group, and an epoxy group is preferable. The number of curable groups included in the compound A is preferably 1 to 8, more preferably 2 to 6, and still more preferably 2 to 4. In a case where the number of curable groups is within the above-described range, curability is good, and line width sensitivity and adhesiveness can be more improved.

In the present invention, the compound A is preferably a compound represented by any one of Formulae (A1) to (A3), and from the reason that balance between dispersibility of the pigment and curability is excellent, more preferably a compound represented by Formula (A2).

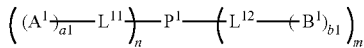 (A1)

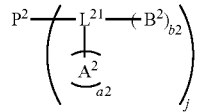 (A2)

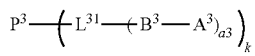 (A3)

In Formula (A1), $P^1$ represents the coloring agent partial structure, $L^{11}$ represents an a1+1 valent linking group, $L^{12}$ represents a b1+1 valent linking group, A represents the curable group, $B^1$ represents the acid group or the basic group, and a1, b1, n, and m each independently represent an integer of 1 or more, in Formula (A2), $P^2$ represents the coloring agent partial structure, $L^{21}$ represents an a2+b2+1 valent linking group, $A^2$ represents the curable group, $B^2$ represents the acid group or the basic group, and a2, b2, and j each independently represent an integer of 1 or more, and in Formula (A3), $P^3$ represents the coloring agent partial structure, $L^{31}$ represents an a3+1 valent linking group, $A^3$ represents the curable group, $B^3$ represents the acid group or the basic group, and a3 and k each independently represent an integer of 1 or more.

In Formula (A1), a1, b1, n, and m each independently represent an integer of 1 or more. a1 is preferably 1 to 4, more preferably 1 to 3, and still more preferably 1 or 2. n is preferably 1 to 4, more preferably 1 to 3, and still more preferably 1 or 2. b1 is preferably 1 to 4, more preferably 1 to 3, and still more preferably 1 or 2. m is preferably 1 to 4, more preferably 1 to 3, and still more preferably 1 or 2.

In Formula (A2), a2, b2, and j each independently represent an integer of 1 or more. a2 is preferably 1 to 4, more preferably 1 to 3, and still more preferably 1 or 2. b2 is preferably 1 to 4, more preferably 1 to 3, and still more preferably 1 or 2. j is preferably 1 to 4, more preferably 1 to 3, and still more preferably 1 or 2.

In Formula (A3), a3 and k each independently represent an integer of 1 or more. a3 is preferably 1 to 4, more preferably 1 to 3, and still more preferably 1 or 2. k is preferably 1 to 4, more preferably 1 to 3, and still more preferably 1 or 2.

In Formulae (A1) to (A3), the coloring agent partial structure represented by $P^1$ to $P^3$ is preferably a partial structure derived from a coloring agent selected from a benzimidazolone coloring agent, a benzimidazolinone coloring agent, a quinophthalone coloring agent, a phthalocyanine coloring agent, an anthraquinone coloring agent, a diketopyrrolopyrrole coloring agent, a quinacridone coloring agent, an azo coloring agent, an isoindolinone coloring agent, an isoindoline coloring agent, a dioxazine coloring agent, a perylene coloring agent, and a thioindigo coloring agent, more preferably a partial structure derived from a coloring agent selected from a benzimidazolone coloring agent, a benzimidazolinone coloring agent, a phthalocyanine coloring agent, a diketopyrrolopyrrole coloring agent, and an azo coloring agent, and still more preferably a partial structure derived from a coloring agent selected from a benzimidazolinone coloring agent and an azo coloring agent. In addition, the coloring agent partial structure represented by $P^1$ to $P^3$ is preferably a coloring agent partial structure having a structure represented by any one of Formulae (Pg-1) to (Pg-9) shown above, or a structure obtained by removing one or more hydrogen atoms from these structures, and more preferably has a structure represented by any one of Formula (Pg-1), Formula (Pg-2), Formula (Pg-3), Formula (Pg-5), or Formula (Pg-7) shown above, or a structure obtained by removing one or more hydrogen atoms from these structures.

In Formulae (A1) to (A3), examples of the curable group represented by A to $A^3$ include an ethylenically unsaturated bonding group and a cyclic ether group, and an ethylenically unsaturated bonding group is preferable. Examples of the ethylenically unsaturated bonding group include a vinyl group, a styryl group, an allyl group, a (meth)acryloyl group, a (meth)acrylamide group, and a maleimide group, and a (meth)acryloyl group is preferable. Examples of the cyclic ether group include an epoxy group and an oxetanyl group, and an epoxy group is preferable.

In Formulae (A1) to (A3), $B^1$ to $B^3$ each independently represent an acid group or a basic group. Examples of the acid group and the basic group include the above-described acid groups and basic groups, and the preferred ranges are also the same.

In Formulae (A1) to (A3), examples of the a1+1 valent linking group represented by $L^{11}$, the b1+1 valent linking group represented by $L^{12}$, the a2+b2+1 valent linking group represented by $L^{21}$, and the a3+1 valent linking group represented by $L^{31}$ include a hydrocarbon group, a heterocyclic group, —O—, —S—, —CO—, —COO—, —OCO—, —SO$_2$—, —NR$^L$—, —NR$^L$CO—, —CONR$^L$—, —NR$^L$SO$_2$—, —SO$_2$NR$^L$—, and a group of a combination of these groups, in which $R^L$ represents a hydrogen atom, an alkyl group, or an aryl group. The hydrocarbon group may be an aliphatic hydrocarbon group or an aromatic hydrocarbon group. Examples of the hydrocarbon group include an alkylene group, an arylene group, and a group obtained by removing one or more hydrogen atoms from these groups. The number of carbon atoms in the alkylene group is preferably 1 to 30, more preferably 1 to 15, and still more preferably 1 to 10. The alkylene group may be linear, branched, or cyclic. In addition, the cyclic alkylene group may be monocyclic or polycyclic. The number of carbon atoms in the arylene group is preferably 6 to 18, more preferably 6 to 14, and still more preferably 6 to 10. The heterocyclic group is preferably a single ring or a fused ring having 2 to 4 fused rings. The number of heteroatoms constituting a ring of the heterocyclic group is preferably 1 to 3. The heteroatom constituting the ring of the heterocyclic group is preferably a nitrogen atom, an oxygen atom, or a sulfur atom. The number of carbon atoms constituting the ring of the heterocyclic group is preferably 3 to 30, more preferably 3 to 18, and more preferably 3 to 12. The hydrocarbon group and heterocyclic group may have a substituent. Examples of the substituent include groups in the description of the substituent T described later. In addition, the number of carbon atoms in the alkyl group represented by $R^L$ is preferably 1 to 20, more preferably 1 to 15, and still more preferably 1 to 8. The alkyl group may be any of linear, branched, and cyclic forms, and is preferably linear or branched and more preferably linear. The alkyl group represented by $R^L$ may further have a substituent. Examples of the substituent include the substituent T described later. The number of carbon atoms in the aryl group represented by $R^L$ is preferably 6 to 30, more preferably 6 to 20, and still more preferably 6 to 12. The aryl group represented by $R^L$ may further have a substituent. Examples of the substituent include the substituent T described later.

In Formulae (A1) to (A3), it is preferable that $L^{11}$, $L^{12}$, $L^{21}$, and $L^{31}$ are each independently a group represented by any one of Formulae (L-1) to (L-5). According to this aspect, affinity with the pigment is improved, and dispersibility of the pigment in the composition can be more improved.

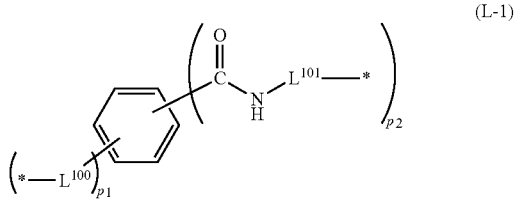

(L-1)

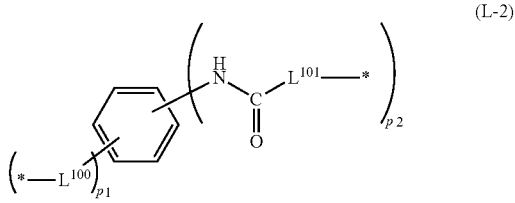

(L-2)

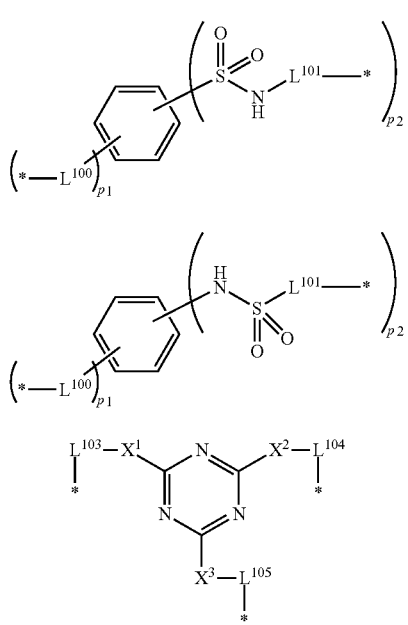

In the formulae, * represents a bonding hand, p1 represents an integer of 0 to 5 and p2 represents an integer of 1 to 6, in which p1+p2 is an integer of 2 to 6, $L^{100}$ to $L^{105}$ each independently represent a single bond or a divalent linking group, and $X^1$, $X^2$, and $X^3$ each independently represent —O—, —S—, or —NR$^{L1}$—, in which R$^{L1}$ represents a hydrogen atom, an alkyl group, or an aryl group.

The alkyl group and aryl group represented by R$^{L1}$ have the same meanings as the alkyl group and aryl group described in the above section of R$^L$, and the preferred ranges are also the same. In addition, the alkyl group and aryl group represented by R$^{L1}$ may further have a substituent. Examples of the substituent include the substituent T described later.

Examples of the divalent linking group represented by $L^{100}$ to $L^{105}$ include an alkylene group, an arylene group, a heterocyclic group, —O—, —S—, —CO—, —COO—, —SO$_2$—, —NR$^{L2}$—, —NR$^{L2}$CO—, —CONR$^{L2}$—, —NR$^{L2}$SO$_2$—, —SO$_2$NR$^{L2}$—, a group of a combination of these groups.

The number of carbon atoms in the alkylene group is preferably 1 to 30, more preferably 1 to 15, and still more preferably 1 to 10. The alkylene group may be linear, branched, or cyclic. In addition, the cyclic alkylene group may be monocyclic or polycyclic. The number of carbon atoms in the arylene group is preferably 6 to 18, more preferably 6 to 14, and still more preferably 6 to 10. The heterocyclic group is preferably single ring or a fused ring having 2 to 4 fused rings. The number of heteroatoms constituting a ring of the heterocyclic group is preferably 1 to 3. The heteroatom constituting the ring of the heterocyclic group is preferably a nitrogen atom, an oxygen atom, or a sulfur atom. The number of carbon atoms constituting the ring of the heterocyclic group is preferably 3 to 30, more preferably 3 to 18, and more preferably 3 to 12. The alkylene group, arylene group, and heterocyclic group may have a substituent. Examples of the substituent include the substituent T described later.

R$^{L2}$ represents a hydrogen atom, an alkyl group, or an aryl group. The alkyl group and aryl group represented by R$^{L2}$ have the same meanings as the alkyl group and aryl group described in the above section of R$^L$, and the preferred ranges are also the same. In addition, the alkyl group and aryl group represented by R$^{L2}$ may further have a substituent. Examples of the substituent include the substituent T described later.

In Formula (L-5), $X^1$, $X^2$, and $X^3$ each independently represent —O—, —S—, or —NR$^{L1}$—, and —NR$^{L1}$— is preferable. In addition, RY is preferably a hydrogen atom.

The compound A preferably includes a functional group having an intermolecular interaction. In a case where the compound A has such a functional group, affinity between the compound A and the pigment is improved, and dispersibility of the pigment in the composition can be more improved. Examples of the above-described functional group include an amide group, a urea group, a urethane group, a sulfonamide group, a triazine group, an isocyanuric group, an imide group, and an imidazolidinone group. These functional groups may be included in the coloring agent partial structure, or may be included in a site (for example, $L^{11}$ or $L^{12}$ in Formula (A1), $L^{21}$ in Formula (A2), $L^{31}$ in Formula (A3), and the like) other than the coloring agent partial structure.

(Substituent T)

Examples of a substituent T include a halogen atom, a cyano group, a nitro group, an alkyl group, an alkenyl group, an alkynyl group, an aryl group, a heterocyclic group, —ORt$^1$, —CORt$^1$, —COORt$^1$, —OCORt$^1$, —NRt$^1$Rt$^2$, —NHCORt$^1$, —CONRt$^1$Rt$^2$, —NHCONRt$^1$Rt$^2$, —NHCOORt$^1$, —SRt$^1$, —SO$_2$Rt$^1$, —SO$_2$ORt$^1$, —NHSO$_2$Rt$^1$, and —SO$_2$NRt$^1$Rt$^2$. Rt$^1$ and Rt$^2$ each independently represent a hydrogen atom, an alkyl group, an alkenyl group, an alkynyl group, an aryl group, or a heteroaryl group. Rt$^1$ and Rt$^2$ may be bonded to each other to form a ring.

Examples of the halogen atom include a fluorine atom, a chlorine atom, a bromine atom, and an iodine atom.

The number of carbon atoms in the alkyl group is preferably 1 to 30, more preferably 1 to 15, and still more preferably 1 to 8. The alkyl group may be any of linear, branched, and cyclic forms, and is preferably linear or branched and more preferably linear.

The number of carbon atoms in the alkenyl group is preferably 2 to 30, more preferably 2 to 12, and particularly preferably 2 to 8. The alkenyl group may be any of linear, branched, and cyclic forms, and is preferably linear or branched and more preferably linear.

The alkynyl group preferably has 2 to 30 carbon atoms and more preferably has 2 to 25 carbon atoms. The alkynyl group may be any of linear, branched, and cyclic forms, and is preferably linear or branched and more preferably linear.

The number of carbon atoms in the aryl group is preferably 6 to 30, more preferably 6 to 20, and still more preferably 6 to 12.

The heterocyclic group may be single ring or a fused ring. The heterocyclic group is preferably single ring or a fused ring having 2 to 4 fused rings. The number of heteroatoms constituting a ring of the heterocyclic group is preferably 1 to 3. The heteroatom constituting the ring of the heterocyclic group is preferably a nitrogen atom, an oxygen atom, or a sulfur atom. The number of carbon atoms constituting the ring of the heterocyclic group is preferably 3 to 30, more preferably 3 to 18, and more preferably 3 to 12.

The alkyl group, the alkenyl group, the alkynyl group, the aryl group, and the heterocyclic group may have a substituent or may be unsubstituted. Examples of the substituent include the substituents described in the substituent T.

Specific examples of the compound A include compounds having the following structures. In the following structural formulae, Ac represents an acetyl group.

(B-1)
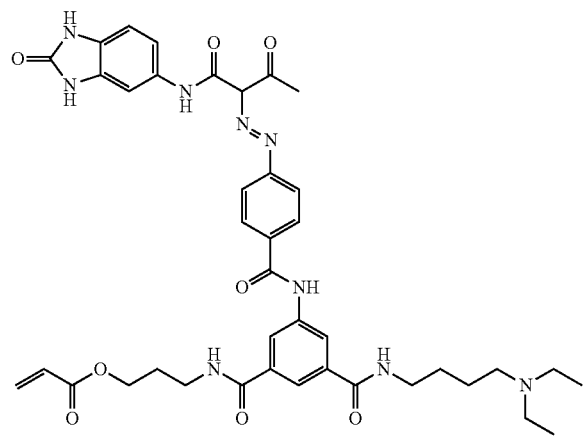
(B-2)
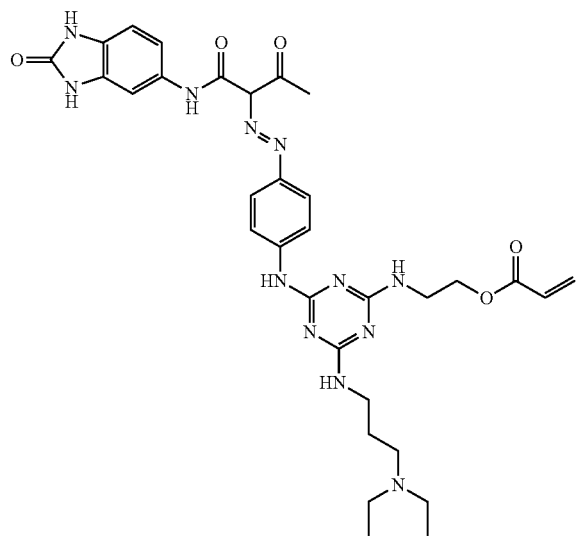
(B-3)
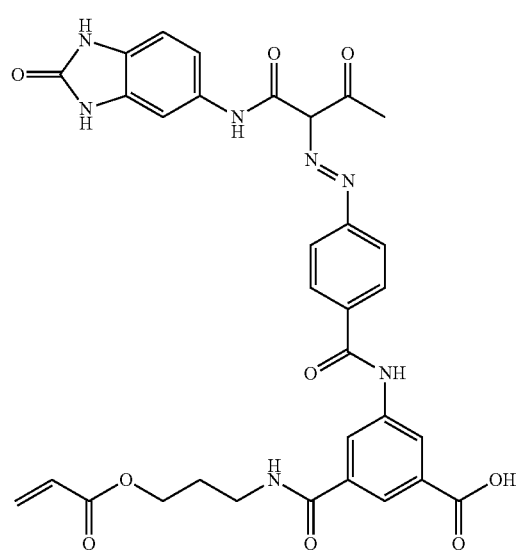
(B-4)
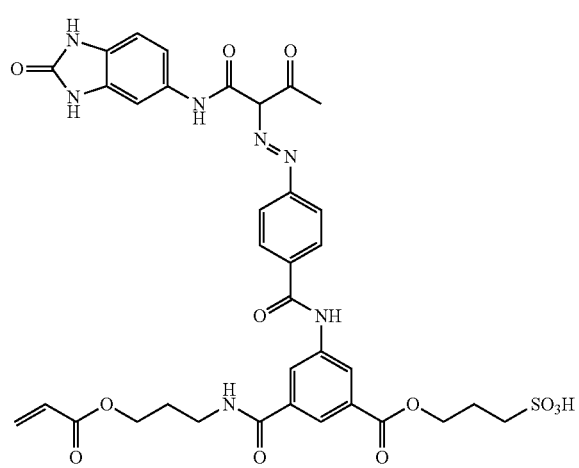
(B-5)
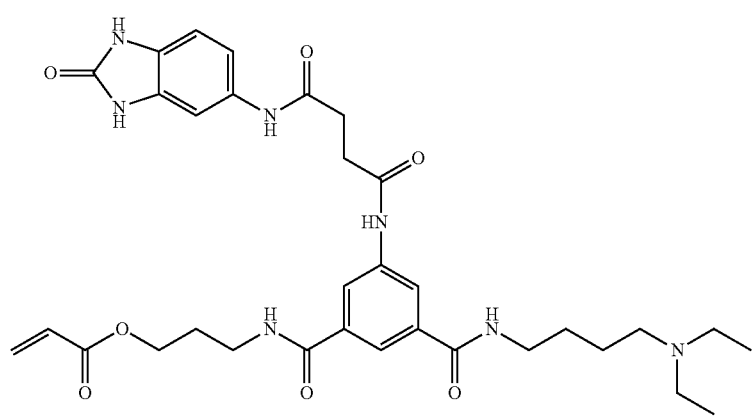

-continued
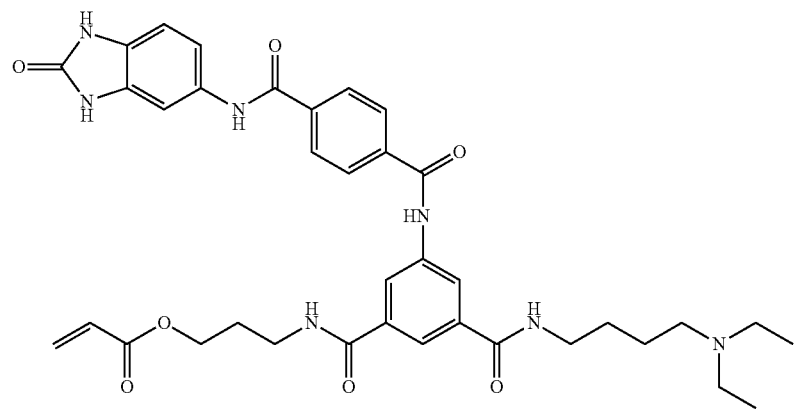
(B-6)
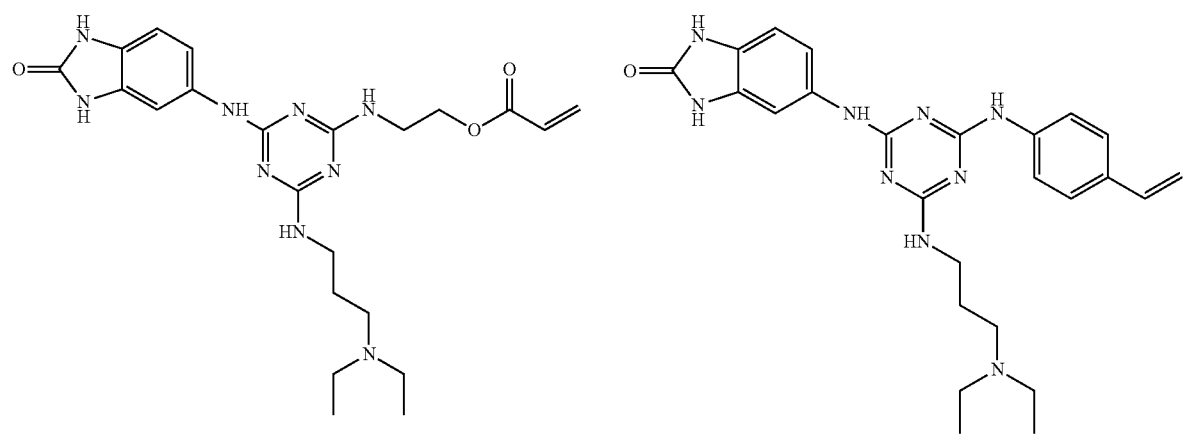
(B-7)  (B-8)
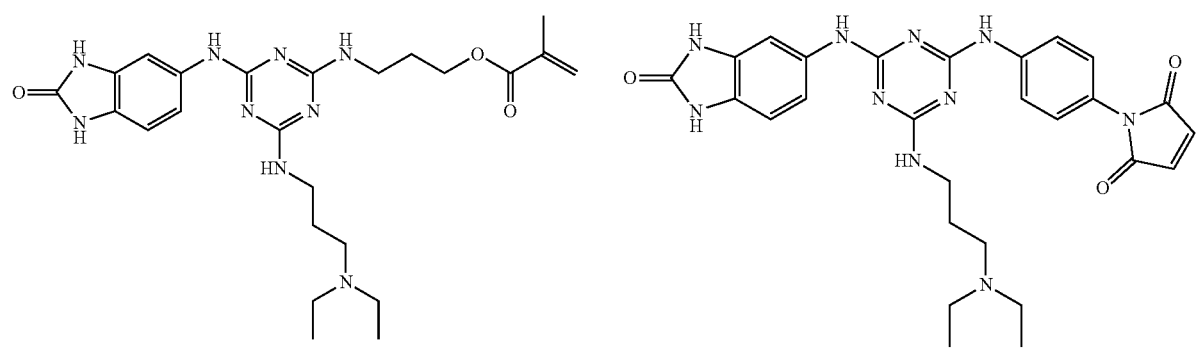
(B-9)  (B-10)

-continued
(B-11)
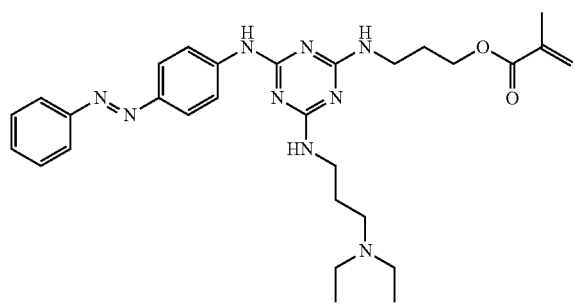
(B-12)
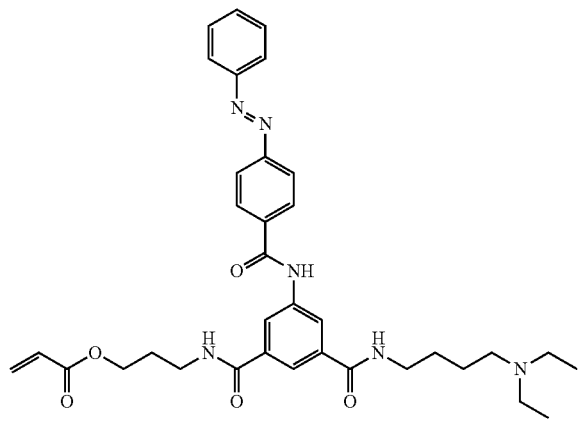
(B-13)
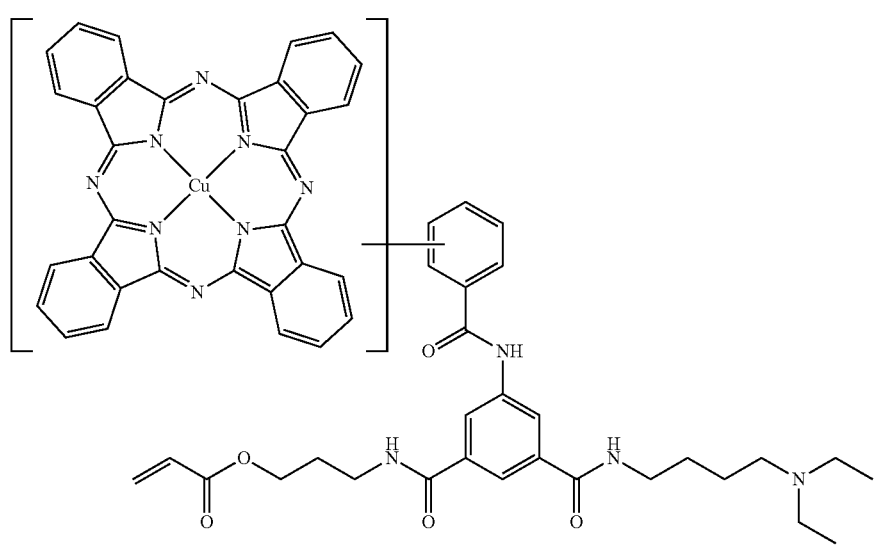
(B-14)
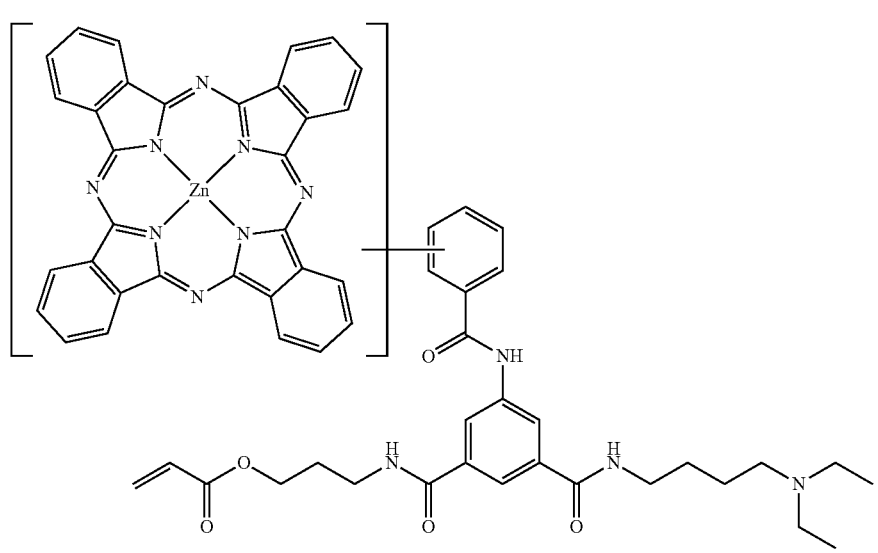

-continued
(B-15)
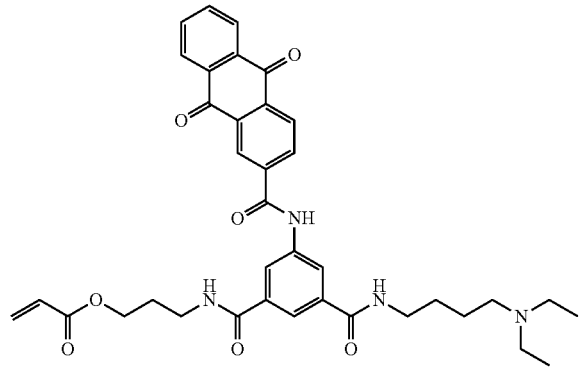
(B-16)
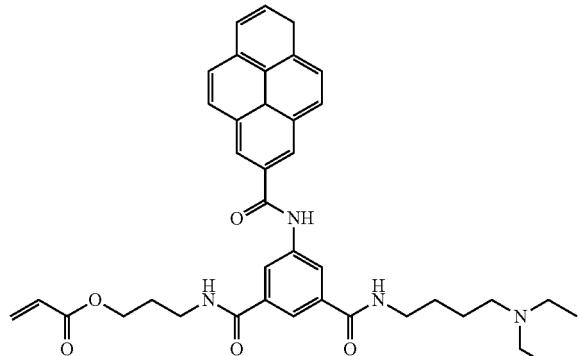
(B-17)
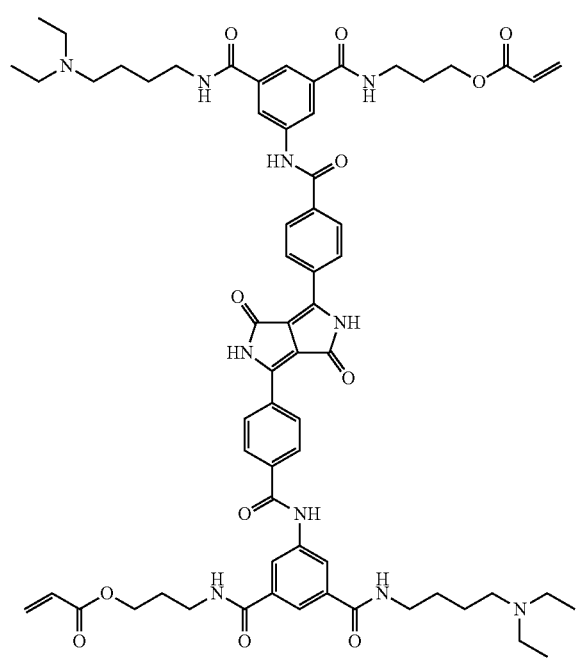
(B-18)
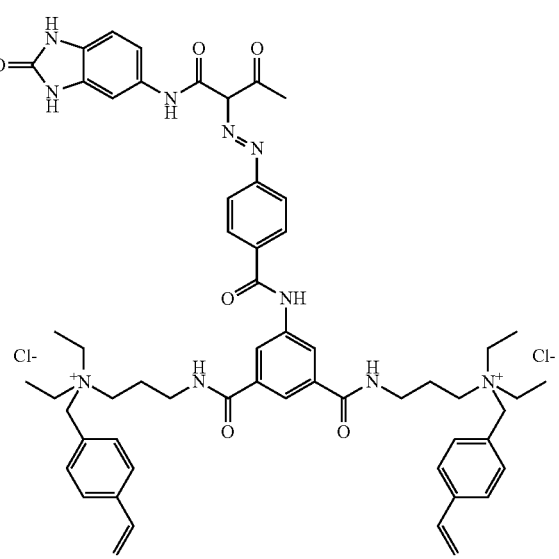
(B-19)
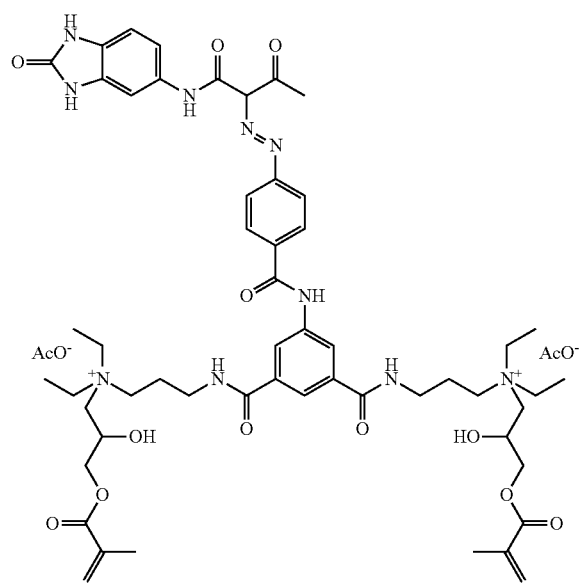
(B-20)
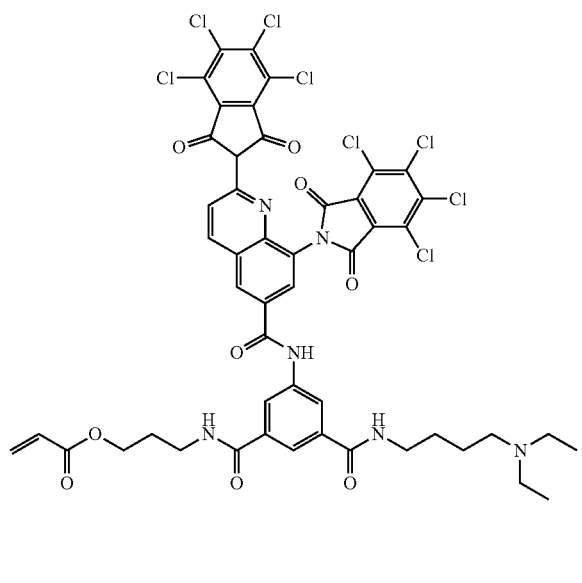

(B-21)
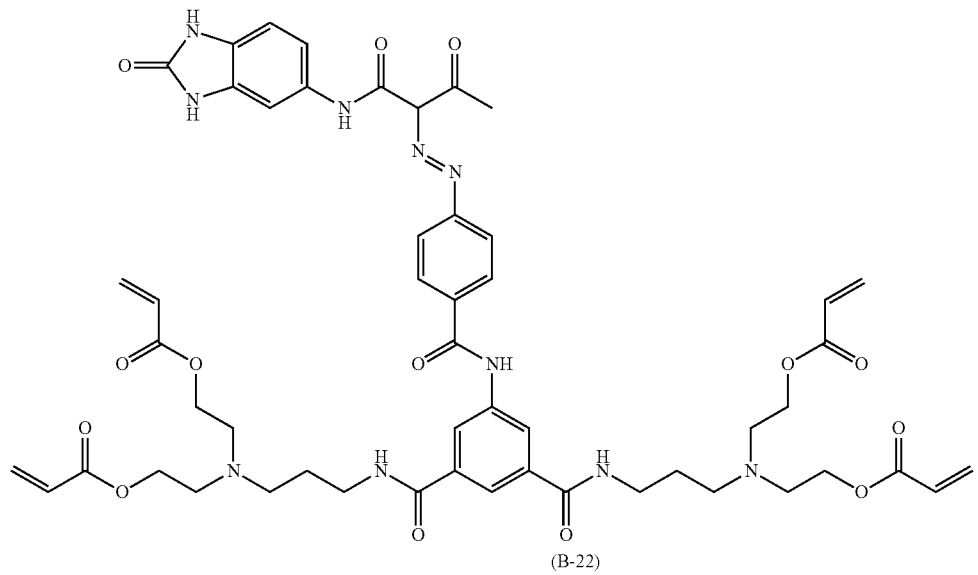
(B-22) (B-23)
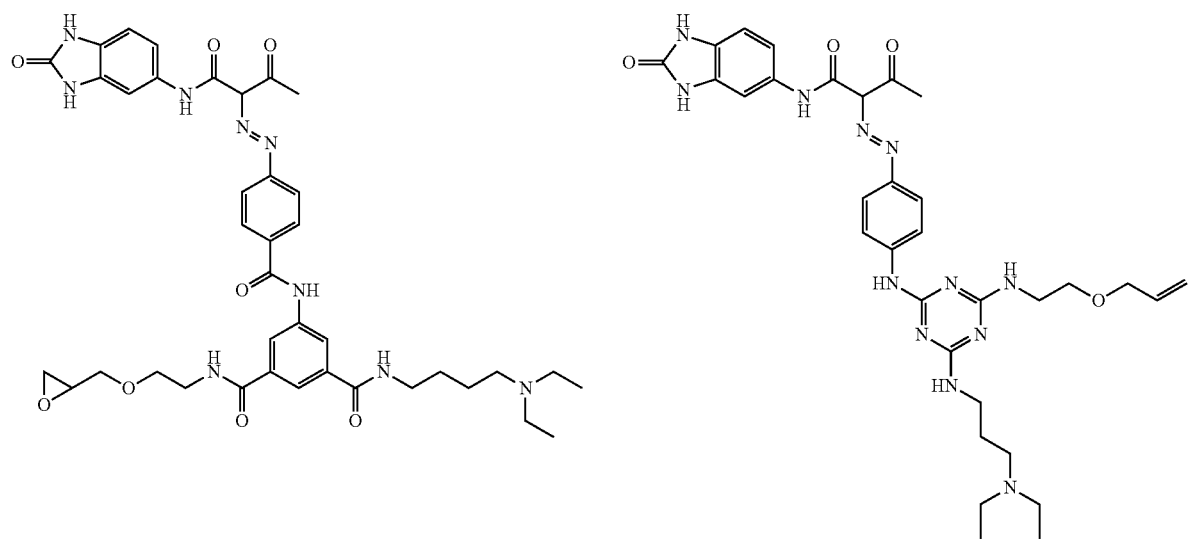
(B-24) (B-25)
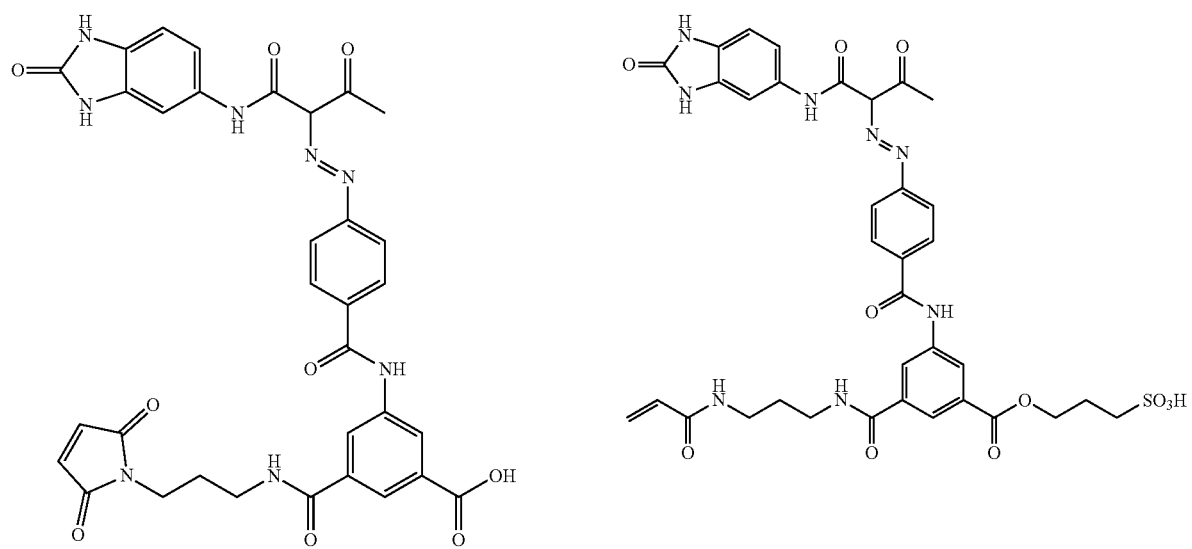

-continued
(B-26)
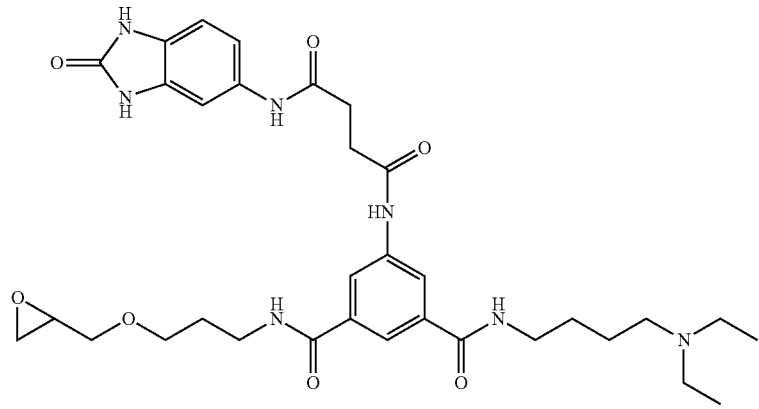
(B-27)
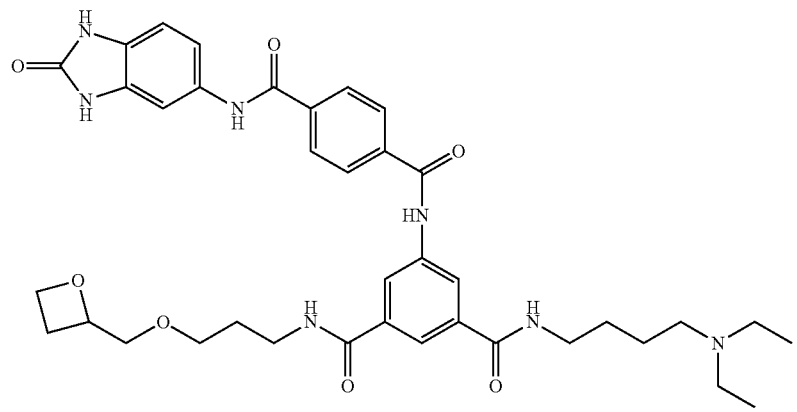
(B-28) (B-29)
(B-30) (B-31)
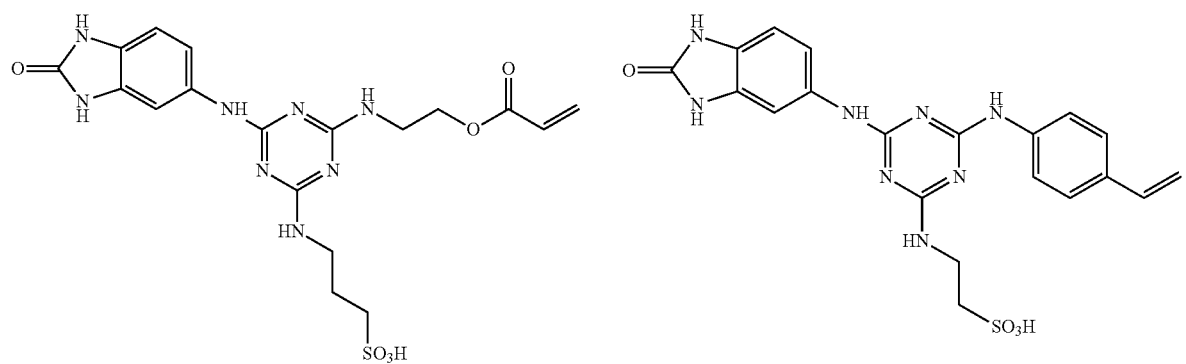
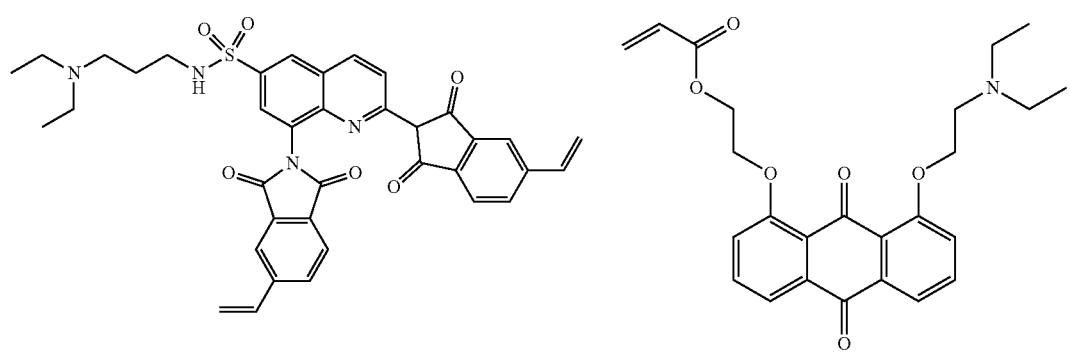

-continued
(B-32)
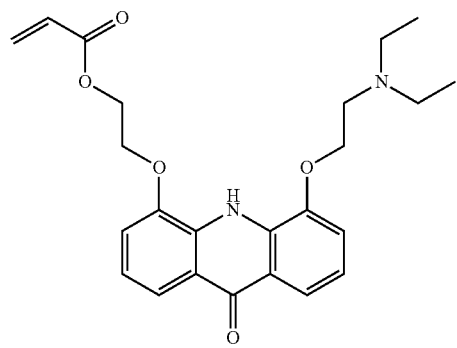
(B-33)
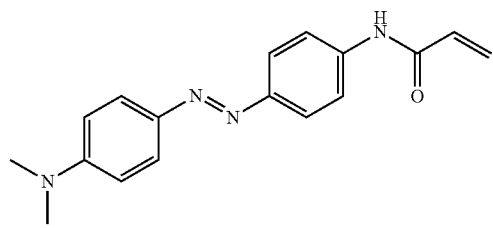
(B-34)
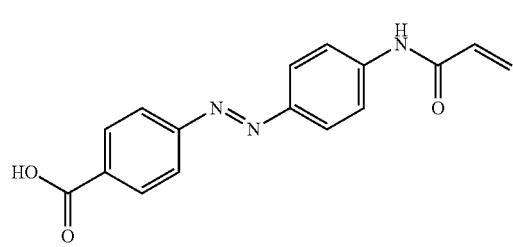
(B-35)
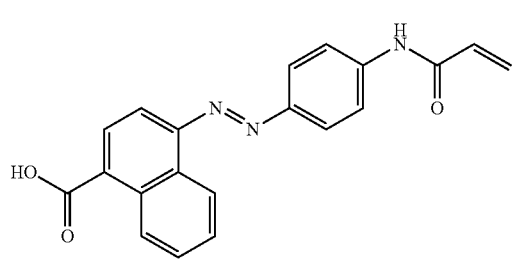
(B-36)
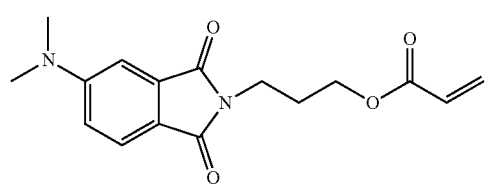
(B-37)
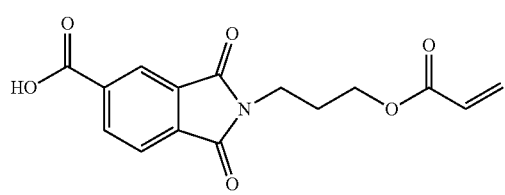
(B-38)
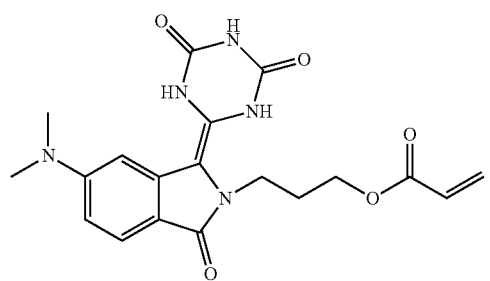
(B-39)
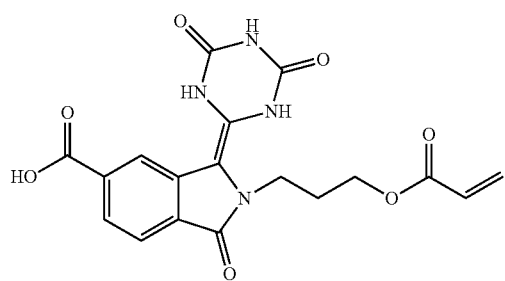
(B-40)
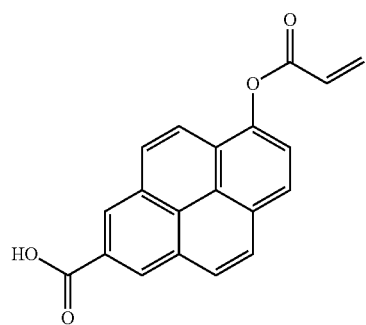
(B-41)
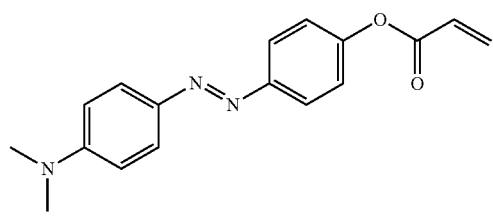

-continued

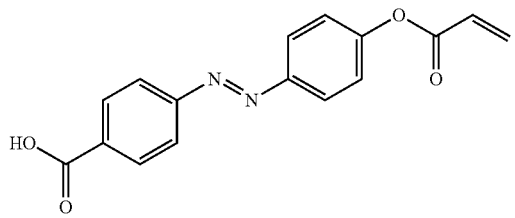
(B-42)

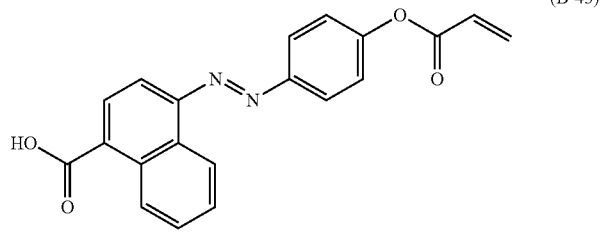
(B-43)

The molecular weight of the compound A is preferably 2000 or less, more preferably 1500 or less, and still more preferably 1000 or less. The lower limit is preferably 300 or more.

The curable group value of the compound A is preferably 0.1 to 10 mmol/g. The lower limit is preferably 0.5 mmol/g or more and more preferably 1 mmol/g or more. The upper limit is preferably 8 mmol/g or less and more preferably 4 mmol/g or less. The curable group value of the compound A is a value calculated by dividing the number of curable groups included in one molecule of the compound A by the molecular weight of the compound A. Examples of the curable group include an ethylenically unsaturated bonding group and a cyclic ether group.

In addition, in a case where the curable group included in the compound A is an ethylenically unsaturated bonding group, the ethylenically unsaturated bonding group value (hereinafter, also referred to as a C=C value) of the compound A is preferably 0.1 to 10 mmol/g. The lower limit is preferably 0.5 mmol/g or more and more preferably 1 mmol/g or more. The upper limit is preferably 8 mmol/g or less and more preferably 4 mmol/g or less. The C=C value of the compound A is a value calculated by dividing the number of ethylenically unsaturated bonding groups included in one molecule of the compound A by the molecular weight of the compound A.

In a case where the compound A is a compound having each of the coloring agent partial structure, the basic group, and the curable group, the amine value of the compound A is preferably 10 mmol/g or less, more preferably 8 mmol/g or less, and still more preferably 5 mmol/g or less. The lower limit is preferably 0.1 mmol/g or more, more preferably 1 mmol/g or more, and still more preferably 2 mmol/g or more.

In addition, in a case where the compound A is a compound having each of the coloring agent partial structure, the acid group, and the curable group, the acid value of the compound A is preferably 10 mmol/g or less, more preferably 8 mmol/g or less, and still more preferably 5 mmol/g or less. The lower limit is preferably 0.1 mmol/g or more, more preferably 1 mmol/g or more, and still more preferably 2 mmol/g or more.

The compound A is also preferably a hydrophilic compound. According to this aspect, interaction between the pigment surface and the resin is improved, and dispersibility of the pigment in the composition can be more improved. Hydrophilicity of the compound A can be evaluated by, for example, Log P value, and as the Log P value of the compound A is smaller, the hydrophilicity tends to be higher. The Log P value of the compound A is preferably 3 or less, more preferably 2 or less, and still more preferably 1 or less. The Log P value of the compound A is a value of the common logarithm of partition coefficient P of the compound A in 1-octanol/water. In the present specification, the Log P value of the compound A is obtained by prediction calculation using ChemiBioDraw Ultra, ver. 13.0.2.3021 (manufactured by Cambridge Soft).

The compound A is preferably a compound having high visible transparency. The maximum absorption wavelength of the compound A is preferably 700 nm or less, more preferably 500 nm or less, and still more preferably 400 nm or less. The maximum value of the molar absorption coefficient of the compound A in a wavelength range of 400 to 700 nm is preferably 3000 L·mol$^{-1}$·cm$^{-1}$ or less, more preferably 1000 L·mol$^{-1}$·cm$^{-1}$ or less, and still more preferably 100 L·mol$^{-1}$·cm$^{-1}$ or less.

It is also preferable that the compound A satisfies any one of the following spectral characteristics (a) to (d).

(a) maximum value of the molar absorption coefficient in a wavelength range of more than 700 nm and 750 nm or less is preferably 3000 L·mol$^{-1}$·cm$^{-1}$ or less, more preferably 1000 L·mol$^{-1}$·cm$^{-1}$ or less, and still more preferably 100 L·mol$^{-1}$·cm$^{-1}$ or less.

(b) maximum value of the molar absorption coefficient in a wavelength range of more than 750 nm and 800 nm or less is preferably 3000 L·mol$^{-1}$·cm$^{-1}$ or less, more preferably 1000 L·mol$^{-1}$·cm$^{-1}$ or less, and still more preferably 100 L·mol$^{-1}$·cm$^{-1}$ or less.

(c) maximum value of the molar absorption coefficient in a wavelength range of more than 800 nm and 850 nm or less is preferably 3000 L·mol$^{-1}$·cm$^{-1}$ or less, more preferably 1000 L·mol$^{-1}$·cm$^{-1}$ or less, and still more preferably 100 L·mol$^{-1}$·cm$^{-1}$ or less.

(d) maximum value of the molar absorption coefficient in a wavelength range of more than 850 nm and 900 nm or less is preferably 3000 L·mol$^{-1}$·cm$^{-1}$ or less, more preferably 1000 L·mol$^{-1}$·cm$^{-1}$ or less, and still more preferably 100 L·mol$^{-1}$·cm$^{-1}$ or less.

The content of the compound A in the total solid content of the curable composition is 1 to 15 mass %. The lower limit is preferably 2 mass % or more and more preferably 3 mass % or more. The upper limit is preferably 12 mass % or less and more preferably 10 mass % or less.

In addition, the content of the compound A is preferably 0.1 to 20 parts by mass with respect to 100 parts by mass of the pigment. The lower limit is preferably 1 parts by mass or more, more preferably 2 parts by mass or more, and still more preferably 5 parts by mass or more. The upper limit is preferably 18 parts by mass or less and more preferably 15 parts by mass or less. As the compound A, one kind may be used alone, or two or more kinds may be used in combination. In a case where two or more kinds thereof are used in combination, the total content thereof is preferably within the above-described range.

<<Other Coloring Agent Derivatives>>

The curable composition according to the embodiment of the present invention can contain, in addition to the above-described compound A, a coloring agent derivative (other coloring agent derivatives) other than the compound A. Examples of the other coloring agent derivatives include a compound having a structure in which a part of the coloring agent is substituted with an acid group or a basic group. Examples of the other coloring agent derivatives include compounds having the following structures. In addition, compounds described in JP1981-118462A (JP-S56-118462A), JP1988-264674A (JP-S63-264674A), JP1989-217077A (JP-H01-217077A), JP1991-009961A (JP-H03-009961A), JP1991-026767A (JP-H03-026767A), JP1991-153780A (JP-H03-153780A), JP1991-045662A (JP-H03-045662A), JP1992-285669A (JP-H04-285669A), JP1994-145546A (JP-H06-145546A), JP1994-212088A (JP-H06-212088A), JP1994-240158A (JP-H06-240158A), JP1998-030063A (JP-H10-030063A), JP1998-195326A (JP-H10-195326A), paragraphs "0086" to "0098" of WO2011/024896A, paragraphs "0063" to "0094" of WO2012/102399A, paragraph "0082" of WO2017/038252A, paragraph "0171" of JP2015-151530A, and the like can also be used, the contents of which are incorporated herein by reference.

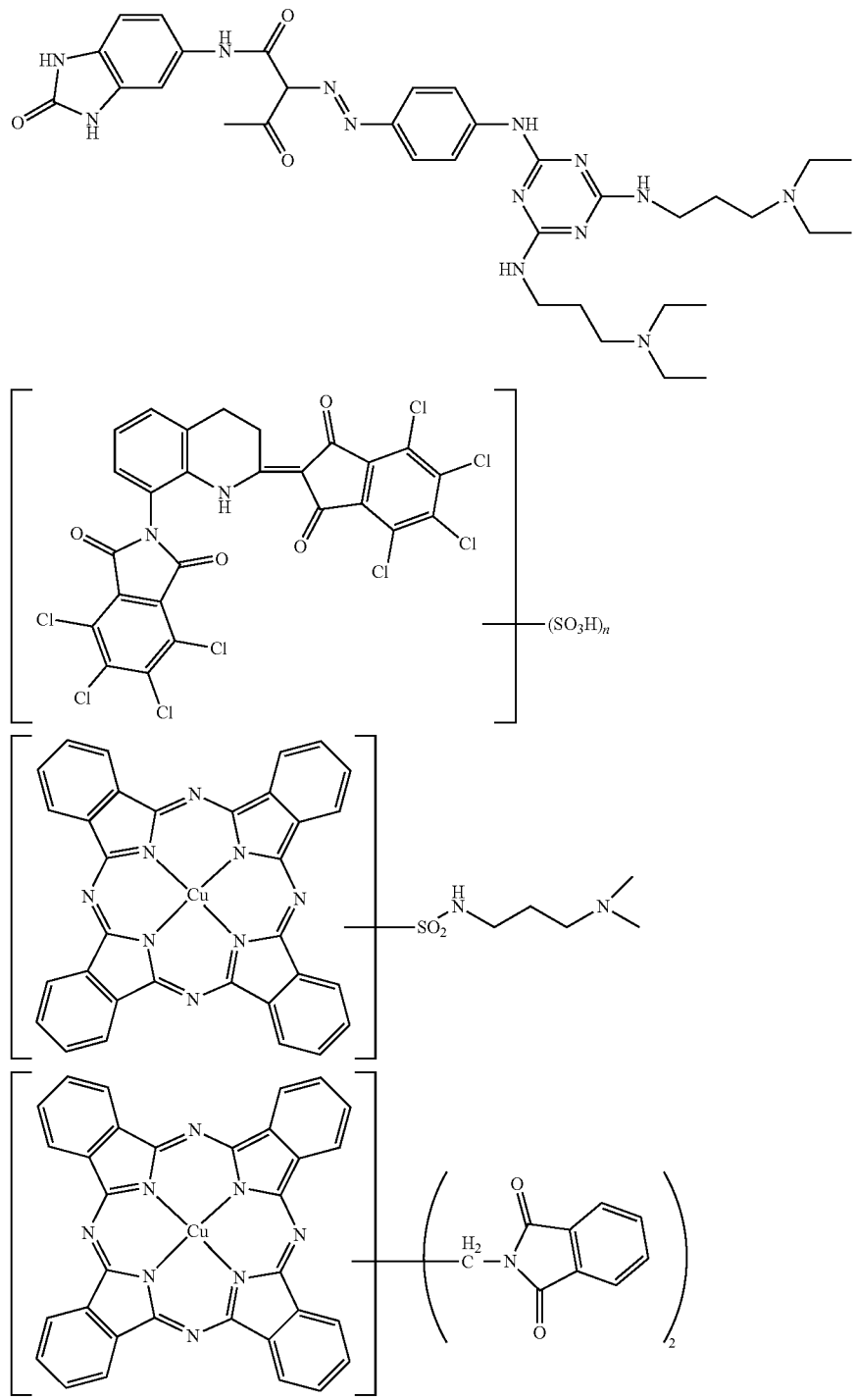

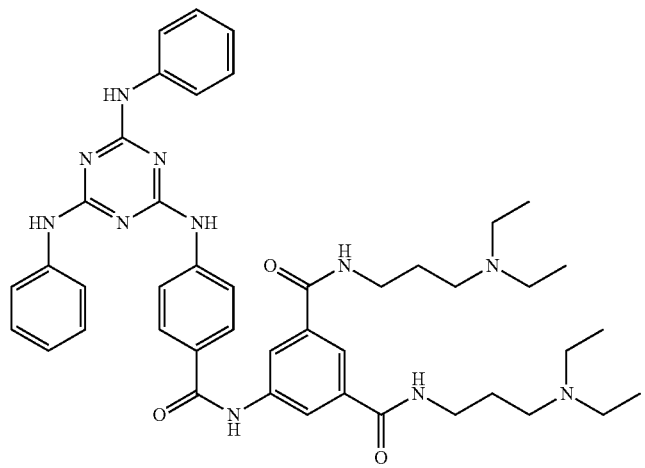 [SMILES: CCN(CC)CCCNC(=O)c1cc(NC(=O)c2ccc(Nc3nc(Nc4ccccc4)nc(Nc4ccccc4)n3)cc2)cc(C(=O)NCCCN(CC)CC)c1]

The content of the other coloring agent derivatives in the total solid content of the curable composition is preferably 20 mass % or less, more preferably 10 mass % or less, and still more preferably 5 mass % or less. The lower limit may be 0.1 mass % or more or 0.2 mass % or more.

In addition, the content of the other coloring agent derivatives is preferably 50 parts by mass or less, more preferably 20 parts by mass or less, and still more preferably 10 parts by mass or less with respect to 100 parts by mass of the compound A. The lower limit may be 1 part by mass or more or 2 parts by mass or more.

It is also preferable that the curable composition according to the embodiment of the present invention does not substantially contain the other coloring agent derivatives. A case where the curable composition according to the embodiment of the present invention does not substantially contain the coloring agent derivatives represents that the content of the other coloring agent derivatives in the total solid content of the curable composition is preferably 0.1 mass % or less, still more preferably 0.5 mass % or less, and particularly preferably 0 mass %.

<<Curable Compound>>

The curable composition according to the embodiment of the present invention contains a curable compound other than the above-described compound A. The curable compound used in the present invention is preferably a compound not having the coloring agent partial structure. As the curable compound, a known compound which is crosslinkable by a radical, an acid, or heat can be used. Examples of the curable compound include a compound having an ethylenically unsaturated bonding group and a compound having a cyclic ether group, and a compound having an ethylenically unsaturated bonding group is preferable. Examples of the ethylenically unsaturated bonding group include a vinyl group, a (meth)allyl group, and a (meth)acryloyl group. Examples of the cyclic ether group include an epoxy group and an oxetanyl group. The curable compound used in the present invention is preferably a polymerizable compound, and more preferably a radically polymerizable compound.

(Polymerizable Compound)

Any chemical forms of a monomer, a prepolymer, an oligomer, or the like may be used as the polymerizable compound, but a monomer is preferable. The molecular weight of the polymerizable compound is preferably 100 to 3000. The upper limit is more preferably 2000 or less and still more preferably 1500 or less. The lower limit is more preferably 150 or more and still more preferably 250 or more.

The polymerizable compound is preferably a polyfunctional polymerizable monomer. In addition, the polyfunctional polymerizable monomer is preferably a compound including 3 or more ethylenically unsaturated bonding groups, more preferably a compound including 3 to 15 ethylenically unsaturated bonding groups, and still more preferably a compound having 3 to 6 ethylenically unsaturated bonding groups. In addition, the polyfunctional polymerizable monomer is preferably a trifunctional to pentadecafunctional (meth)acrylate compound and more preferably a trifunctional to hexafunctional (meth)acrylate compound. Specific examples of the polymerizable compound include compounds described in paragraphs "0095" to "0108" of JP2009-288705A, paragraph "0227" of JP2013-029760A, paragraphs "0254" to "0257" of JP2008-292970A, paragraphs "0034" to "0038" of JP2013-253224A, paragraph "0477" of JP2012-208494A, JP2017-048367A, JP6057891B, and JP6031807B, the contents of which are incorporated herein by reference.

As the polymerizable compound, dipentaerythritol triacrylate (as a commercially available product, KAYARAD D-330 manufactured by Nippon Kayaku Co., Ltd.), dipentaerythritol tetraacrylate (as a commercially available product, KAYARAD D-320 manufactured by Nippon Kayaku Co., Ltd.), dipentaerythritol penta(meth)acrylate (as a commercially available product, KAYARAD D-310 manufactured by Nippon Kayaku Co., Ltd.), dipentaerythritol hexa (meth)acrylate (as a commercially available product, KAYARAD DPHA manufactured by Nippon Kayaku Co., Ltd., NK ESTER A-DPH-12E manufactured by Shin-Nakamura Chemical Co., Ltd.), or a compound having a structure in which these (meth)acryloyl groups are bonded through an ethylene glycol and/or a propylene glycol residue (for example, SR454 and SR499 which are commercially available from Sartomer) is preferable. In addition, as the polymerizable compound, diglycerin ethylene oxide (EO)-modified (meth)acrylate (as a commercially available product, M-460 manufactured by TOAGOSEI CO., LTD.), pentaerythritol tetraacrylate (NK ESTER A-TMMT manufactured by Shin-Nakamura Chemical Co., Ltd.), 1,6-hexanediol diacrylate (KAYARAD HDDA manufactured by Nippon Kayaku Co., Ltd.), RP-1040 (manufactured by Nippon Kayaku Co., Ltd.), ARONIX TO-2349 (manufactured by TOAGOSEI CO., LTD.), NK OLIGO UA-7200 (manufactured by Shin-Nakamura Chemical Co., Ltd.), 8UH-1006 and 8UH-1012 (manufactured by Taisei Fine Chemical Co., Ltd.), Light Acrylate POB-A0 (manufactured by KYOE-ISHA CHEMICAL Co., Ltd.), and the like can also be used.

In addition, as the polymerizable compound, it is also preferable to use a trifunctional (meth)acrylate compound such as trimethylolpropane tri(meth)acrylate, trimethylolpropane propyleneoxide-modified tri(meth)acrylate, trimethylolpropane ethyleneoxide-modified tri(meth)acrylate, isocyanuric acid ethyleneoxide-modified tri(meth)acrylate, and pentaerythritol tri(meth)acrylate. Examples of a commercially available product of the trifunctional (meth)acrylate compound include ARONIX M-309, M-310, M-321, M-350, M-360, M-313, M-315, M-306, M-305, M-303, M-452, and M-450 (manufactured by TOAGOSEI CO., LTD.), NK ESTER A9300, A-GLY-9E, A-GLY-20E, A-TMM-3, A-TMM-3L, A-TMM-3LM-N, A-TMPT, and TMPT (manufactured by Shin-Nakamura Chemical Co., Ltd.), and KAYARAD GPO-303, TMPTA, THE-330, TPA-330, and PET-30 (manufactured by Nippon Kayaku Co., Ltd.).

As the polymerizable compound, a compound having an acid group can also be used. By using a polymerizable compound having an acid group, the polymerizable compound in an unexposed area is easily removed during development and the generation of a development residue can be suppressed. Examples of the acid group include a carboxyl group, a sulfo group, and a phosphoric acid group, and a carboxyl group is preferable. Examples of a commercially available product of the polymerizable compound having an acid group include ARONIX M-510, M-520, and ARONIX TO-2349 (manufactured by TOAGOSEI CO., LTD.). The acid value of the polymerizable compound having an acid group is preferably 0.1 to 40 mgKOH/g and more preferably 5 to 30 mgKOH/g. In a case where the acid value of the polymerizable compound is 0.1 mgKOH/g or more, solubility in a developer is good, and in a case where the acid value of the polymerizable compound is 40 mgKOH/g or less, it is advantageous in production and handling.

The polymerizable compound is preferably a compound having a caprolactone structure. As the polymerizable compound having a caprolactone structure, for example, KAYARAD DPCA series (manufactured by Nippon Kayaku Co., Ltd.) are commercially available, and examples thereof include DPCA-20, DPCA-30, DPCA-60, and DPCA-120.

As the polymerizable compound, a polymerizable compound having an alkyleneoxy group can also be used. The polymerizable compound having an alkyleneoxy group is preferably a polymerizable compound having an ethyleneoxy group and/or a propyleneoxy group, more preferably a polymerizable compound having an ethyleneoxy group, and still more preferably a trifunctional to hexafunctional (meth) acrylate compound having 4 to 20 ethyleneoxy groups. Examples of a commercially available product of the polymerizable compound having an alkyleneoxy group include SR-494 manufactured by Sartomer, which is a tetrafunctional (meth)acrylate having 4 ethyleneoxy groups, and KAYARAD TPA-330 manufactured by Nippon Kayaku Co., Ltd, which is a trifunctional (meth)acrylate having 3 isobutyleneoxy groups.

As the polymerizable compound, a polymerizable compound having a fluorene skeleton can also be used. Examples of a commercially available product of the polymerizable compound having a fluorene skeleton include OGSOL EA-0200, EA-0300 (manufactured by Osaka Gas Chemicals Co., Ltd., (meth)acrylate monomer having a fluorene skeleton).

As the polymerizable compound, it is also preferable to use a compound which does not substantially include environmentally regulated substances such as toluene. Examples of a commercially available product of such a compound include KAYARAD DPHA LT and KAYARAD DPEA-12 LT (manufactured by Nippon Kayaku Co., Ltd.).

The urethane acrylates described in JP1973-041708B (JP-S48-041708B), JP1976-037193A (JP-S51-037193A), JP1990-032293B (JP-H02-032293B), or JP1990-016765B (JP-H02-016765B), or the urethane compounds having an ethylene oxide skeleton described in JP1983-049860B (JP-S58-049860B), JP1981-017654B (JP-S56-017654B), JP1987-039417B (JP-S62-039417B), or JP1987-039418B (JP-S62-039418B) are also suitable as the polymerizable compound. In addition, the polymerizable compounds having an amino structure or a sulfide structure in the molecule, described in JP1988-277653A (JP-S63-277653A), JP1988-260909A (JP-S63-260909A), or JP1989-105238A (JP-H01-105238A), are also preferably used. In addition, as the polymerizable compound, commercially available products such as UA-7200 (manufactured by Shin-Nakamura Chemical Co., Ltd.), DPHA-40H (manufactured by Nippon Kayaku Co., Ltd.), and UA-306H, UA-306T, UA-306I, AH-600, T-600, AI-600, and LINC-202UA (manufactured by KYOE-ISHA CHEMICAL Co., Ltd.) can also be used.

(Compound having Cyclic Ether Group)

The curable composition according to the embodiment of the present invention can contain a compound having a cyclic ether group as the curable compound. Examples of the cyclic ether group include an epoxy group and an oxetanyl group. The compound having a cyclic ether group is preferably a compound having an epoxy group. Examples of the compound having an epoxy group include a compound having one or more epoxy groups in one molecule, and a compound two or more epoxy groups in one molecule is preferable. It is preferable to have 1 to 100 epoxy groups in one molecule. The upper limit of the number of epoxy groups may be, for example, 10 or less or 5 or less. The lower limit of the number of epoxy groups is preferably 2 or more. As the compound having an epoxy group, compounds described in paragraphs "0034" to "0036" of JP2013-011869A, paragraphs "0147" to "0156" of JP2014-043556A, and paragraphs "0085" to "0092" of JP2014-089408A, and compounds described in JP2017-179172A can also be used. The contents of which are incorporated herein by reference.

The compound having an epoxy group may be a low-molecular-weight compound (for example, having a molecular weight of less than 2000, and further, a molecular weight of less than 1000) or a high-molecular-weight compound (macromolecule) (for example, having a molecular weight of 1000 or more, and in a case of a polymer, having a weight-average molecular weight of 1000 or more). The weight-average molecular weight of the compound having an epoxy group is preferably 200 to 100000 and more preferably 500 to 50000. The upper limit of the weight-average molecular weight is preferably 10000 or less, more preferably 5000 or less, and still more preferably 3000 or less.

As the compound having an epoxy group, an epoxy resin can be preferably used. Examples of the epoxy resin include an epoxy resin which is a glycidyl etherified product of a phenol compound, an epoxy resin which is a glycidyl etherified product of various novolak resins, an alicyclic epoxy resin, an aliphatic epoxy resin, a heterocyclic epoxy resin, a glycidyl ester-based epoxy resin, a glycidyl amine-based epoxy resin, an epoxy resin obtained by glycidylating halogenated phenols, a condensate of a silicon compound having an epoxy group and another silicon compound, and a copolymer of a polymerizable unsaturated compound having an epoxy group and another polymerizable unsaturated compound. The epoxy equivalent of the epoxy resin is preferably 310 to 3300 g/eq, more preferably 310 to 1700 g/eq, and still more preferably 310 to 1000 g/eq. Examples of a commercially available product of the compound having a cyclic ether group include EHPE 3150 (manufactured by Daicel Corporation), EPICLON N-695 (manufactured by DIC Corporation), and MARPROOF G-0150M, G-0105SA, G-0130SP, G-0250SP, G-1005S, G-1005SA, G-1010S, G-2050M, G-01100, and G-01758 (all of which are manufactured by NOF Corporation, an epoxy group-containing polymer).

The content of the curable compound in the total solid content of the curable composition is preferably 0.1 to 50 mass %. The lower limit is more preferably 0.5 mass % or more and still more preferably 1 mass % or more. The upper limit is more preferably 45 mass % or less and still more preferably 40 mass % or less. The curable compound may be used singly or in combination of two or more kinds thereof. In a case where two or more kinds thereof are used in combination, the total thereof is preferably within the above-described range.

In addition, the content of the polymerizable compound in the total solid content of the curable composition is preferably 0.1 to 50 mass %. The lower limit is more preferably 0.5 mass % or more and still more preferably 1 mass % or more. The upper limit is more preferably 45 mass % or less and still more preferably 40 mass % or less. The polymerizable compound may be used singly or in combination of two or more kinds thereof. In a case where two or more kinds thereof are used in combination, the total thereof is preferably within the above-described range.

In a case where the curable composition according to the embodiment of the present invention contains a compound having a cyclic ether group as the curable compound, the content of the compound having a cyclic ether group in the total solid content of the curable composition is preferably 0.1 to 20 mass %. The lower limit is, for example, preferably 0.5 mass % or more, and more preferably 1 mass % or more. The upper limit is, for example, preferably 15 mass % or less and more preferably 10 mass % or less. The compound having a cyclic ether group may be used singly or in combination of two or more kinds thereof. In a case of using two or more kinds thereof, the total content thereof is preferably within the above-described range.

<<Photopolymerization Initiator>>

The curable composition according to the embodiment of the present invention includes a photopolymerization initiator. The photopolymerization initiator is not particularly limited, and can be appropriately selected from known photopolymerization initiators. For example, a compound having photosensitivity to light in a range from an ultraviolet range to a visible range is preferable. The photopolymerization initiator is preferably a photoradical polymerization initiator.

Examples of the photopolymerization initiator include a halogenated hydrocarbon derivative (for example, a compound having a triazine skeleton or a compound having an oxadiazole skeleton), an acylphosphine compound, a hexaarylbiimidazole, an oxime compound, an organic peroxide, a thio compound, a ketone compound, an aromatic onium salt, an α-hydroxyketone compound, and an α-aminoketone compound. From the viewpoint of exposure sensitivity, as the photopolymerization initiator, a trihalomethyltriazine compound, a benzyldimethylketal compound, an α-hydroxyketone compound, an α-aminoketone compound, an acylphosphine compound, a phosphine oxide compound, a metallocene compound, an oxime compound, a triarylimidazole dimer, an onium compound, a benzothiazole compound, a benzophenone compound, an acetophenone compound, a cyclopentadiene-benzene-iron complex, a halomethyl oxadiazole compound, or a 3-aryl-substituted coumarin compound is preferable, a compound selected from an oxime compound, an α-hydroxyketone compound, an α-aminoketone compound, and an acylphosphine compound is more preferable, and an oxime compound is still more preferable. The details of the photopolymerization initiator can be found in paragraphs "0065" to "0111" of JP2014-130173A and in JP6301489B, the contents of which are incorporated herein by reference.

Examples of a commercially available product of the α-hydroxyketone compound include IRGACURE-184, DAROCUR-1173, IRGACURE-500, IRGACURE-2959, and IRGACURE-127 (all of which are manufactured by BASF). Examples of a commercially available product of the α-aminoketone compound include IRGACURE-907, IRGACURE-369, IRGACURE-379, and IRGACURE-379EG (all of which are manufactured by BASF). Examples of a commercially available product of the acylphosphine compound include IRGACURE-819, and DAROCUR-TPO (both of which are manufactured by BASF).

Examples of the oxime compound include the compounds described in JP2001-233842A, the compounds described in JP2000-080068A, the compounds described in JP2006-342166A, the compounds described in J. C. S. Perkin II (1979, pp. 1653-1660), the compounds described in J. C. S. Perkin II (1979, pp. 156-162), the compounds described in Journal of Photopolymer Science and Technology (1995, pp. 202-232), the compounds described in JP2000-066385A, the compounds described in JP2000-080068A, the compounds described in JP2004-534797A, the compounds described in JP2006-342166A, the compounds described in JP2017-019766A, the compounds described in JP6065596B, the compounds described in WO2015/152153A, the compounds described in WO2017/051680A, the compounds described in JP2017-198865A, and the compounds described in paragraphs "0025" to "0038" of WO2017/164127A. Specific examples of the oxime compound include 3-benzoyloxyiminobutane-2-one, 3-acetoxyiminobutane-2-one, 3-propionyloxyiminobutane-2-one, 2-acetoxyiminopentane-3-one, 2-acetoxyimino-1-phenylpropane-1-one, 2-benzoyloxyimino-1-phenylpropane-1-one, 3-(4-toluene sulfonyloxy)iminobutane-2-one, and 2-ethoxycarbonyloxyimino-1-phenylpropane-1-one. Examples of a commercially available product thereof include IRGACURE-OXE01, IRGACURE-OXE02, IRGACURE-OXE03, and IRGACURE-OXE04 (all of which are manufactured by BASF), TR-PBG-304 (manufactured by TRONLY), and ADEKA OPTOMER N-1919 (manufactured by ADEKA Corporation; photopolymerization initiator 2 described in JP2012-014052A). In addition, as the oxime compound, it is also preferable to use a compound having no coloring property or a compound having high transparency and being resistant to discoloration. Examples of a commercially available product thereof include ADEKA ARKLS NCI-730, NCI-831, and NCI-930 (all of which are manufactured by ADEKA Corporation).

In the present invention, an oxime compound having a fluorene ring can also be used as the photopolymerization initiator. Specific examples of the oxime compound having a fluorene ring include compounds described in JP2014-137466A. The content thereof is incorporated herein by reference.

In the present invention, an oxime compound having a fluorine atom can also be used as the photopolymerization initiator. Specific examples of the oxime compound having a fluorine atom include compounds described in JP2010-262028A, Compounds 24 and 36 to 40 described in JP2014-500852A, and Compound (C-3) described in JP2013-164471A. The content thereof is incorporated herein by reference.

In the present invention, an oxime compound having a nitro group can be used as the photopolymerization initiator. It is preferable that the oxime compound having a nitro group is a dimer. Specific examples of the oxime compound having a nitro group include a compound described in paragraphs "0031" to "0047" of JP2013-114249A and paragraphs "0008" to "0012" and "0070" to "0079" of JP2014-137466A, a compound described in paragraphs "0007" to "0025" of JP4223071B, and ADEKA ARKLS NCI-831 (manufactured by ADEKA Corporation).

In the present invention, an oxime compound having a benzofuran skeleton can also be used as the photopolymerization initiator. Specific examples thereof include OE-01 to OE-75 described in WO2015/036910A.

Specific examples of the oxime compound which are preferably used in the present invention are shown below, but the present invention is not limited thereto.

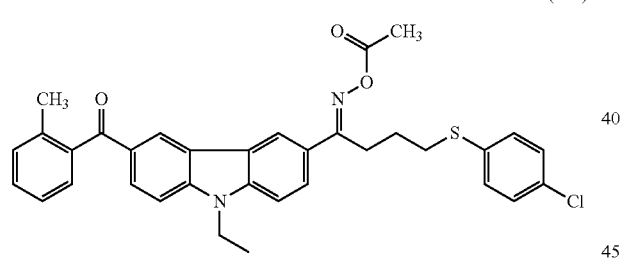

(C-1)

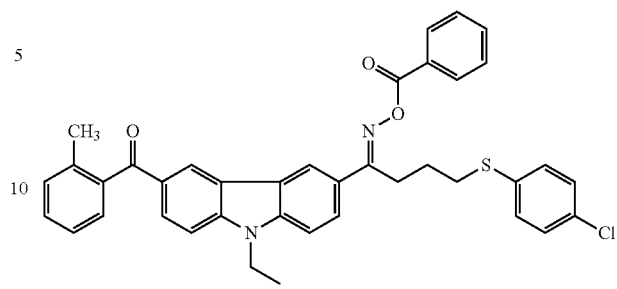

(C-4)

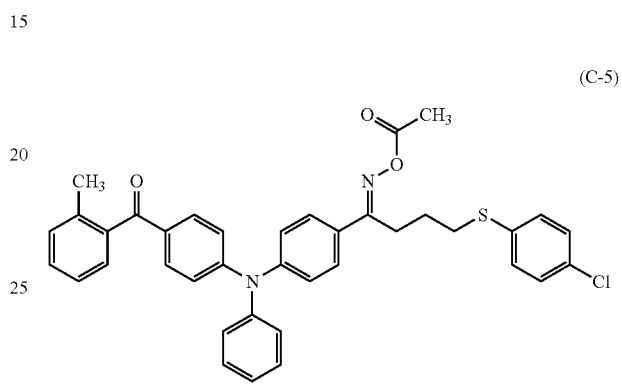

(C-5)

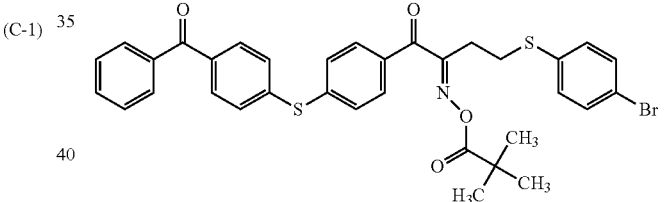

(C-6)

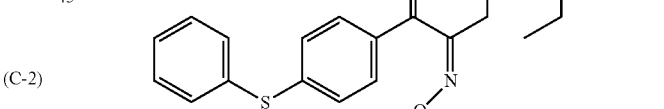

(C-2)

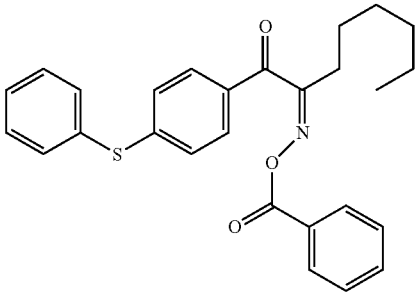

(C-7)

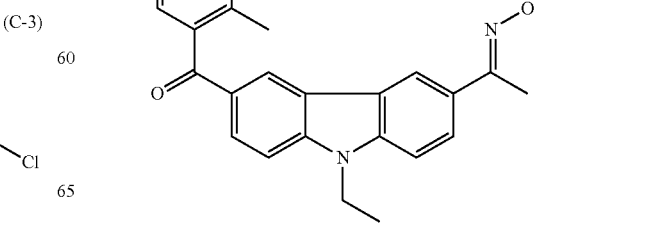

(C-3)

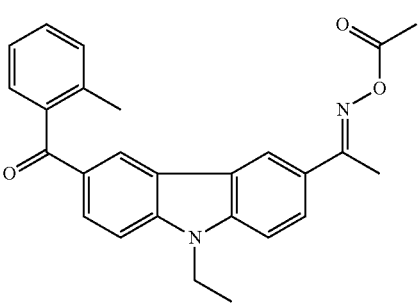

(C-8)

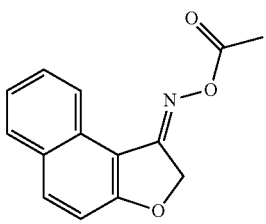
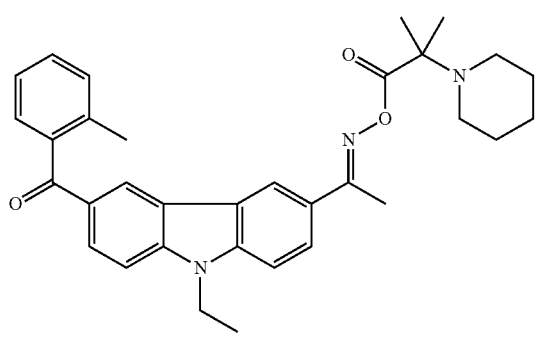
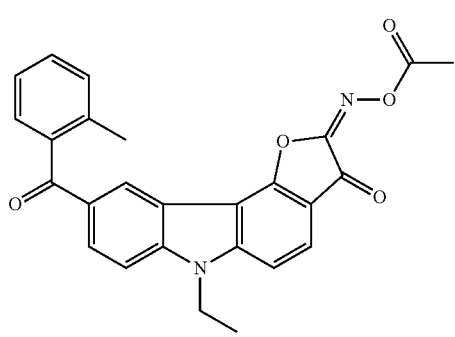
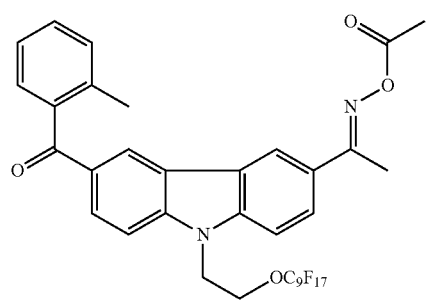
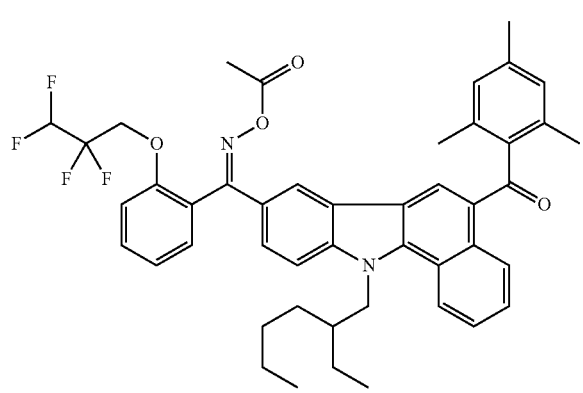

The oxime compound is preferably a compound having a maximum absorption wavelength in a wavelength range of 350 to 500 nm and more preferably a compound having a maximum absorption wavelength in a wavelength range of 360 to 480 nm. In addition, from the viewpoint of sensitivity, the molar absorption coefficient of the oxime compound at a wavelength of 365 nm or at a wavelength of 405 nm is preferably high, more preferably 1,000 to 300,000, still more preferably 2,000 to 300,000, and particularly preferably 5,000 to 200,000. The molar absorption coefficient of a compound can be measured using a well-known method. For example, it is preferable that the molar absorption coefficient can be measured using a spectrophotometer (Cary-5 spectrophotometer, manufactured by Varian Medical Systems, Inc.) and ethyl acetate as a solvent at a concentration of 0.01 g/L.

As the photopolymerization initiator, a bifunctional or tri- or more functional photoradical polymerization initiator may be used. By using such a photoradical polymerization initiator, two or more radicals are generated from one molecule of the photoradical polymerization initiator, and as a result, good sensitivity is obtained. In addition, in a case of using a compound having an asymmetric structure, crystallinity is reduced so that solubility in a solvent or the like is improved, precipitation is to be difficult over time, and temporal stability of the curable composition can be improved. Specific examples of the bifunctional or tri- or more functional photoradical polymerization initiator include dimers of the oxime compounds described in JP2010-527339A, JP2011-524436A, WO2015/004565A, paragraphs "0417" to "0412" of JP2016-532675A, and paragraphs "0039" to "0055" of WO2017/033680A; the compound (E) and compound (G) described in JP2013-522445A; Cmpd 1 to 7 described in WO2016/034963A; the oxime ester photoinitiators described in paragraph "0007" of JP2017-523465A; the photoinitiators described in paragraphs "0020" to "0033" of JP2017-167399A; and the photopolymerization initiator (A) described in paragraphs "0017" to "0026" of JP2017-151342A.

The content of the photopolymerization initiator in the total solid content of the curable composition according to the embodiment of the present invention is preferably 0.1 to 30 mass %. The lower limit is preferably 0.5 mass % or more and more preferably 1 mass % or more. The upper limit is preferably 20 mass % or less and more preferably 15 mass % or less. In the curable composition according to the embodiment of the present invention, the photopolymerization initiator may be used singly or in combination of two or more kinds thereof. In a case where two or more kinds thereof are used, the total content thereof is preferably within the above-described range.

<<Resin>>

The curable composition according to the embodiment of the present invention contains a resin. The resin is blended in, for example, an application for dispersing particles such as a pigment in a curable composition or an application as a binder. The resin which is mainly used to disperse particles of the pigments and the like will also be called a dispersant. However, such applications of the resin are merely exemplary, and the resin can also be used for other purposes in addition to such applications.

The weight-average molecular weight (Mw) of the resin is preferably 3000 to 2000000. The upper limit is preferably 1000000 or less and more preferably 500000 or less. The lower limit is preferably 4000 or more and more preferably 5000 or more.

Examples of the resin include a (meth)acrylic resin, an ene-thiol resin, a polycarbonate resin, a polyether resin, a polyarylate resin, a polysulfone resin, a polyethersulfone resin, a polyphenylene resin, a polyarylene ether phosphine oxide resin, a polyimide resin, a polyamideimide resin, a polyolefin resin, a cyclic olefin resin, a polyester resin, and a styrene resin. Among these resins, one kind may be used alone, or a mixture of two or more kinds may be used. In addition, resins described in paragraphs "0041" to "0060" of JP2017-206689A, and resins described in paragraphs "0022" to "007" of JP2018-010856A can also be used.

In the present invention, as the resin, a resin having an acid group can be preferably used. In particular, in a case of using, as the compound A, a compound having each of the coloring agent partial structure, the basic group, and the curable group, by using such a compound and a resin having an acid group in combination, dispersibility of the pigment in the composition can be more improved. Furthermore, heat resistance of film to be obtained can be improved. Examples of the acid group include a carboxyl group, a phosphate group, a sulfo group, and a phenolic hydroxy group, and a carboxyl group is preferable. The resin having an acid group can be used, for example, as an alkali-soluble resin.

The resin having an acid group preferably includes a repeating unit having an acid group in the side chain, and more preferably includes 5 to 70 mol % of repeating units having an acid group in the side chain with respect to the total repeating units of the resin. The upper limit of the content of the repeating unit having an acid group in the side chain is preferably 50 mol % or less and more preferably 30 mol % or less. The lower limit of the content of the repeating unit having an acid group in the side chain is preferably 10 mol % or more and more preferably 20 mol % or more.

It is also preferable that the resin having an acid group includes a repeating unit derived from a monomer component including a compound represented by Formula (ED1) and/or a compound represented by Formula (ED2) (hereinafter, these compounds may be referred to as an "ether dimer").

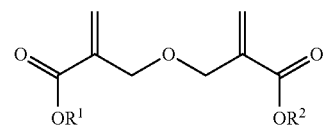

In Formula (ED1), $R^1$ and $R^2$ each independently represent a hydrogen atom or a hydrocarbon group having 1 to 25 carbon atoms which may have a substituent.

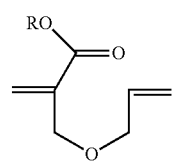

In Formula (ED2), R represents a hydrogen atom or an organic group having 1 to 30 carbon atoms. With regard to details of Formula (ED2), reference can be made to the description in JP2010-168539A, the contents of which are incorporated herein by reference.

Specific examples of the ether dimer can be found in paragraph "0317" of JP2013-029760A, the content of which is incorporated herein by reference.

It is also preferable that the resin used in the present invention includes a repeating unit derived from a compound represented by Formula (X).

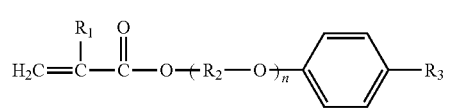

In Formula (X), $R_1$ represents a hydrogen atom or a methyl group, $R_2$ represents an alkylene group having 2 to 10 carbon atoms, and $R_3$ represents a hydrogen atom or an alkyl group having 1 to 20 carbon atoms which may have a benzene ring. n represents an integer of 1 to 15.

With regard to the resin having an acid group, reference can be made to the description in paragraphs "0558" to "0571" of JP2012-208494A (paragraphs "0685" to "0700" of the corresponding US2012/0235099A) and the description in paragraphs "0076" to "0099" of JP2012-198408A, the contents of which are incorporated herein by reference. In addition, as the resin having an acid group, a commercially available product can also be used.

The acid value of the resin having an acid group is preferably 30 to 500 mgKOH/g. The lower limit is preferably 50 mgKOH/g or more and more preferably 70 mgKOH/g or more. The upper limit is preferably 400 mgKOH/g or less, more preferably 300 mgKOH/g or less, and still more preferably 200 mgKOH/g or less. The weight-average molecular weight (Mw) of the resin having an acid group is preferably 5000 to 100000. In addition, the number-average molecular weight (Mn) of the resin having an acid group is preferably 1000 to 20000.

Examples of the resin having an acid group include resins having the following structures.

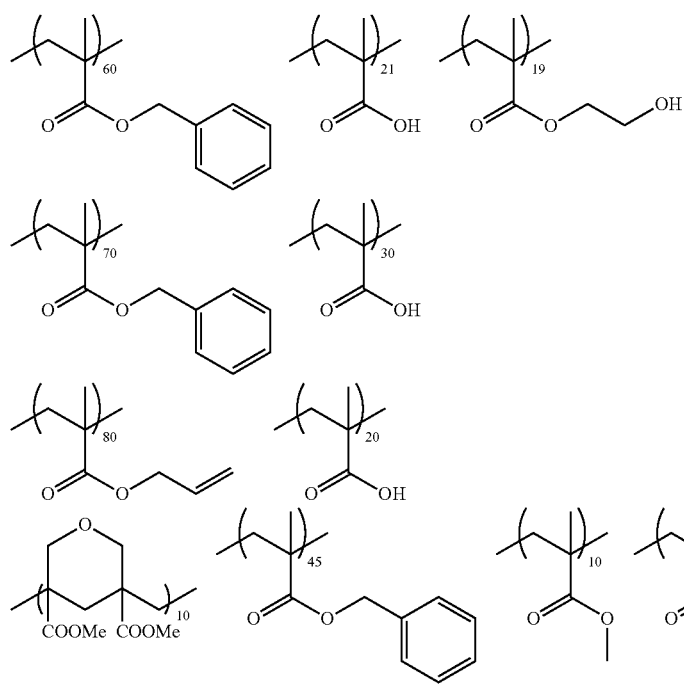

The curable composition according to the embodiment of the present invention can also include a resin as a dispersant. Examples of the dispersant include an acidic dispersant (resin having an acid group) and a basic dispersant (resin having a basic group). Here, the acidic dispersant represents a resin in which the amount of the acid group is larger than the amount of the basic group. The acidic dispersant is preferably a resin in which the amount of the acid group occupies 70 mol % or more in a case where the total content of the acid group and the basic group is 100 mol %, and more preferably a resin substantially consisting of only an acid group. The acid group in the acidic dispersant is preferably a carboxyl group. The acid value of the acidic dispersant is preferably 40 to 105 mgKOH/g, more preferably 50 to 105 mgKOH/g, and still more preferably 60 to 105 mgKOH/g. In addition, the basic dispersant represents a resin in which the amount of the basic group is larger than the amount of the acid group. The basic dispersant is preferably a resin in which the amount of the basic group is more than 50 mol % in a case where the total content of the acid group and the basic group is 100 mol %. The basic group in the basic dispersant is preferably an amino group.

In the present invention, in a case of using, as the compound A, a compound having each of the coloring agent partial structure, the basic group, and the curable group, the resin used as a dispersant is preferably the acidic dispersant (resin having an acid group). In addition, in a case of using, as the compound A, a compound having each of the coloring agent partial structure, the acid group, and the curable group, the resin used as a dispersant is preferably the basic dispersant (resin having a basic group).

In the present invention, it is preferable that the compound having each of the coloring agent partial structure, the basic group, and the curable group is used as the compound A and the resin used as a dispersant is the acidic dispersant (resin having an acid group). According to this aspect, the dispersibility of the pigment can be more significantly improved. Furthermore, it is easy to improve heat resistance of film to be obtained. In addition, in a case of forming a pattern by a photolithography method, generation of development residue can be more effectively suppressed.

It is also preferable that the resin used as a dispersant is a graft resin. With regard to details of the graft resin, reference can be made to the description in paragraphs "0025" to "0094" of JP2012-255128A, the contents of which are incorporated herein by reference.

It is also preferable that the resin used as a dispersant is a polyimine-based dispersant including a nitrogen atom in at least one of the main chain or the side chain. As the polyimine-based dispersant, a resin having a main chain which has a partial structure having a functional group of pKa14 or less, and a side chain which has 40 to 10000 atoms, in which at least one of the main chain or the side chain has a basic nitrogen atom, is preferable. The basic nitrogen atom is not particularly limited as long as it is a nitrogen atom exhibiting basicity. With regard to the polyimine-based dispersant, reference can be made to the description in paragraphs "0102" to "0166" of JP2012-255128A, the contents of which are incorporated herein by reference.

It is also preferable that the resin used as a dispersant is a resin having a structure in which a plurality of polymer chains are bonded to a core portion. Examples of such a resin include dendrimers (including star polymers). In addition, specific examples of the dendrimer include polymer compounds C-1 to C-31 described in paragraphs "0196" to "0209" of JP2013-043962A.

In addition, the above-described resin (alkali-soluble resin) having an acid group can also be used as a dispersant.

In addition, it is also preferable that the resin used as a dispersant is a resin including a repeating unit having an ethylenically unsaturated bonding group in the side chain. The content of the repeating unit having an ethylenically unsaturated bonding group in the side chain is preferably 10 mol % or more, more preferably 10 to 80 mol %, and still more preferably 20 to 70 mol % with respect to all the repeating units of the resin.

A commercially available product is also available as the dispersant, and specific examples thereof include DISPERBYK series (for example, DISPERBYK-111, 161, and the like) manufactured by BYK Chemie, and Solsperse series (for example, Solsperse 76500) manufactured by Lubrizol Corporation. In addition, pigment dispersants described in paragraphs "0041" to "0130" of JP2014-130338A can also be used, the contents of which are incorporated herein by reference. The resin described as a dispersant can be used for an application other than the dispersant. For example, the resin can also be used as a binder.

The content of the resin in the total solid content of the curable composition is preferably 5 to 50 mass %. The lower limit is preferably 10 mass % or more and more preferably 15 mass % or more. The upper limit is preferably 40 mass % or less, more preferably 35 mass % or less, and still more preferably 30 mass % or less. In addition, the content of the resin (alkali-soluble resin) having an acid group in the total solid content of the curable composition is preferably 5 to 50 mass %. The lower limit is preferably 10 mass % or more and more preferably 15 mass % or more. The upper limit is preferably 40 mass % or less, more preferably 35 mass % or less, and still more preferably 30 mass % or less. In addition, from the reason that excellent developability is easily obtained, the content of the resin (alkali-soluble resin) having an acid group in the total amount of the resin is preferably 30 mass % or more, more preferably 50 mass % or more, still more preferably 70 mass % or more, and particularly preferably 80 mass % or more. The upper limit may be 100 mass %, 95 mass %, or 90 mass % or less.

In addition, from the viewpoint of curability, developability, and film-forming property, the total content of the polymerizable compound and resin in the total solid content of the curable composition is preferably 10 to 65 mass %. The lower limit is preferably 15 mass % or more, more preferably 20 mass % or more, and still more preferably 30 mass % or more. The upper limit is preferably 60 mass % or less, more preferably 50 mass % or less, and still more preferably 40 mass % or less. In addition, the coloring composition according to the embodiment of the present invention preferably contains 30 to 300 parts by mass of the resin with respect to 100 parts by mass of the polymerizable compound. The lower limit is preferably 50 parts by mass or more and more preferably 80 parts by mass or more. The upper limit is preferably 250 parts by mass or less and more preferably 200 parts by mass or less.

<<Silane Coupling Agent>>

The curable composition according to the embodiment of the present invention can contain a silane coupling agent. According to this aspect, adhesiveness of a film to be obtained with a support can be further improved. In the present invention, the silane coupling agent means a silane compound having a hydrolyzable group and other functional groups. In addition, the hydrolyzable group refers to a substituent directly linked to a silicon atom and capable of forming a siloxane bond due to at least one of a hydrolysis reaction or a condensation reaction. Examples of the hydrolyzable group include a halogen atom, an alkoxy group, and an acyloxy group, and an alkoxy group is preferable. That is, it is preferable that the silane coupling agent is a compound having an alkoxysilyl group. Examples of the functional group other than the hydrolyzable group include a vinyl group, a (meth)allyl group, a (meth)acryloyl group, a mercapto group, an epoxy group, an oxetanyl group, an amino group, a ureido group, a sulfide group, an isocyanate group, and a phenyl group, and an amino group, a (meth)acryloyl group, or an epoxy group is preferable. Specific examples of the silane coupling agent include the compounds described in paragraphs "0018" to "0036" of JP2009-288703A and the compounds described in paragraphs "0056" to "0066" of JP2009-242604A, the contents of which are incorporated herein by reference.

The content of the silane coupling agent in the total solid content of the curable composition is preferably 0.1 to 5 mass %. The upper limit is preferably 3 mass % or less and more preferably 2 mass % or less. The lower limit is preferably 0.5 mass % or more and more preferably 1 mass % or more. The silane coupling agent may be used singly or in combination of two or more kinds thereof. In a case where two or more kinds of silane coupling agents are used in combination, it is preferable that the total content of the two or more kinds of silane coupling agents is within the above-described range.

<<Solvent>>

The curable composition according to the embodiment of the present invention can contain a solvent. Examples of the solvent include an organic solvent. Basically, the solvent is not particularly limited as long as it satisfies the solubility of the respective components and the application properties of the curable composition. Examples of the organic solvent include an ester solvent, a ketone solvent, an alcohol solvent, an amide solvent, an ether solvent, and a hydrocarbon solvent. The details of the organic solvent can be found in paragraph "0223" of WO2015/166779A, the content of which is incorporated herein by reference. In addition, an ester solvent in which a cyclic alkyl group is substituted or a ketone solvent in which a cyclic alkyl group is substituted can also be preferably used. Specific examples of the organic solvent include polyethylene glycol monomethyl ether, dichloromethane, methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, cyclohexyl acetate, cyclopentanone, ethyl carbitol acetate, butyl carbitol acetate, propylene glycol monomethyl ether, propylene glycol monomethyl ether acetate, 3-methoxy-N,N-dimethylpropanamide, and 3-butoxy-N,N-dimethylpropanamide. In this case, it may be preferable that the content of aromatic hydrocarbons (such as benzene, toluene, xylene, and ethylbenzene) as the solvent is low (for example, 50 parts per million (ppm) by mass or less, 10 ppm by mass or less, or 1 ppm by mass or less with respect to the total amount of the organic solvent) in consideration of environmental aspects and the like.

In the present invention, a solvent having a low metal content is preferably used. For example, the metal content in the solvent is preferably 10 mass parts per billion (ppb) or less. Optionally, a solvent having a metal content at a mass parts per trillion (ppt) level may be used. For example, such a high-purity solvent is available from Toyo Gosei Co., Ltd. (The Chemical Daily, Nov. 13, 2015).

Examples of a method for removing impurities such as a metal from the solvent include distillation (such as molecular distillation and thin-film distillation) and filtration using a filter. The filter pore size of the filter used for the filtration is preferably 10 µm or less, more preferably 5 µm or less, and still more preferably 3 µm or less. As a material of the filter, polytetrafluoroethylene, polyethylene, or nylon is preferable.

The solvent may include isomers (compounds having the same number of atoms and different structures). In addition, only one kind of isomers may be included, or a plurality of isomers may be included.

In the present invention, the organic solvent preferably has the content of peroxides of 0.8 mmol/L or less, and more preferably, the organic solvent does not substantially include peroxides.

The content of the solvent in the curable composition is preferably 10 to 95 mass %, more preferably 20 to 90 mass %, and still more preferably 30 to 90 mass %.

In addition, from the viewpoint of environmental regulation, it is preferable that the curable composition according to the embodiment of the present invention does not substantially contain environmentally regulated substances. In the present invention, the description "does not substantially contain environmentally regulated substances" means that the content of the environmentally regulated substances in the curable composition is 50 ppm by mass or less, preferably 30 ppm by mass or less, still more preferably 10 ppm by mass or less, and particularly preferably 1 ppm by mass or less. Examples of the environmentally regulated substances include benzenes; alkylbenzenes such as toluene and xylene; and halogenated benzenes such as chlorobenzene. These compounds are registered as environmentally regulated substances in accordance with Registration Evaluation Authorization and Restriction of Chemicals (REACH) rules, Pollutant Release and Transfer Register (PRTR) law, Volatile Organic Compounds (VOC) regulation, and the like, and strictly regulated in their usage and handling method. These compounds can be used as a solvent in a case of producing respective components used in the curable composition according to the embodiment of the present invention, and may be incorporated into the curable composition as a residual solvent. From the viewpoint of human safety and environmental considerations, it is preferable to reduce these substances as much as possible. Examples of a method for reducing the environmentally regulated substances include a method for reducing the environmentally regulated substances by distilling the environmentally regulated substances from a system by heating or depressurizing the system such that the temperature of the system is higher than a boiling point of the environmentally regulated substances. In addition, in a case of distilling a small amount of the environmentally regulated substances, it is also useful to azeotrope with a solvent having the boiling point equivalent to that of the above-described solvent in order to increase efficiency. In addition, in a case of containing a compound having radical polymerizability, in order to suppress the radical polymerization reaction proceeding during the distillation under reduced pressure to cause crosslinking between the molecules, a polymerization inhibitor or the like may be added and the distillation under reduced pressure is performed. These distillation methods can be performed at any stage of raw material, product (for example, resin solution after polymerization or polyfunctional monomer solution) obtained by reacting the raw material, or curable composition produced by mixing these compounds.

<<Polymerization Inhibitor>>

The curable composition according to the embodiment of the present invention can contain a polymerization inhibitor. Examples of the polymerization inhibitor include hydroquinone, p-methoxyphenol, di-tert-butyl-p-cresol, pyrogallol, tert-butyl catechol, benzoquinone, 4,4'-thiobis(3-methyl-6-tert-butylphenol), 2,2'-methylenebis(4-methyl-6-t-butylphenol), and an N-nitrosophenylhydroxylamine salt (an ammonium salt, a cerous salt, or the like). Among these, p-methoxyphenol is preferable. The content of the polymerization inhibitor in the total solid content of the curable composition is preferably 0.0001 to 5 mass %.

<<Surfactant>>

The curable composition according to the embodiment of the present invention can contain a surfactant. As the surfactant, various surfactants such as a fluorine surfactant, a nonionic surfactant, a cationic surfactant, an anionic surfactant, or a silicon-based surfactant can be used. With regard to the surfactant, reference can be made to the description in paragraphs "0238" to "0245" of WO2015/166779A, the contents of which are incorporated herein by reference.

In the present invention, it is preferable that the surfactant is a fluorine surfactant. By containing a fluorine surfactant in the curable composition, liquid characteristics (particularly, fluidity) are further improved, and liquid saving properties can be further improved. In addition, it is possible to form a film with a small thickness unevenness.

The fluorine content in the fluorine surfactant is preferably 3 to 40 mass %, more preferably 5 to 30 mass %, and particularly preferably 7 to 25 mass %. The fluorine surfactant in which the fluorine content is within the above-described range is effective in terms of the evenness of the thickness of the coating film or liquid saving properties and the solubility of the surfactant in the curable composition is also good.

Examples of the fluorine surfactant include surfactants described in paragraphs "0060" to "0064" of JP2014-041318A (paragraphs "0060" to "0064" of the corresponding WO2014/017669A) and the like, and surfactants described in paragraphs "0117" to "0132" of JP2011-132503A, the contents of which are incorporated herein by reference. Examples of a commercially available product of the fluorine surfactant include: MEGAFACE F171, F172, F173, F176, F177, F141, F142, F143, F144, R30, F437, F475, F479, F482, F554, F780, EXP, MFS-330 (all of which are manufactured by DIC Corporation); FLUORAD FC430, FC431, and FC171 (all of which are manufactured by Sumitomo 3M Ltd.); SURFLON S-382, SC-101, SC-103, SC-104, SC-105, SC-1068, SC-381, SC-383, S-393, and KH-40 (all of which are manufactured by Asahi Glass Co., Ltd.); and POLYFOX PF636, PF656, PF6320, PF6520, and PF7002 (all of which are manufactured by OMNOVA Solutions Inc.).

In addition, as the fluorine surfactant, an acrylic compound which has a molecular structure having a functional group containing a fluorine atom and in which, by applying heat to the molecular structure, the functional group containing a fluorine atom is broken to volatilize a fluorine atom can also be suitably used. Examples of such a fluorine surfactant include MEGAFACE DS series (manufactured by DIC Corporation, The Chemical Daily, Feb. 22, 2016, Nikkei Business Daily, Feb. 23, 2016), for example, MEGAFACE DS-21.

In addition, as the fluorine surfactant, a polymer of a fluorine atom-containing vinyl ether compound having a fluorinated alkyl group or a fluorinated alkylene ether group, and a hydrophilic vinyl ether compound can be preferably used. With regard to such a fluorine surfactant, reference can be made to the description in JP2016-216602A, the contents of which are incorporated herein by reference.

As the fluorine surfactant, a block polymer can also be used. Examples thereof include compounds described in JP2011-089090A. As the fluorine surfactant, a fluorine-containing polymer compound including a repeating unit derived from a (meth)acrylate compound having a fluorine atom and a repeating unit derived from a (meth)acrylate compound having 2 or more (preferably 5 or more) alkyleneoxy groups (preferably ethyleneoxy groups or propyleneoxy groups) can also be preferably used. For example, the following compound can also be used as the fluorine surfactant used in the present invention.

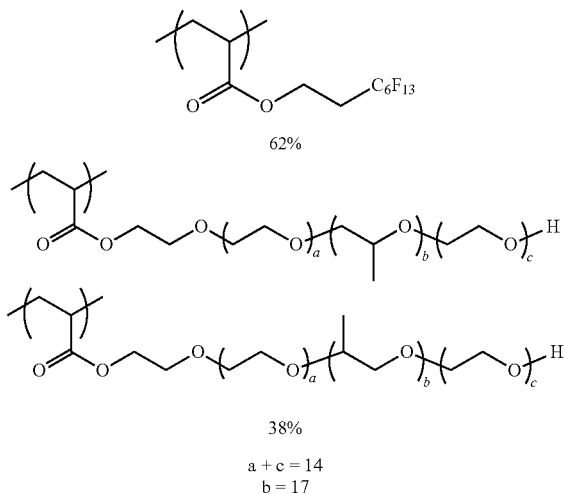

a + c = 14
b = 17

The weight-average molecular weight of the compound is preferably 3000 to 50000 and, for example, 14000. In the compound, "%" representing the proportion of a repeating unit is mol %.

In addition, as the fluorine surfactant, a fluorine-containing polymer including a repeating unit having an ethylenically unsaturated bonding group in the side chain can be used. Specific examples thereof include compounds described in paragraphs "0050" to "0090" and paragraphs "0289" to "0295" of JP2010-164965A, and for example, MEGAFACE RS-101, RS-102, RS-718K, and RS-72-K manufactured by DIC Corporation. As the fluorine surfactant, compounds described in paragraphs "0015" to "0158" of JP2015-117327A can also be used.

Examples of the nonionic surfactant include glycerol, trimethylolpropane, trimethylolethane, an ethoxylate and a propoxylate thereof (for example, glycerol propoxylate or glycerol ethoxylate), polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, sorbitan fatty acid esters, PLURONIC L10, L31, L61, L62, 10R5, 17R2, and 25R2 (manufactured by BASF), TETRONIC 304, 701, 704, 901, 904, and 150R1 (manufactured by BASF), SOLSPERSE 20000 (manufactured by Lubrizol Corporation), NCW-101, NCW-1001, and NCW-1002 (all of which are manufactured by Wako Pure Chemical Industries, Ltd.), PIONIN D-6112, D-6112-W, and D-6315 (all of which are manufactured by Takemoto Oil&Fat Co., Ltd.), and OLFINE E1010 and SURFYNOL 104, 400, and 440 (all of which are manufactured by Nissin Chemical Co., Ltd.).

Examples of the silicon-based surfactant include TORAY SILICONE DC3PA, TORAY SILICONE SH7PA, TORAY SILICONE DC11PA, TORAY SILICONE SH21PA, TORAY SILICONE SH28PA, TORAY SILICONE SH29PA, TORAY SILICONE SH30PA, and TORAY SILICONE SH8400 (all of which are manufactured by Dow Corning Toray Co., Ltd.), TSF-4440, TSF-4300, TSF-4445, TSF-4460, and TSF-4452 (all of which are manufactured by Momentive Performance Materials Co., Ltd.), KP-341, KF-6001, and KF-6002 (all of which are manufactured by Shin-Etsu Chemical Co., Ltd.), and BYK307, BYK323, and BYK330 (all of which are manufactured by BYK Chemie).

The content of the surfactant in the total solid content of the curable composition is preferably 0.001 mass % to 5.0 mass % and more preferably 0.005 to 3.0 mass %. The surfactant may be used singly or in combination of two or more kinds thereof. In a case where two or more kinds of surfactants are used in combination, it is preferable that the total content of the two or more kinds of surfactants is within the above-described range.

<<Ultraviolet Absorber>>

The curable composition according to the embodiment of the present invention can contain an ultraviolet absorber. As the ultraviolet absorber, a conjugated diene compound, an aminodiene compound, a salicylate compound, a benzophenone compound, a benzotriazole compound, an acrylonitrile compound, a hydroxyphenyltriazine compound, an indole compound, a triazine compound, and the like can be used. With regard to details thereof, reference can be made to the description in paragraphs "0052" to "0072" of JP2012-208374A, paragraphs "0317" to "0334" of JP2013-068814A, and paragraphs "0061" to "0080" of JP2016-162946A, the contents of which are incorporated herein by reference. Specific examples of the ultraviolet absorber include compounds having the following structures. Examples of a commercially available product of the ultraviolet absorber include UV-503 (manufactured by Daito Chemical Co., Ltd.). In addition, examples of the benzotriazole compound include MYUA series manufactured by Miyoshi Oil & Fat Co., Ltd. (The Chemical Daily, Feb. 1, 2016). In addition, as the ultraviolet absorber, compounds described in paragraphs "0049" to "0059" of JP6268967B can also be used.

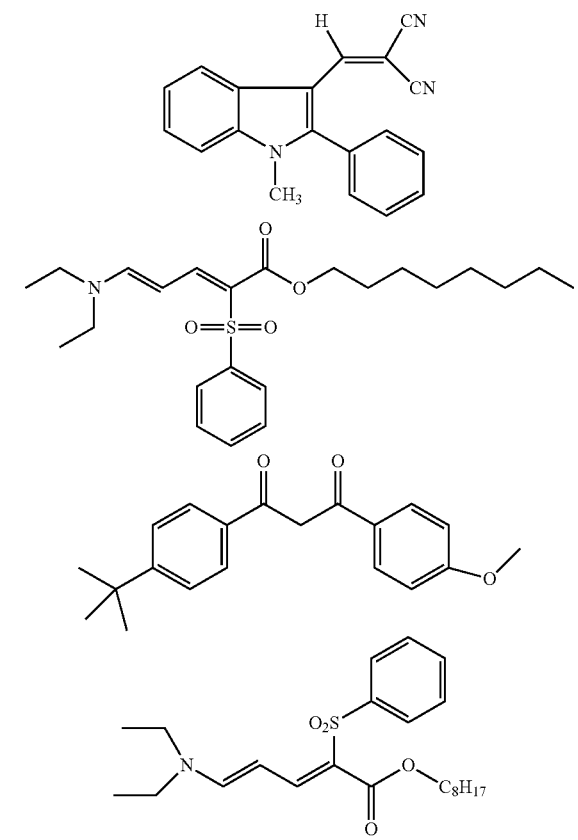

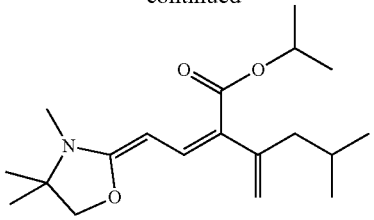

The content of the ultraviolet absorber in the total solid content of the curable composition is preferably 0.01 to 10 mass % and more preferably 0.01 to 5 mass %. In the present invention, the ultraviolet absorber may be used singly or in combination of two or more kinds thereof. In a case where two or more kinds thereof are used, the total content thereof is preferably within the above-described range.

<<Antioxidant>>

The curable composition according to the embodiment of the present invention can contain an antioxidant. Examples of the antioxidant include a phenol compound, a phosphite ester compound, and a thioether compound. As the phenol compound, any phenol compound which is known as a phenol-based antioxidant can be used. Preferred examples of the phenol compound include a hindered phenol compound. A compound having a substituent at a site (ortho position) adjacent to a phenolic hydroxy group is preferable. As the substituent, a substituted or unsubstituted alkyl group having 1 to 22 carbon atoms is preferable. In addition, as the antioxidant, a compound having a phenol group and a phosphite ester group in the same molecule is also preferable. In addition, as the antioxidant, a phosphorus antioxidant can also be suitability used. Examples of the phosphorus antioxidant include tris[2-[[2,4,8,10-tetrakis(1,1-dimethylethyl)dibenzo[d,f][1,3,2]dioxaphosphepin-6-yl]oxy]ethyl]amine, tris[2-[(4,6,9,11-tetra-tert-butyldibenzo[d,f][1,3,2]dioxaphosphepin-2-yl)oxy]ethyl]amine, and ethyl bis(2,4-di-tert-butyl-6-methylphenyl)phosphite. Examples of a commercially available product of the antioxidant include ADEKA STAB AO-20, ADEKA STAB AO-30, ADEKA STAB AO-40, ADEKA STAB AO-50, ADEKA STAB AO-50F, ADEKA STAB AO-60, ADEKA STAB AO-60G, ADEKA STAB AO-80, and ADEKA STAB AO-330 (all of which are manufactured by ADEKA Corporation). In addition, as the antioxidant, compounds described in paragraphs "0023" to "0048" of JP6268967B can also be used.

The content of the antioxidant in the total solid content of the curable composition is preferably 0.01 to 20 mass % and more preferably 0.3 to 15 mass %. The antioxidant may be used singly or in combination of two or more kinds thereof. In a case where two or more kinds thereof are used, the total content thereof is preferably within the above-described range.

<<Other Components>>

Optionally, the curable composition according to the embodiment of the present invention may further contain a sensitizer, a curing accelerator, a filler, a thermal curing accelerator, a plasticizer, and other auxiliary agents (for example, conductive particles, an antifoaming agent, a flame retardant, a leveling agent, a peeling accelerator, an aromatic chemical, a surface tension adjuster, or a chain transfer agent). By appropriately containing these components, properties such as film properties can be adjusted. The details of the components can be found in, for example, paragraphs "0183" and later of JP2012-003225A (corresponding to paragraph "0237" of US2013/0034812A) and paragraphs "0101" to "0104" and "0107" to "0109" of JP2008-250074A, the content of which is incorporated herein by reference. In addition, optionally, the curable composition according to the embodiment of the present invention may contain a potential antioxidant. Examples of the potential antioxidant include a compound in which a portion that functions as the antioxidant is protected by a protective group and the protective group is desorbed by heating the compound at 100° C. to 250° C. or by heating the compound at 80° C. to 200° C. in the presence of an acid or base catalyst. Examples of the potential antioxidant include compounds described in WO2014/021023A, WO2017/030005A, and JP2017-008219A. Examples of a commercially available product thereof include ADEKA ARKLS GPA-5001 (manufactured by ADEKA Corporation).

In addition, in order to adjust the refractive index of the film to be obtained, the curable composition according to the embodiment of the present invention may contain a metal oxide. Examples of the metal oxide include $TiO_2$, $ZrO_2$, $Al_2O_3$, and $SiO_2$. The primary particle diameter of the metal oxide is preferably 1 to 100 nm, more preferably 3 to 70 nm, and most preferably 5 to 50 nm. The metal oxide may have a core-shell structure, and in this case, the core portion may be hollow.

In addition, the curable composition according to the embodiment of the present invention may include a light-resistance improver. Examples of the light-resistance improver include the compounds described in paragraphs "0036" and "0037" of JP2017-198787A, the compounds described in paragraphs "0029" to "0034" of JP2017-146350A, the compounds described in paragraphs "0036" and "0037", and "0049" to "0052" of JP2017-129774A, the compounds described in paragraphs "0031" to "0034", "0058", and "0059" of JP2017-129674A, the compounds described in paragraphs "0036" and "0037", and "0051" to "0054" of JP2017-122803A, the compounds described in paragraphs "0025" to "0039" of WO2017/164127A, the compounds described in paragraphs "0034" to "0047" of JP2017-186546A, the compounds described in paragraphs "0019" to "0041" of JP2015-025116A, the compounds described in paragraphs "0101" to "0125" of JP2012-145604A, the compounds described in paragraphs "0018" to "0021" of JP2012-103475A, the compounds described in paragraphs "0015" to "0018" of JP2011-257591A, the compounds described in paragraphs "0017" to "0021" of JP2011-191483A, the compounds described in paragraphs "0108" to "0116" of JP2011-145668A, and the compounds described in paragraphs "0103" to "0153" of JP2011-253174A.

For example, in a case where a film is formed by application, the viscosity (25° C.) of the curable composition according to the embodiment of the present invention is preferably 1 to 100 mPa×s. The lower limit is more preferably 2 mPa×s or more and still more preferably 3 mPa×s or more. The upper limit is more preferably 50 mPa×s or less, still more preferably 30 mPa×s or less, and particularly preferably 15 mPa×s or less.

In the curable composition according to the embodiment of the present invention, the content of free metal which is not bonded to or coordinated with a pigment or the like is preferably 100 ppm or less, more preferably 50 ppm or less, and still more preferably 10 ppm or less, it is particularly preferable to not contain the free metal substantially. According to this aspect, effects such as stabilization of pigment dispersibility (restraint of aggregation), improvement of spectral characteristics due to improvement of dispersibility, restraint of conductivity fluctuation due to stabilization of curable components or elution of metal atoms and metal ions, and improvement of display characteristics can be expected. In addition, the effects described in JP2012-153796A, JP2000-345085A, JP2005-200560A, JP1996-043620A (JP-H08-043620A), JP2004-145078A, JP2014-119487A, JP2010-083997A, JP2017-090930A, JP2018-025612A, JP2018-025797A, JP2017-155228A, JP2018-036521A, and the like can also be obtained. Examples of the types of the above-described free metals include Na, K, Ca, Sc, Ti, Mn, Cu, Zn, Fe, Cr, Co, Mg, Al, Sn, Zr, Ga, Ge, Ag, Au, Pt, Cs, and Bi. In addition, in the curable composition according to the embodiment of the present invention, the content of free halogen which is not bonded to or coordinated with a pigment or the like is preferably 100 ppm or less, more preferably 50 ppm or less, and still more preferably 10 ppm or less, it is particularly preferable to not contain the free halogen substantially. Examples of a method for reducing free metals and halogens in the curable composition include washing with ion exchange water, filtration, ultrafiltration, and purification with an ion exchange resin.

It is also preferable that the curable composition according to the embodiment of the present invention does not include terephthalic acid ester.

<Storage Container>

A storage container of the curable composition according to the embodiment of the present invention is not particularly limited, and a known storage container can be used. In addition, as the storage container, in order to suppress infiltration of impurities into the raw materials or the curable composition, a multilayer bottle in which a container inner wall having a six-layer structure is formed of six kinds of resins or a bottle in which a container inner wall having a seven-layer structure is formed of six kinds of resins is preferably used. Examples of such a container include a container described in JP2015-123351A.

<Method for Producing Curable Composition>

The curable composition according to the embodiment of the present invention can be produced by mixing the above-described components with each other. During the production of the curable composition, all the components may be dissolved and/or dispersed in a solvent at the same time to produce the curable composition. Optionally, two or more solutions or dispersion liquids in which the respective components are appropriately blended may be prepared, and the solutions or dispersion liquids may be mixed with each other during use (during application) to produce the curable composition.

It is preferable that the method for producing a curable composition according to the embodiment of the present invention includes a step of dispersing the pigment in the presence of the compound A and the resin.

In addition, in the production of the curable composition, a process of dispersing the pigment is preferably included. In the process of dispersing the pigment, examples of a mechanical force which is used for dispersing the pigment include compression, pressing, impact, shear, and cavitation. Specific examples of these processes include a beads mill, a sand mill, a roll mill, a ball mill, a paint shaker, a microfluidizer, a high-speed impeller, a sand grinder, a flow jet mixer, high-pressure wet atomization, and ultrasonic dispersion. In addition, in the pulverization of the pigment in a sand mill (beads mill), it is preferable to perform a treatment under the condition for increasing a pulverization efficiency by using beads having small diameters; increasing the filling rate of the beads; or the like. In addition, it is preferable that rough particles are removed by filtering, centrifugal separation, and the like after pulverization treatment. In addition, as the process and the disperser for dispersing the pigment, the process and the disperser described in "Dispersion Technology Comprehension, published by Johokiko Co., Ltd., Jul. 15, 2005", "Actual comprehensive data collection on dispersion technology and industrial application centered on suspension (solid/liquid dispersion system), published by Publication Department, Management Development Center, Oct. 10, 1978", and paragraph "0022" of JP2015-157893A can be suitably used. In addition, in the process for dispersing the pigment, a refining treatment of particles in a salt milling step may be performed. A material, a device, process conditions, and the like used in the salt milling step can be found in, for example, JP2015-194521A and JP2012-046629A.

During the production of the curable composition, it is preferable that the curable composition is filtered through a filter, for example, in order to remove foreign matter or to reduce defects. As the filter, any filter which is used in the related art for filtering or the like can be used without any particular limitation. Examples of a material of the filter include: a fluororesin such as polytetrafluoroethylene (PTFE); a polyamide resin such as nylon (for example, nylon-6 or nylon-6,6); and a polyolefin resin (including a polyolefin resin having a high density and an ultrahigh molecular weight) such as polyethylene or polypropylene (PP). Among these materials, polypropylene (including high-density polypropylene) or nylon is preferable.

The pore size of the filter is preferably 0.01 to 7.0 m, more preferably 0.01 to 3.0 m, and still more preferably 0.05 to 0.5 m. In a case where the pore size of the filter is within the above-described range, fine foreign matters can be reliably removed. With regard to the pore size value of the filter, reference can be made to a nominal value of filter manufacturers. As the filter, various filters provided by Nihon Pall Corporation (DFA4201NIEY and the like), Advantec Toyo Kaisha, Ltd., Nihon Entegris G. K. (formerly Nippon Microlith Co., Ltd.), Kitz Microfilter Corporation, and the like can be used.

In addition, it is preferable that a fibrous filter material is used as the filter. Examples of the fibrous filter material include polypropylene fiber, nylon fiber, and glass fiber. Examples of a commercially available product include SBP type series (SBP008 and the like), TPR type series (TPR002, TPR005, and the like), or SHPX type series (SHPX003 and the like), all manufactured by Roki Techno Co., Ltd.

In a case where a filter is used, a combination of different filters (for example, a first filter and a second filter) may be used. In this case, the filtering using each of the filters may be performed once, or twice or more. In addition, a combination of filters having different pore sizes in the above-described range may be used. In addition, the filtering using the first filter may be performed only on the dispersion liquid, and then the filtering using the second filter may be performed on a mixture of the dispersion liquid and other components.

<Film>

The film according to the embodiment of the present invention is a film obtained from the above-described curable composition according to the embodiment of the present invention. The film according to the embodiment of the present invention can be used for a color filter, a near-infrared transmission filter, a near-infrared cut filter, a black matrix, a light-shielding film, a refractive index adjusting film, and the like. For example, the film according to the embodiment of the present invention can be preferably used as a colored layer (pixel) of a color filter, and more specifically, the film according to the embodiment of the present invention can be preferably used as a green-colored layer (green pixel) of a color filter. The thickness of the film according to the embodiment of the present invention can be appropriately adjusted according to the purpose. For example, the thickness of the film is preferably 20 µm or less, more preferably 10 µm or less, and still more preferably 5 µm or less. The lower limit of the thickness of the film is preferably 0.1 µm or more, more preferably 0.2 µm or more, and still more preferably 0.3 µm or more.

<Color Filter>

Next, the color filter according to the embodiment of the present invention will be described. The color filter according to the embodiment of the present invention has the film according to the embodiment of the present invention. More preferably, the color filter according to the embodiment of the present invention has the film according to the embodiment of the present invention as a pixel of the color filter. The color filter according to the embodiment of the present invention can be used for a solid-state imaging element such as a charge coupled device (CCD) and a complementary metal-oxide semiconductor (CMOS), an image display device, or the like.

In the color filter according to the embodiment of the present invention, the thickness of the film according to the embodiment of the present invention can be appropriately adjusted depending on the purposes. The thickness of the film is preferably 20 µm or less, more preferably 10 µm or less, and still more preferably 5 µm or less. The lower limit of the thickness of the film is preferably 0.1 µm or more, more preferably 0.2 µm or more, and still more preferably 0.3 µm or more.

In the color filter according to the embodiment of the present invention, the width of the pixel is preferably 0.5 to 20.0 m. The lower limit is preferably 1.0 µm or more and more preferably 2.0 µm or more. The upper limit is preferably 15.0 µm or less and more preferably 10.0 µm or less. In addition, the Young's modulus of the pixel is preferably 0.5 to 20 GPa and more preferably 2.5 to 15 GPa.

Each pixel included in the color filter according to the embodiment of the present invention preferably has high flatness. Specifically, the surface roughness Ra of the pixel is preferably 100 nm or less, more preferably 40 nm or less, and still more preferably 15 nm or less. The lower limit is not specified, but is preferably, for example, 0.1 nm or more. The surface roughness of the pixel can be measured, for example, using an atomic force microscope (AFM) Dimension 3100 manufactured by Veeco Instruments, Inc. In addition, the contact angle of water on the pixel can be appropriately set to a preferred value and is typically in the range of 50 to 110°. The contact angle can be measured, for example, using a contact angle meter CV-DT-A Model (manufactured by Kyowa Interface Science Co., Ltd.). In addition, it is preferable that the volume resistivity value of the pixel is high. Specifically, the volume resistivity value of the pixel is preferably $10^9 \Omega \times cm$ or more and more preferably $10^{11} \Omega \times cm$ or more. The upper limit is not specified, but is preferably, for example, $10^{14} \Omega \times cm$ or less. The volume resistivity value of the pixel can be measured, for example, using an ultrahigh resistance meter 5410 (manufactured by Advantest Corporation).

In addition, in the color filter according to the embodiment of the present invention, a protective layer may be provided on the surface of the film according to the embodiment of the present invention. By providing the protective layer, various functions such as oxygen shielding, low reflection, hydrophilicity/hydrophobicity, and shielding of light (ultraviolet rays, near-infrared rays, and the like) having a specific wavelength can be imparted. The thickness of the protective layer is preferably 0.01 to 10 µm and still more preferably 0.1 to 5 m. Examples of a method for forming the protective layer include a method of forming the protective layer by applying a resin composition dissolved in an organic solvent, a chemical vapor deposition method, and a method of attaching a molded resin with an adhesive. Examples of components constituting the protective layer include a (meth)acrylic resin, an ene-thiol resin, a polycarbonate resin, a polyether resin, a polyarylate resin, a polysulfone resin, a polyethersulfone resin, a polyphenylene resin, a polyarylene ether phosphine oxide resin, a polyimide resin, a polyamideimide resin, a polyolefin resin, a cyclic olefin resin, a polyester resin, a styrene resin, a polyol resin, a polyvinylidene chloride resin, a melamine resin, a urethane resin, an aramid resin, a polyamide resin, an alkyd resin, an epoxy resin, a modified silicone resin, a fluororesin, a polycarbonate resin, a polyacrylonitrile resin, a cellulose resin, Si, C, W, $Al_2O_3$, Mo, $SiO_2$, and $Si_3N_4$, and two or more kinds of these components may be contained. For example, in a case of a protective layer for oxygen shielding, it is preferable that the protective layer contains a polyol resin, $SiO_2$, and $Si_3N_4$. In addition, in a case of a protective layer for low reflection, it is preferable that the protective layer contains a (meth)acrylic resin and a fluororesin.

In a case of forming the protective layer by applying a resin composition, as a method for applying the resin composition, a known method such as a spin coating method, a casting method, a screen printing method, and an inkjet method can be used. As the organic solvent included in the resin composition, a known organic solvent (for example, propylene glycol 1-monomethyl ether 2-acetate, cyclopentanone, ethyl lactate, and the like) can be used. In a case of forming the protective layer by a chemical vapor deposition method, as the chemical vapor deposition method, a known chemical vapor deposition method (thermochemical vapor deposition method, plasma chemical vapor deposition method, and photochemical vapor deposition method) can be used.

The protective layer may contain, as desired, an additive such as organic or inorganic fine particles, an absorber of a specific wavelength (for example, ultraviolet rays, near-infrared rays, and the like), a refractive index adjusting agent, an antioxidant, an adhesive agent, and a surfactant. Examples of the organic or inorganic fine particles include polymer fine particles (for example, silicone resin fine particles, polystyrene fine particles, and melamine resin fine particles), titanium oxide, zinc oxide, zirconium oxide, indium oxide, aluminum oxide, titanium nitride, titanium oxynitride, magnesium fluoride, hollow silica, silica, calcium carbonate, and barium sulfate. As the absorber of a specific wavelength, a known absorber can be used. Examples of the ultraviolet absorber and near-infrared absorber include the above-described materials. The content of these additives can be appropriately adjusted, but is preferably 0.1 to 70 mass % and still more preferably 1 to 60 mass % with respect to the total weight of the protective layer.

In addition, as the protective layer, the protective layers described in paragraphs "0073" to "0092" of JP2017-151176A can also be used.

<Method for Manufacturing Color Filter>

Next, the method for manufacturing a color filter according to the embodiment of the present invention will be described. The color filter according to the embodiment of the present invention can be manufactured through a step of forming a curable composition layer on a support using the above-described curable composition according to the embodiment of the present invention; and a step of forming a pattern on the curable composition layer by a photolithography method.

Pattern formation by a photolithography method preferably includes a step of forming a curable composition layer on a support using the curable composition according to the embodiment of the present invention, a step of patternwise exposing the curable composition layer, and a step of removing an unexposed area of the curable composition layer by development to form a pattern (pixel). Optionally, a step (pre-baking step) of baking the curable composition layer and a step (post-baking step) of baking the developed pattern (pixel) may be provided.

In the step of forming a curable composition layer, the curable composition layer is formed on a support using the curable composition according to the embodiment of the present invention. The support is not particularly limited, and can be appropriately selected depending on applications. Examples thereof include a glass substrate and a silicon substrate, and a silicon substrate is preferable. In addition, a charge coupled device (CCD), a complementary metal-oxide semiconductor (CMOS), a transparent conductive film, or the like may be formed on the silicon substrate. In some cases, a black matrix for isolating each pixel is formed on the silicon substrate. In addition, an undercoat layer may be provided on the silicon substrate so as to improve adhesiveness to an upper layer, prevent the diffusion of substances, or planarize the surface of the substrate.

As a method of applying the curable composition, a known method can be used. Examples of the known method include: a drop casting method; a slit coating method; a spray method; a roll coating method; a spin method; a cast coating method; a slit and spin method; a pre-wetting method (for example, a method described in JP2009-145395A); various printing methods including jet printing such as an ink jet method (for example, an on-demand method, a piezoelectric method, or a thermal method) or a nozzle jet method, flexographic printing, screen printing, gravure printing, reverse offset printing, and metal mask printing; a transfer method using a mold or the like; and a nanoimprint lithography method. The application method using an ink jet method is not particularly limited, and examples thereof include a method (in particular, pp. 115 to 133) described in "Extension of Use of Ink Jet—Infinite Possibilities in Patent—" (published in February, 2005, S. B. Research Co., Ltd.) and methods described in JP2003-262716A, JP2003-185831A, JP2003-261827A, JP2012-126830A, and JP2006-169325A. In addition, with regard to the method of applying the curable composition, reference can be made to the description in WO2017/030174A and WO2017/018419A, the contents of which are incorporated herein by reference.

The curable composition layer formed on the support may be dried (pre-baked). In a case of producing a film by a low-temperature process, pre-baking may not be performed. In a case where pre-baking is performed, the pre-baking temperature is preferably 150° C. or lower, more preferably 120° C. or lower, and still more preferably 110° C. or lower. The lower limit may be, for example, 50° C. or higher or 80° C. or higher. The pre-baking time is preferably 10 to 300 seconds, more preferably 40 to 250 seconds, and still more preferably 80 to 220 seconds. Pre-baking can be performed using a hot plate, an oven, or the like.

<<Exposure Step>>

Next, the curable composition layer is patternwise exposed (exposing step). For example, the curable composition layer can be patternwise exposed using a stepper exposure device or a scanner exposure device through a mask having a predetermined mask pattern. As a result, an exposed portion can be cured.

Examples of the radiation (light) which can be used during the exposure include g-rays and i-rays. In addition, light (preferably light having a wavelength of 180 to 300 nm) having a wavelength of 300 nm or less can also be used. Examples of the light having a wavelength of 300 nm or less include KrF-rays (wavelength: 248 nm) and ArF-rays (wavelength: 193 nm), and KrF-rays (wavelength: 248 nm) are preferable. In addition, a long-wave light source of 300 nm or more can be used.

In addition, in a case of exposure, the curable composition layer may be irradiated with light continuously to expose the curable composition layer, or the curable composition layer may be irradiated with light in a pulse to expose the curable composition layer (pulse exposure). The pulse exposure refers to an exposing method in which light irradiation and resting are repeatedly performed in a short cycle (for example, millisecond-level or less). In a case of the pulse exposure, the pulse width is preferably 100 nanoseconds (ns) or less, more preferably 50 nanoseconds or less, and still more preferably 30 nanoseconds or less. The lower limit of the pulse width is not particularly limited, and may be 1 femtosecond (fs) or more or 10 femtoseconds or more. The frequency is preferably 1 kHz or more, more preferably 2 kHz or more, and still more preferably 4 kHz or more. The upper limit of the frequency is preferably 50 kHz or less, more preferably 20 kHz or less, and still more preferably 10 kHz or less. The maximum instantaneous illuminance is preferably 50000000 W/m$^2$ or more, more preferably 100000000 W/m$^2$ or more, and still more preferably 200000000 W/m$^2$ or more. In addition, the upper limit of the maximum instantaneous illuminance is preferably 1000000000 W/m$^2$ or less, more preferably 800000000 W/m$^2$ or less, and still more preferably 500000000 W/m$^2$ or less. The pulse width refers to a time during which light is irradiated in a pulse period. In addition, the frequency refers to the number of pulse periods per second. In addition, the maximum instantaneous illuminance refers to an average illuminance within the period of light irradiation in the pulse period. In addition, the pulse period refers to a period in which light irradiation and resting in the pulse exposure are defined as one cycle.

The irradiation dose (exposure dose) is, for example, preferably 0.03 to 2.5 J/cm$^2$ and more preferably 0.05 to 1.0 J/cm$^2$. The oxygen concentration during the exposure can be appropriately selected, and the exposure may also be performed, for example, in a low-oxygen atmosphere having an oxygen concentration of 19% by volume or less (for example, 15% by volume, 5% by volume, and substantially oxygen-free) or in a high-oxygen atmosphere having an oxygen concentration of more than 21% by volume (for example, 22% by volume, 30% by volume, and 50% by volume), in addition to an atmospheric air. In addition, the exposure illuminance can be appropriately set, and can be usually selected from a range of 1000 W/m$^2$ to 100000 W/m$^2$ (for example, 5000 W/m$^2$, 15000 W/m$^2$, or 35000 W/m$^2$). Appropriate conditions of each of the oxygen concentration and the exposure illuminance may be combined, and for example, a combination of the oxygen concentration of 10% by volume and the illuminance of 10000 W/m$^2$, a combination of the oxygen concentration of 35% by volume and the illuminance of 20000 W/m$^2$, or the like is available.

Next, the unexposed area of the curable composition layer is removed by development to form a pattern (pixel). The unexposed area of the curable composition layer can be removed by development using a developer. Thus, the curable composition layer of the unexposed area in the exposure step is eluted into the developer, and as a result, only a photocured portion remains. For example, the temperature of the developer is preferably 20° C. to 30° C. The development time is preferably 20 to 180 seconds. In addition, in order to further improve residues removing properties, a step of shaking the developer off per 60 seconds and supplying a new developer may be repeated multiple times.

Examples of the developer include an organic solvent and an alkaline developer. As the alkaline developer, an alkaline aqueous solution in which an alkaline agent is diluted with pure water is preferable. Examples of the alkaline agent include: an organic alkaline compound such as ammonia, ethylamine, diethylamine, dimethylethanolamine, diglycolamine, diethanolamine, hydroxyamine, ethylenediamine, tetramethylammonium hydroxide, tetraethylammonium hydroxide, tetrapropylammonium hydroxide, tetrabutylammonium hydroxide, ethyltrimethylammonium hydroxide, benzyltrimethylammonium hydroxide, dimethyl bis(2-hydroxyethyl)ammonium hydroxide, choline, pyrrole, piperidine, and 1,8-diazabicyclo[5.4.0]-7-undecene; and an inorganic alkaline compound such as sodium hydroxide, potassium hydroxide, sodium carbonate, sodium bicarbonate, sodium silicate, and sodium metasilicate. In consideration of environmental aspects and safety aspects, the alkaline agent is preferably a compound having a high molecular weight. The concentration of the alkaline agent in the alkaline aqueous solution is preferably 0.001 to 10 mass % and more preferably 0.01 to 1 mass %. In addition, the developer may further contain a surfactant. Examples of the surfactant include the surfactants described above. Among these, a nonionic surfactant is preferable. From the viewpoint of easiness of transport, storage, and the like, the developer may be obtained by temporarily preparing a concentrated solution and diluting the concentrated solution to a necessary concentration during use. The dilution factor is not particularly limited and, for example, can be set to be in a range of 1.5 to 100 times. In addition, it is also preferable to wash (rinse) with pure water after development. In addition, it is preferable that the rinsing is performed by supplying a rinsing liquid to the curable composition layer after development while rotating the support on which the curable composition layer after development is formed. In addition, it is preferable that the rinsing is performed by moving a nozzle discharging the rinsing liquid from a center of the support to a peripheral edge of the support. In this case, in the movement of the nozzle from the center of the support to the peripheral edge of the support, the nozzle may be moved while gradually decreasing the moving speed of the nozzle. By performing rinsing in this manner, in-plane variation of rinsing can be suppressed. In addition, the same effect can be obtained by gradually decreasing the rotating speed of the support while moving the nozzle from the center of the support to the peripheral edge of the support.

After the development, it is preferable to perform an additional exposure treatment or a heat treatment (post-baking) after carrying out drying. The additional exposure treatment or the post-baking is a heat treatment after development in order to complete curing, and the heat temperature is preferably, for example, 100° C. to 240° C. and more preferably 200° C. to 240° C. The film after development is post-baked continuously or batchwise using a heating unit such as a hot plate, a convection oven (hot air circulation dryer), and a high-frequency heater under the above-described conditions. In a case of performing the additional exposure treatment, light used for the exposure is preferably light having a wavelength of 400 nm or less. In addition, the additional exposure treatment may be performed by the method described in KR10-2017-122130A.

<Solid-State Imaging Element>

The solid-state imaging element according to the embodiment of the present invention has the film according to the embodiment of the present invention. The configuration of the solid-state imaging element according to the embodiment of the present invention is not particularly limited as long as the solid-state imaging element is configured to include the film according to the embodiment of the present invention and functions as a solid-state imaging element. Examples of the configuration include the following configurations.

The solid-state imaging element is configured to have a plurality of photodiodes constituting a light receiving area of the solid-state imaging element (a charge coupled device (CCD) image sensor, a complementary metal-oxide semiconductor (CMOS) image sensor, or the like), and a transfer electrode formed of polysilicon or the like on a substrate; have a light-shielding film having openings only over the light receiving portion of the photodiodes on the photodiodes and the transfer electrodes; have a device-protective film formed of silicon nitride or the like, which is formed to cover the entire surface of the light-shielding film and the light receiving portion of the photodiodes, on the light-shielding film; and have a color filter on the device-protective film. Furthermore, the solid-state imaging element may also be configured, for example, such that it has a light collecting unit (for example, a microlens, which is the same hereinafter) on a device-protective film under a color filter (a side closer to the substrate), or has a light collecting unit on a color filter. In addition, the color filter may have a structure in which each coloring pixel is embedded in a space partitioned in, for example, a lattice shape by a partition wall. The partition wall in this case preferably has a low refractive index for each coloring pixel. Examples of an imaging device having such a structure include the devices described in JP2012-227478A, JP2014-179577A, and WO2018/043654A. An imaging device including the solid-state imaging element according to the embodiment of the present invention can also be used as a vehicle camera or a monitoring camera, in addition to a digital camera or electronic equipment (mobile phones or the like) having an imaging function.

<Image Display Device>

The image display device according to the embodiment of the present invention has the film according to the embodiment of the present invention. Examples of the image display device include a liquid crystal display device or an organic electroluminescence display device. The definitions of image display devices or the details of the respective image display devices are described in, for example, "Electronic Display Device (Akio Sasaki, Kogyo Chosakai Publishing Co., Ltd., published in 1990)", "Display Device (Sumiaki Ibuki, Sangyo Tosho Co., Ltd., published in 1989)", and the like. In addition, the details of a liquid crystal display device can be found in, for example, "Next-Generation Liquid Crystal Display Techniques (Edited by Tatsuo Uchida, Kogyo Chosakai Publishing Co., Ltd., published in 1994)". The liquid crystal display device to which the present invention is applicable is not particularly limited.

For example, the present invention is applicable to various liquid crystal display devices described in "Next-Generation Liquid Crystal Display Techniques".

EXAMPLES

Hereinafter, the present invention will be described in detail using Examples. Materials, used amounts, proportions, treatment details, treatment procedures, and the like shown in the following examples can be appropriately changed within a range not departing from the scope of the present invention. Accordingly, the scope of the present invention is not limited to the following specific examples.

[Production of Pigment Dispersion Liquid]

<Production of Dispersion Liquids G-1 to G12 and G-r1 to G-r4>

83 parts by mass of C. I. Pigment Green 36, 5 parts by mass of C. I. Pigment Yellow 185, 12 parts by mass of C. I. Pigment Yellow 150, a dispersant shown in the following table, a derivative shown in the following table, 10 parts by mass of benzyl methacrylate/methacrylic acid/2-hydroxyethyl methacrylate copolymer (=60/22/18 [molar ratio], Mw: 15000, Mn: 8000), and 530 parts by mass of propylene glycol monomethyl ether acetate (PGMEA) were mixed with each other. After that, the obtained mixed solution was mixed and dispersed for 3 hours using a beads mill (a high-pressure disperser with a pressure reducing mechanism, NANO-3000-10 (manufactured by Nippon BEE Chemical Co., Ltd.)) in which zirconia beads having a diameter of 0.3 mm were used. As a result, a dispersion liquid is produced.

TABLE 1

|  | Derivative | | Dispersant | |
|---|---|---|---|---|
|  | Type | Blending amount (part by mass) | Type | Blending amount (part by mass) |
| Dispersion liquid G-1 | B-1 | 10 | Dispersant 1 | 30 |
| Dispersion liquid G-2 | B-2 | 20 | Dispersant 1 | 30 |

TABLE 1-continued

|  | Derivative | | Dispersant | |
|---|---|---|---|---|
|  | Type | Blending amount (part by mass) | Type | Blending amount (part by mass) |
| Dispersion liquid G-3 | B-4 | 30 | Dispersant 1 | 30 |
| Dispersion liquid G-4 | B-14 | 10 | Dispersant 1 | 30 |
| Dispersion liquid G-5 | B-21 | 10 | Dispersant 1 | 30 |
| Dispersion liquid G-6 | B-1 | 3 | Dispersant 1 | 30 |
| Dispersion liquid G-7 | B-1 | 40 | Dispersant 1 | 30 |
| Dispersion liquid G-8 | B-1 | 18 | Dispersant 1 | 30 |
| Dispersion liquid G-9 | B-1 | 10 | Dispersant 2 | 30 |
| Dispersion liquid G-10 | B-1 | 5 | Dispersant 1 | 30 |
|  | B-19 | 5 |  |  |
| Dispersion liquid G-11 | B-1 | 5 | Dispersant 1 | 30 |
|  | B'-4 | 5 |  |  |
| Dispersion liquid G-12 | B-1 | 5 | Dispersant 1 | 30 |
|  | B'-5 | 5 |  |  |
| Dispersion liquid G-r1 | B'-1 | 10 | Dispersant 1 | 30 |
| Dispersion liquid G-r2 | B'-2 | 10 | Dispersant 1 | 30 |
| Dispersion liquid G-r3 | B'-3 | 10 | Dispersant 1 | 30 |
| Dispersion liquid G-r4 | B-1 | 1 | Dispersant 1 | 30 |

Details of the materials shown in the above table are as follows.

(Derivative)

B-1, B-2, B-4, B-14, B-19, and B-21: compounds having the structures described in the specific examples of the above-described compound A B'-1: compound having the following structure (azo compound (21) described in paragraph "0139" of JP2013-209639A; a numerical value added to a main chain represents the number of repeating units)

B'-2 to B'-5: compounds having the following structures

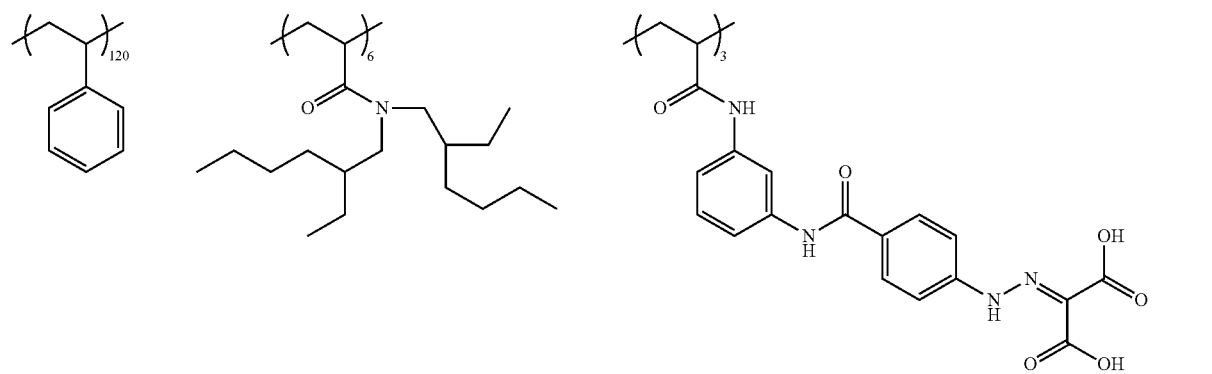

(B'-1)

-continued
(B'-2)
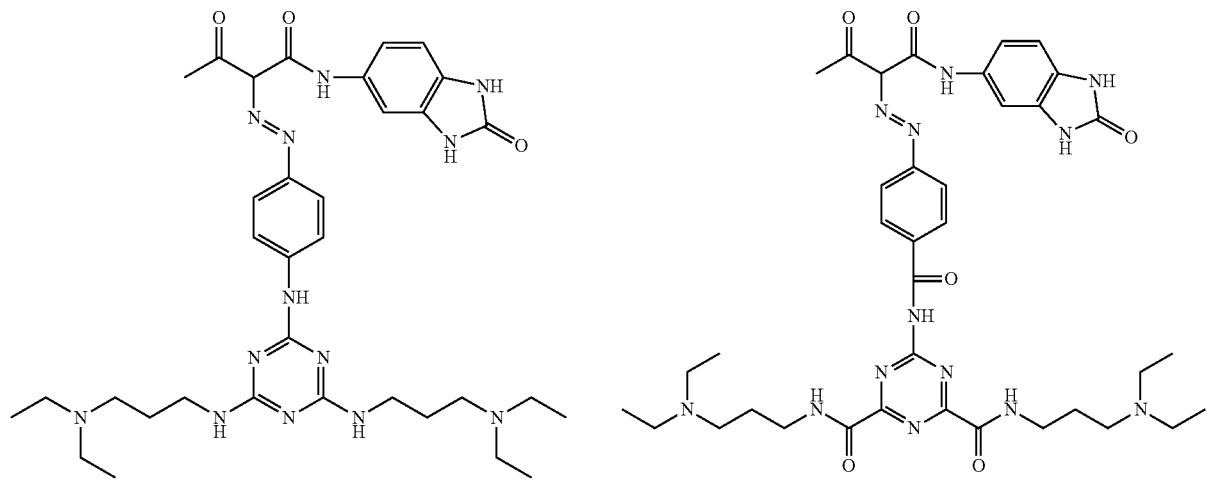
(B'-3)
(B'-4)
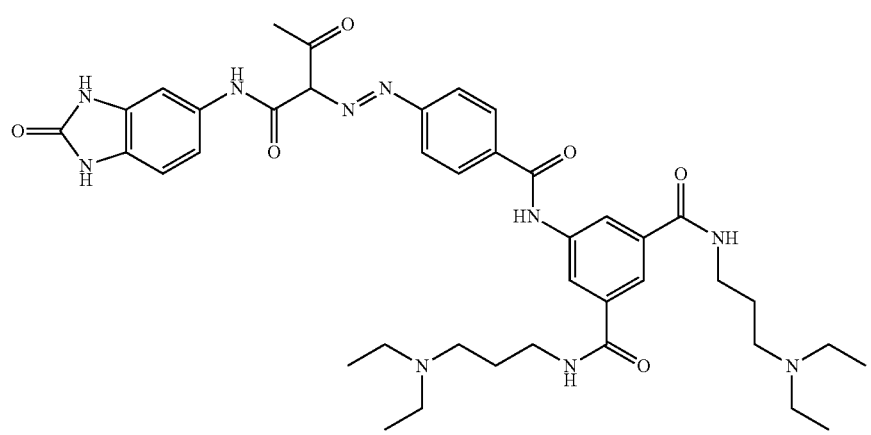
(B'-5)
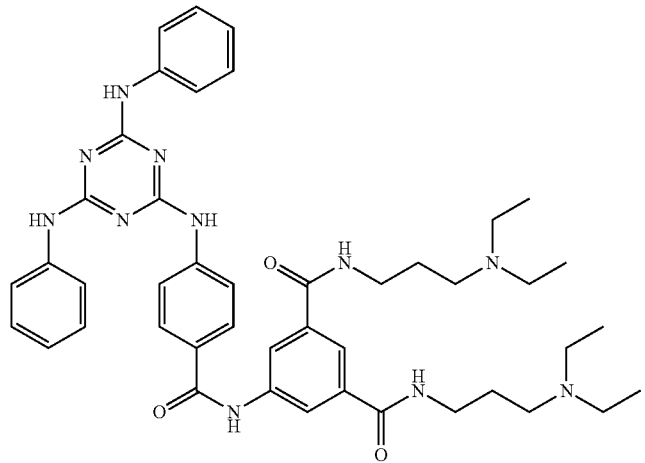

(Dispersant)

Dispersant 1: resin having the following structure (a numerical value added to a main chain represents a molar ratio, and a numerical value added to a side chain represents the number of repeating units; Mw: 10000, amine value: 45 (mgKOH/g), acid value: 32.3 (mgKOH/g))

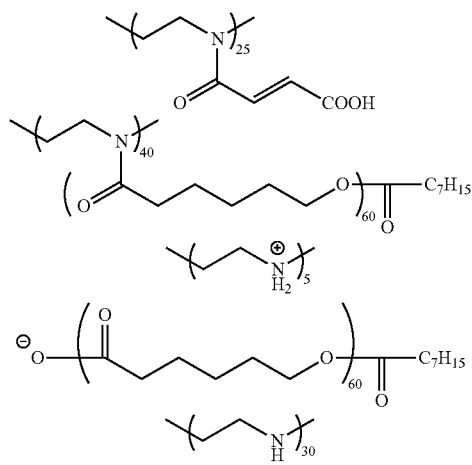

Dispersant 2: resin having the following structure (a numerical value added to a main chain represents a molar ratio, and a numerical value added to a side chain represents the number of repeating units; Mw: 20000, C=C value: 0.7 mmol/g, acid value: 72 mgKOH/g)

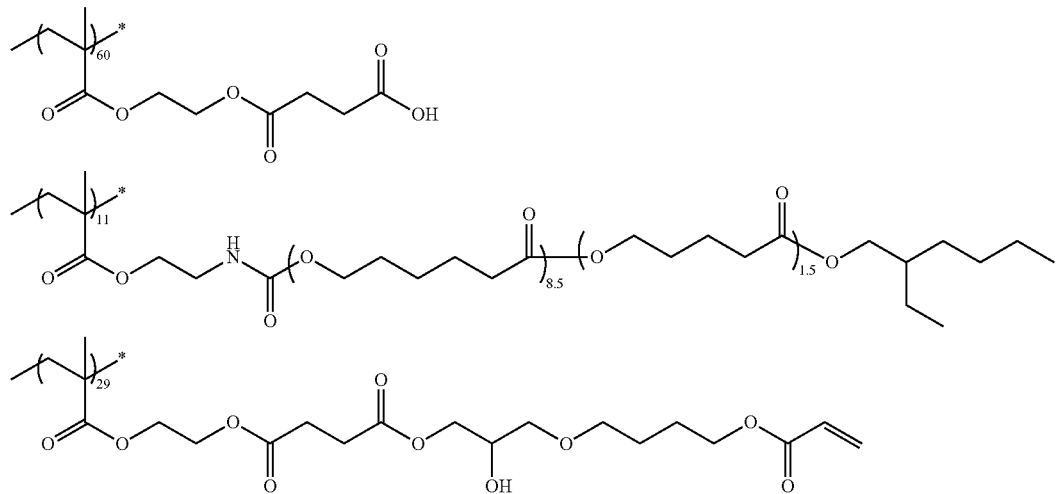

<Production of Dispersion Liquid G-13>

83 parts by mass of C. I. Pigment Green 58, 5 parts by mass of C. I. Pigment Yellow 185, 12 parts by mass of C. I. Pigment Yellow 150, 15 parts by mass of the dispersant 1, 5 parts by mass of the compound B-1 as a derivative, 5 parts by mass of benzyl methacrylate/methacrylic acid/2-hydroxyethyl methacrylate copolymer (=60/22/18 [molar ratio], Mw: 15000, Mn: 8000), and 260 parts by mass of PGMEA were mixed with each other. After that, the obtained mixed solution was mixed and dispersed for 3 hours using a beads mill (a high-pressure disperser with a pressure reducing mechanism, NANO-3000-10 (manufactured by Nippon BEE Chemical Co., Ltd.)) in which zirconia beads having a diameter of 0.3 mm were used. As a result, a dispersion liquid G-13 is produced.

<Production of Dispersion Liquid G-14>

40 parts by mass of C. I. Pigment Green 58, 43 parts by mass of C. I. Pigment Green 36, 5 parts by mass of C. I. Pigment Yellow 185, 12 parts by mass of C. I. Pigment Yellow 150, 15 parts by mass of the dispersant 1, 5 parts by mass of the compound B-1 as a derivative, 5 parts by mass of benzyl methacrylate/methacrylic acid/2-hydroxyethyl methacrylate copolymer (=60/22/18 [molar ratio], Mw: 15000, Mn: 8000), and 260 parts by mass of PGMEA were mixed with each other. After that, the obtained mixed solution was mixed and dispersed for 3 hours using a beads mill (a high-pressure disperser with a pressure reducing mechanism, NANO-3000-10 (manufactured by Nippon BEE Chemical Co., Ltd.)) in which zirconia beads having a diameter of 0.3 mm were used. As a result, a dispersion liquid is produced.

<Production of Dispersion Liquid G-15>

83 parts by mass of C. I. Pigment Green 36, 5 parts by mass of C. I. Pigment Yellow 185, 5 parts by mass of C. I. Pigment Yellow 150, 7 parts by mass of C. I. Pigment Yellow 139, 15 parts by mass of the dispersant 1, 5 parts by mass of the compound B-1 as a derivative, 5 parts by mass of benzyl methacrylate/methacrylic acid/2-hydroxyethyl methacrylate copolymer (=60/22/18 [molar ratio], Mw: 15000, Mn: 8000), and 260 parts by mass of PGMEA were mixed with each other. After that, the obtained mixed solution was mixed and dispersed for 3 hours using a beads mill (a high-pressure disperser with a pressure reducing mechanism, NANO-3000-10 (manufactured by Nippon BEE Chemical Co., Ltd.)) in which zirconia beads having a diameter of 0.3 mm were used. As a result, a dispersion liquid is produced.

<Production of Dispersion Liquid G-16>

83 parts by mass of C. I. Pigment Green 36, 5 parts by mass of C. I. Pigment Yellow 185, 12 parts by mass of C. I. Pigment Yellow 150, 30 parts by mass of the dispersant 1, 10 parts by mass of the compound B-1 as a derivative, 2.5 parts by mass of benzyl methacrylate/methacrylic acid/2-hydroxyethyl methacrylate copolymer (=60/22/18 [molar ratio], Mw: 15000, Mn: 8000), 2.5 parts by mass of cyclohexylmaleimide/methacrylic acid/methacrylic acid-2-hydroxyethyl copolymer (=60/22/18 [molar ratio], Mw: 15000, Mn: 8000), and 530 parts by mass of propylene glycol monomethyl ether acetate (PGMEA) were mixed with each other. After that, the obtained mixed solution was mixed and dispersed for 3 hours using a beads mill (a high-pressure disperser with a pressure reducing mechanism, NANO-3000-10 (manufactured by Nippon BEE Chemical Co., Ltd.)) in which zirconia beads having a diameter of 0.3 mm were used. As a result, a dispersion liquid is produced.

<Production of Dispersion Liquids G-101 to G108 and G-r101 to G-r103>

83 parts by mass of C. I. Pigment Green 36, 5 parts by mass of C. I. Pigment Yellow 185, 12 parts by mass of C. I. Pigment Yellow 150, 15 parts by mass of the dispersant 1, a derivative shown in the following table, 5 parts by mass of benzyl methacrylate/methacrylic acid/2-hydroxyethyl methacrylate copolymer (=60/22/18 [molar ratio], Mw: 15000, Mn: 8000), and 260 parts by mass of propylene glycol monomethyl ether acetate (PGMEA) were mixed with each other. After that, the obtained mixed solution was mixed and dispersed for 3 hours using a beads mill (a high-pressure disperser with a pressure reducing mechanism, NANO-3000-10 (manufactured by Nippon BEE Chemical Co., Ltd.)) in which zirconia beads having a diameter of 0.3 mm were used. As a result, a dispersion liquid is produced.

TABLE 2

| | Derivative | |
|---|---|---|
| | Type | Blending amount (part by mass) |
| Dispersion liquid G-101 | B-1 | 5 |
| Dispersion liquid G-102 | B-2 | 5 |
| Dispersion liquid G-103 | B-4 | 5 |
| Dispersion liquid G-104 | B-14 | 5 |
| Dispersion liquid G-105 | B-21 | 5 |
| Dispersion liquid G-106 | B-1 | 3 |
| Dispersion liquid G-107 | B-1 | 25 |
| Dispersion liquid G-108 | B-1 | 18 |
| Dispersion liquid G-r101 | B'-1 | 5 |
| Dispersion liquid G-r102 | B'-2 | 5 |
| Dispersion liquid G-r103 | B'-3 | 5 |

<Production of Curable Composition (Green Curable Composition)>

Example 1

The following raw materials were mixed to produce a curable composition.

Dispersion liquid G-1: 70 parts by mass

Photopolymerization initiator 1 (IRGACURE OXE01 [2-(O-benzoyloxime)-1-[4-(phenylthio)phenyl]-1,2-octanedione], manufactured by BASF): 1.2 parts by mass Polymerizable compound 1 (KAYARAD DPHA, manufactured by Nippon Kayaku Co., Ltd.): 1.56 parts by mass Polymerizable compound 2 (A-DPH-12E, manufactured by Shin-Nakamura Chemical Co., Ltd.): 3.64 parts by mass Resin 1 (resin having the following structure; a numerical value added to a main chain represents a molar ratio, Mw=11,000): 2.72 parts by mass

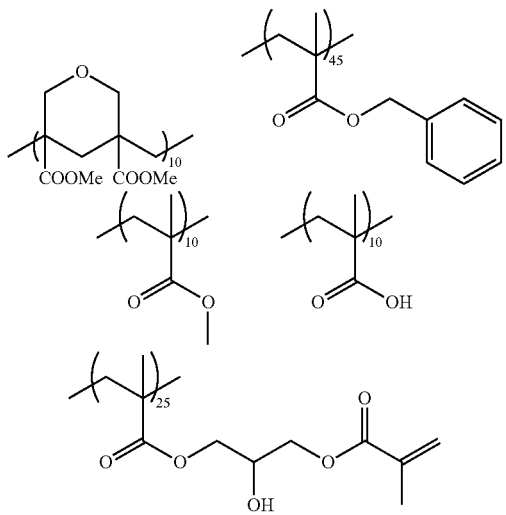

Fluorine surfactant 1 (F-475, manufactured by DIC Corporation): 0.01 parts by mass Ultraviolet absorber 1 (UV-503, manufactured by Daito Chemical Co., Ltd.): 0.9 parts by mass p-methoxyphenol: 0.002 parts by mass PGMEA: 20 parts by mass Examples 2 to 16 and Comparative Examples 1 to 4

A curable composition was produced in the same manner as in Example 1, except that the dispersion liquid G-1 compounded in Example 1 was changed to the dispersion liquid shown in the tables below.

Example 17

A curable composition was produced in the same manner as in Example 1, except that the polymerizable compound 2 compounded in Example 1 was changed to 4-nitrophenyl acrylate having the same amount thereof.

Example 18

A curable composition was produced in the same manner as in Example 1, except that the photopolymerization initiator 1 compounded in Example 1 was changed to 0.6 parts by mass of a photopolymerization initiator 2 (IRGACURE 379 [2-(dimethylamino)-2-[(4-methylphenyl)methyl]-1-[4-(4-morpholinyl)phenyl]-1-butanone], manufactured by BASF).

Example 19

A curable composition was produced in the same manner as in Example 1, except that 0.6 parts by mass of the photopolymerization initiator 1 compounded in Example 1 was changed to 0.3 parts by mass of the photopolymerization initiator 1 and 0.3 parts by mass of the photopolymerization initiator 2.

Example 20

A curable composition was produced in the same manner as in Example 1, except that 20 parts by mass of PGMEA compounded in Example 1 was changed to 10 parts by mass of PGMEA and 10 parts by mass of propylene glycol monomethyl ether.

Example 21

A curable composition was produced in the same manner as in Example 1, except that 20 parts by mass of PGMEA compounded in Example 1 was changed to 10 parts by mass of PGMEA and 10 parts by mass of butyl acetate.

Example 101

The following raw materials were mixed to produce a curable composition.
Dispersion liquid G101: 90 parts by mass
Photopolymerization initiator 1: 0.6 parts by mass
Polymerizable compound 1: 0.78 parts by mass
Polymerizable compound 2: 1.82 parts by mass
Resin 1: 1.36 parts by mass
Fluorine surfactant 1: 0.005 parts by mass
Ultraviolet absorber 1: 0.45 parts by mass
p-methoxyphenol: 0.001 parts by mass
PGMEA: 5 parts by mass Examples 102 to 108 and Comparative Examples 101 to 103

A curable composition was produced in the same manner as in Example 1, except that the dispersion liquid G-101 compounded in Example 101 was changed to the dispersion liquid shown in the tables below.

<Evaluation of Dispersibility>
(Particle Diameter)

Using a dynamic light scattering particle size distribution analyzer (LB-500 (trade name) manufactured by HORIBA, Ltd.) according to JIS 8826:2005, the curable composition as described above was dispensed into a 20 ml sample bottle, and diluted with PGMEA so as to adjust the concentration of solid contents to be 0.2 mass %. Using a 2 ml measuring quartz cell, data acquisition of the above-described diluted solution was performed 50 times at a temperature of 25° C., and the obtained number-based arithmetic average was taken as the average particle diameter.

[Evaluation Standard]
A: average particle diameter was 0.1 µm or less.
B: average particle diameter was more than 0.1 µm and 0.15 µm or less.
C: average particle diameter was more than 0.15 µm and 0.2 µm or less.
D: average particle diameter was more than 0.2 µm and 0.4 µm or less.
E: average particle diameter was more than 0.4 m.

(Viscosity)

The viscosity of the curable composition obtained as described above was measured by "RE-85L" manufactured by TOKI SANGYO CO., LTD. After that, the curable composition was left to stand under the conditions of 45° C. and 3 days, and then the viscosity thereof was measured again. Dispersibility was evaluated according to the following evaluation standard from a viscosity difference (ΔVis) before and after leaving to stand. It can be said that the smaller the numerical value of the viscosity difference (ΔVis), the better the dispersibility. The viscosity of the curable composition was measured in a state in which the temperature was adjusted to 25° C. The evaluation results are shown in the following tables.

[Evaluation Standard]
A: ΔVis was 0.5 mPa×s or less.
B: ΔVis was more than 0.5 mPa×s and 1.0 mPa×s or less.
C: ΔVis was more than 1.0 mPa×s and 2.0 mPa×s or less.
D: ΔVis was more than 2.0 mPa×s and 3.0 mPa×s or less.
E: ΔVis was more than 3.0 mPa×s.

<Evaluation of Curability>
(Line Width Sensitivity)

CT-4000 (manufactured by Fujifilm Electronic Materials Co., Ltd.) was applied to a silicon wafer by a spin coating method so that the thickness of a film was 0.1 m, and the silicon wafer was heated at 220° C. for 1 hour using a hot plate to form a base layer. Each curable composition was applied to this silicon wafer with a base layer using a spin coating method, and then the silicon wafer with a base layer was heated at 100° C. for 2 minutes using a hot plate to obtain a composition layer having a film thickness of 0.5 m. Using an i-ray stepper FPA-3000i5+(manufactured by Canon Inc.), the composition layer was irradiated with light with a wavelength of 365 nm through a mask pattern in which each of the square pixels with a side length of 1.1 µm was arranged on the substrate in a region of 4 mm×3 mm to perform exposure thereon with an exposure dose of 50 to 2000 mJ/cm$^2$ at 50 mJ intervals. The composition layer after exposure was subjected to puddle development for 60 seconds at 23° C. using a 0.3 mass % of aqueous solution of tetramethylammonium hydroxide. Next, the composition layer was rinsed by spin showering with water and was cleaned with pure water. Thereafter, water droplets were splashed by high-pressure air, and the silicon wafer was naturally dried. Next, post-baking was performed for 300 seconds at 220° C. using a hot plate to form a pattern. The line width sensitivity of the obtained pattern was evaluated as the line width sensitivity at the exposure dose in which the line width after development of the area irradiated with light in the exposure step was 1.1 m. As the value of the line width sensitivity is smaller, the sensitivity is higher.

[Evaluation Standard]
A: line width sensitivity was 50 mJ/cm$^2$ or less.
B: line width sensitivity was more than 50 mJ/cm$^2$ and 200 mJ/cm$^2$ or less.
C: line width sensitivity was more than 200 mJ/cm$^2$ and 500 mJ/cm$^2$ or less.
D: line width sensitivity was more than 500 mJ/cm$^2$ and 1000 mJ/cm$^2$ or less.
E: line width sensitivity was more than 1000 mJ/cm$^2$.

(Pattern Peeling)

CT-4000 (manufactured by Fujifilm Electronic Materials Co., Ltd.) was applied to a silicon wafer by a spin coating method so that the thickness of a film was 0.1 m, and the silicon wafer was heated at 220° C. for 1 hour using a hot plate to form a base layer. Each curable composition was applied to this silicon wafer with a base layer using a spin coating method, and then the silicon wafer with a base layer was heated at 100° C. for 2 minutes using a hot plate to obtain a composition layer having a film thickness of 0.5 m. Using an i-ray stepper FPA-3000i5+(manufactured by Canon Inc.), the composition layer was irradiated with light with a wavelength of 365 nm through a mask pattern in which each of the square pixels with a side length of 1.1 µm was arranged on the substrate in a region of 4 mm×3 mm to perform exposure thereon with an exposure dose of 500 mJ/cm$^2$. The composition layer after exposure was subjected to puddle development for 60 seconds at 23° C. using a 0.3 mass % of aqueous solution of tetramethylammonium hydroxide. Next, the composition layer was rinsed by spin showering with water and was cleaned with pure water. Thereafter, water droplets were splashed by high-pressure air, and the silicon wafer was naturally dried. Next, post-baking was performed for 300 seconds at 220° C. using a hot plate to form a pattern. The obtained pattern was observed using an optical microscope, and among all patterns, patterns closely attached with each other were counted to evaluate the pattern peeling.

A: all patterns were closely attached with each other.

B: patterns closely attached with each other is 95% or more and less than 100% of all patterns.

C: patterns closely attached with each other is 90% or more and less than 95% of all patterns.

D: patterns closely attached with each other is 85% or more and less than 90% of all patterns.

E: patterns closely attached with each other is less than 85% of all patterns.

The evaluation results are shown in the following tables. The numerical value in the content of the compound A in the following tables is a value of the content (mass %) of the above-described compound A (compound having each of a coloring agent partial structure, an acid group or a basic group, and a curable group) in the total solid content of the curable composition.

TABLE 3

|  | Type of dispersion liquid | Content of compound A (mass %) | Dispersibility | | Curability | |
|---|---|---|---|---|---|---|
|  |  |  | Particle diameter of pigment | Viscosity | Line width sensitivity | Pattern peeling |
| Example 1 | G-1 | 4.0 | B | B | B | B |
| Example 2 | G-2 | 7.5 | A | B | A | B |
| Example 3 | G-3 | 10.7 | A | A | A | A |
| Example 4 | G-4 | 4.0 | A | A | A | A |
| Example 5 | G-5 | 4.0 | A | A | A | A |
| Example 6 | G-6 | 1.3 | C | C | C | C |
| Example 7 | G-7 | 13.4 | B | B | A | A |
| Example 8 | G-8 | 6.9 | A | A | A | A |
| Example 9 | G-9 | 4.0 | A | A | A | A |
| Example 10 | G-10 | 4.0 | A | A | A | A |
| Example 11 | G-11 | 2.1 | B | B | B | B |
| Example 12 | G-12 | 2.1 | B | B | A | B |
| Example 13 | G-13 | 2.8 | A | A | C | C |
| Example 14 | G-14 | 2.8 | B | B | C | B |
| Example 15 | G-15 | 2.8 | C | B | B | B |
| Example 16 | G-16 | 2.8 | C | B | C | B |
| Example 17 | G-1 | 4.0 | A | A | A | A |
| Example 18 | G-1 | 4.0 | B | B | C | C |
| Example 19 | G-1 | 4.0 | B | B | C | B |
| Example 20 | G-1 | 4.0 | B | C | B | B |
| Example 21 | G-1 | 4.0 | C | B | B | B |
| Comparative Example 1 | G-r1 | — | E | E | B | C |
| Comparative Example 2 | G-r2 | — | C | C | E | E |
| Comparative Example 3 | G-r3 | — | A | A | E | E |
| Comparative Example 4 | G-r4 | 0.4 | D | D | D | D |

TABLE 4

|  | Type of dispersion liquid | Content of compound A (mass %) | Dispersibility | | Curability | |
|---|---|---|---|---|---|---|
|  |  |  | Particle diameter of pigment | Viscosity | Line width sensitivity | Pattern peeling |
| Example 101 | G-101 | 2.8 | B | B | C | C |
| Example 102 | G-102 | 2.8 | B | B | C | B |
| Example 103 | G-103 | 2.8 | B | B | B | A |
| Example 104 | G-104 | 2.8 | A | B | A | A |
| Example 105 | G-105 | 2.8 | B | B | A | A |
| Example 106 | G-106 | 1.7 | C | C | C | C |
| Example 107 | G-107 | 13.8 | A | A | A | B |
| Example 108 | G-108 | 9.9 | A | A | A | A |
| Comparative Example 101 | G-r101 | — | E | E | D | E |
| Comparative Example 102 | G-r102 | — | C | C | E | E |
| Comparative Example 103 | G-r103 | — | A | A | E | E |

As shown in the tables, the curable compositions of Examples had good dispersibility and curability.

Example 201

A curable composition was produced in the same manner as in Example 1, except that the following dispersion liquid R-1 was used instead of the dispersion liquid G-1 compounded in Example 1. Regarding the obtained curable compositions, the dispersibility and curability were evaluated in the same manner as in Example 1. In each evaluation, the same results as in Example 1 were obtained.

Dispersion liquid R-1: dispersion liquid prepared by the following method 230 parts by mass of zirconia beads having a diameter of 0.3 mm were added to a mixed solution obtained by mixing 10.5 parts by mass of C. I. Pigment Red 254, 4.5 parts by mass of C. I. Pigment Yellow 139, 2.0 parts by mass of the compound B-1 as a derivative, 5.5 parts by mass of the dispersant 10, and 77.5 parts by mass of PGMEA, the mixture was subjected to a dispersion treatment for 3 hours using a paint shaker, and the beads were separated by filtration to prepare a dispersion liquid R-1.

Dispersant 10: a resin having the following structure (a numerical value added to a main chain represents a molar ratio, and a numerical value added to a side chain represents the number of repeating units; Mw=10000, acid value: 52.5 mgKOH/g)

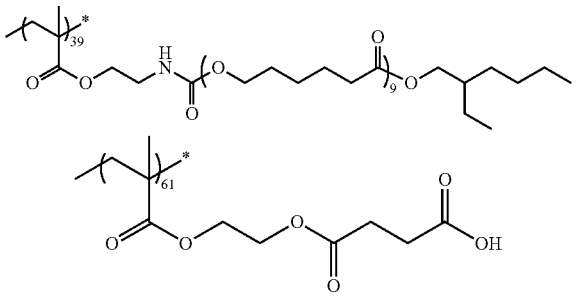

Example 301

A curable composition was produced in the same manner as in Example 1, except that the following dispersion liquid BI-1 was used instead of the dispersion liquid G-1 compounded in Example 1. Regarding the obtained curable compositions, the dispersibility and curability were evaluated in the same manner as in Example 1. In each evaluation, the same results as in Example 1 were obtained.

Dispersion liquid BI-1: pigment dispersion liquid prepared by the following method 230 parts by mass of zirconia beads having a diameter of 0.3 mm were added to a mixed solution obtained by mixing 12 parts by mass of C. I. Pigment Blue 15:6, 3 parts by mass of V dye 2 (acid value=7.4 mgKOH/g) described in paragraph "0292" of JP2015-041058A, 2.7 parts by mass of the compound B-1 as a derivative, 4.8 parts by mass of the dispersant 10, and 77.5 parts by mass of PGMEA, the mixture was subjected to a dispersion treatment for 3 hours using a paint shaker, and the beads were separated by filtration to prepare a dispersion liquid.

Example 401

A silicon wafer was coated with a Green composition using a spin coating method so that the thickness of a film after post-baking was 1.0 m. Next, the coating film was heated using a hot plate at 100° C. for 2 minutes. Next, using an i-ray stepper exposure device FPA-3000 i5+(manufactured by Canon Inc.), irradiation (exposure) was performed with light having a wavelength of 365 nm and an exposure dose of 1000 mJ/cm$^2$ through a mask having a dot pattern of 2 µm square. Next, puddle development was performed at 23° C. for 60 seconds using a tetramethylammonium hydroxide (TMAH) 0.3 mass % aqueous solution. Next, the coating film was rinsed by spin showering and was cleaned with pure water. Next, the Green composition was patterned by heating (post-baking) at 200° C. for 5 minutes using a hot plate. Likewise, a Red composition and a Blue composition were sequentially patterned to form green, red, and blue-colored patterns (Bayer pattern). As the Green composition, the curable composition of Example 1 was used. The Red composition and the Blue composition will be described later. The Bayer pattern refers to a pattern, as disclosed in the specification of U.S. Pat. No. 3,971,065A, in which a 2×2 array of color filter element having one Red element, two Green elements, and one Blue element is repeated. The obtained color filter was incorporated into a solid-state imaging element according to a known method. The solid-state imaging element had a suitable image recognition ability.

—Red Composition—

The following components were mixed and stirred, and the obtained mixture was filtered through a nylon filter (manufactured by Nihon Pall Corporation) having a pore size of 0.45 µm to prepare a Red composition.

Red pigment dispersion liquid: 51.7 parts by mass
40 mass % PGMEA solution of resin D1: 0.6 parts by mass
Polymerizable compound 6: 0.6 parts by mass
Photopolymerization initiator 1: 0.3 parts by mass
Surfactant 2: 4.2 parts by mass
PGMEA: 42.6 parts by mass —Blue Composition—

The following components were mixed and stirred, and the obtained mixture was filtered through a nylon filter (manufactured by Nihon Pall Corporation) having a pore size of 0.45 µm to prepare a Blue composition.

Blue pigment dispersion liquid: 44.9 parts by mass
40 mass % PGMEA solution of resin D1: 2.1 parts by mass
Polymerizable compound 1: 1.5 parts by mass
Polymerizable compound 6: 0.7 parts by mass
Photopolymerization initiator 1: 0.8 parts by mass
Surfactant 2: 4.2 parts by mass
PGMEA: 45.8 parts by mass The raw materials used for the Red composition and the Blue composition are as follows.

Red Pigment Dispersion Liquid

A mixed solution consisting of 9.6 parts by mass of C. I. Pigment Red 254, 4.3 parts by mass of C. I. Pigment Yellow 139, 6.8 parts by mass of a dispersant (Disperbyk-161, manufactured by BYK Chemie), and 79.3 parts by mass of PGMEA was mixed and dispersed using a beads mill (zirconia beads; diameter: 0.3 mm) for 3 hours. Next, using a high-pressure disperser NANO-3000-10 (manufactured by Nippon BEE Chemical Co., Ltd.) equipped with a pressure reducing mechanism, the pigment dispersion liquid was further dispersed under a pressure of 2,000 kg/cm$^3$ at a flow rate of 500 g/min. This dispersion treatment was repeated 10 times. As a result, a Red pigment dispersion liquid was obtained.

Blue Pigment Dispersion Liquid 9.7 parts by mass of C. I. Pigment Blue 15:6, 2.4 parts by mass of C. I. Pigment Violet 23, 5.5 parts by mass of a dispersant (Disperbyk-161, manufactured by BYK Chemie), 82.4 parts by mass of PGMEA were mixed with each other to obtain a mixed solution, and the mixed solution was mixed and dispersed using a beads mill (zirconia beads; diameter: 0.3 mm) for 3 hours. Next, using a high-pressure disperser NANO-3000-10 (manufactured by Nippon BEE Chemical Co., Ltd.) equipped with a pressure reducing mechanism, the pigment dispersion liquid was further dispersed under a pressure of 2,000 kg/cm³ at a flow rate of 500 g/min. This dispersion treatment was repeated 10 times. As a result, a Blue pigment dispersion liquid was obtained.

Resin D1: resin having the following structure (the numerical value described together with the main chain indicates a molar ratio, Mw=11,000)

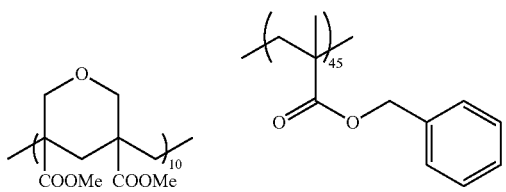

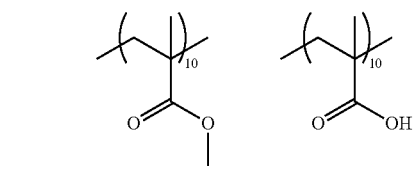

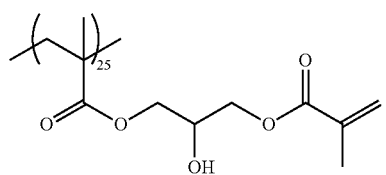

Polymerizable compound 1 (KAYARAD DPHA, manufactured by Nippon Kayaku Co., Ltd.)

Polymerizable compound 6: compound having the following structure

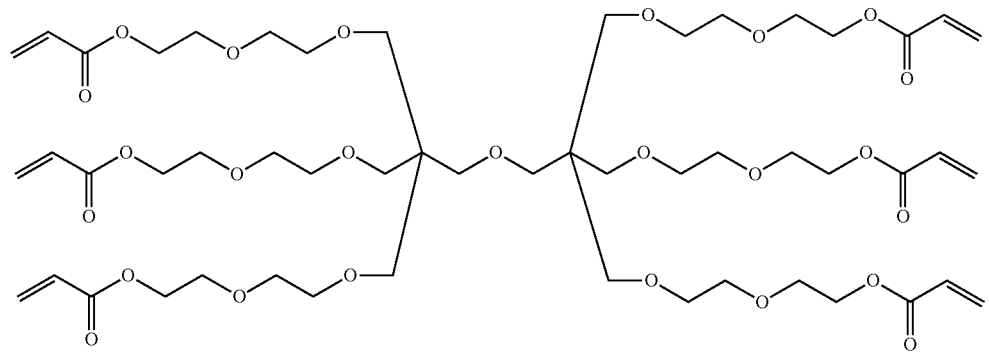 [SMILES: C=CC(=O)OCCOCCOCC(COCCOCCOC(=O)C=C)(COCCOCCOC(=O)C=C)COCC(COCCOCCOC(=O)C=C)(COCCOCCOC(=O)C=C)COCCOCCOC(=O)C=C]

Photopolymerization initiator 1: (IRGACURE-OXE01 [2-(O-benzoyloxime)-1-[4-(phenylthio)phenyl]-1,2-octanedione], manufactured by BASF)

Surfactant 2: 1 mass % PGMEA solution of the following mixture (Mw=14000; in the following formula, "%" representing the proportion of a repeating unit is mol %)

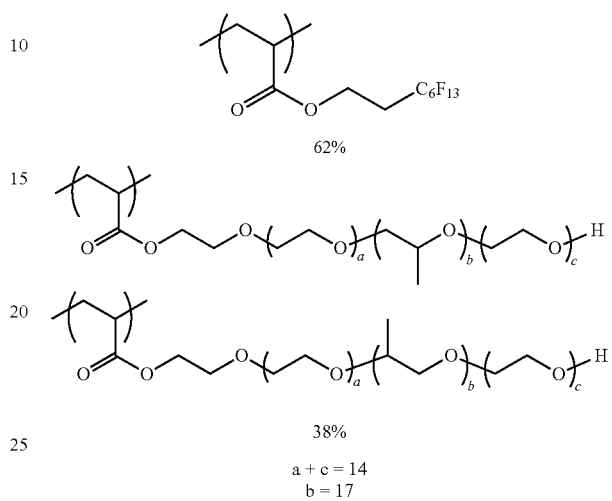

$a + c = 14$
$b = 17$

What is claimed is:

1. A curable composition comprising:
   a pigment;
   a compound A having each of a coloring agent partial structure, an acid group or a basic group, and a curable group;
   a photopolymerization initiator;
   a curable compound other than the compound A; and
   a resin,
   wherein a content of the compound A in a total solid content of the curable composition is 1 to 15 mass %;
   the coloring agent partial structure included in the compound A is a partial structure derived from a coloring agent selected from the group consisting of a benzimidazolone coloring agent, a benzimidazolinone coloring agent, a quinophthalone coloring agent, a phthalocyanine coloring agent, an anthraquinone coloring agent, a diketopyrrolopyrrole coloring agent, a quinacridone coloring agent, an azo coloring agent, an isoindolinone coloring agent, an isoindoline coloring agent, a dioxazine coloring agent, a perylene coloring agent, and a thioindigo coloring agent;

the compound A is a compound represented by any one of Formulae (A1) to (A3), $$\left(\left(A^1\right)_{a1} L^{11}\right)_n - P^1 - \left(L^{12} - \left(B^1\right)_{b1}\right)_m \quad (A1)$$

$$P^2 - \left(\underset{A^2_{a2}}{L^{21}} - \left(B^2\right)_{b2}\right)_j \quad (A2)$$

$$P^3 - \left(L^{31} - \left(B^3 - A^3\right)_{a3}\right)_k \quad (A3)$$

in Formula (A1), $P^1$ represents the coloring agent partial structure, $L^{11}$ represents an a1+1 valent linking group, $L^{12}$ represents a b1+1 valent linking group, $A^1$ represents the curable group, $B^1$ represents the acid group or the basic group, and a1, b1, n, and m each independently represent an integer of 1 or more, in Formula (A2), $P^2$ represents the coloring agent partial structure, $L^{21}$ represents an a2+b2+1 valent linking group, $A^2$ represents the curable group, $B^2$ represents the acid group or the basic group, and a2, b2, and j each independently represent an integer of 1 or more, and in Formula (A3), $P^3$ represents the coloring agent partial structure, $L^{31}$ represents an a3+1 valent linking group, $A^3$ represents the curable group, $B^3$ represents the acid group or the basic group, and a3 and k each independently represent an integer of 1 or more, wherein $L^{11}$, $L^{12}$, $L^{21}$, and $L^{31}$ are each independently represented by any one of Formulae (L-1) to (L-5), (L-1) [structure]

(L-2) [structure]

(L-3) [structure]

(L-4) [structure]

(L-5) [structure]

in the formulae, * represents a bonding hand, p1 represents an integer of 0 to 5 and p2 represents an integer of 1 to 6, in which p1+p2 is an integer of 2 to 6, $L^{100}$ to $L^{105}$ each independently represent a single bond or a divalent linking group, and $X^1$, $X^2$, and $X^3$ each independently represent —O—, —S—, or —$NR^{L1}$—, in which $R^{L1}$ represents a hydrogen atom, an alkyl group, or an aryl group.

2. The curable composition according to claim 1, wherein the acid group included in the compound A is at least one selected from the group consisting of a carboxyl group, a sulfo group, a phosphoric acid group, and salts thereof, and the basic group included in the compound A is at least one selected from the group consisting of an amino group, a pyridyl group, salts thereof, a phthalimidomethyl group, and a salt of an ammonium group.

3. The curable composition according to claim 1, wherein the curable group included in the compound A is at least one selected from the group consisting of an ethylenically unsaturated bonding group and a cyclic ether group.

4. The curable composition according to claim 1, wherein the compound A is a compound having each of the coloring agent partial structure, the basic group, and the curable group.

5. The curable composition according to claim 1, wherein the resin includes a resin having an acid group.

6. The curable composition according to claim 1, wherein the pigment includes a chromatic pigment.

7. The curable composition according to claim 1, wherein the pigment includes a green pigment.

8. The curable composition according to claim 1, wherein the curable composition includes two or more kinds of the pigment.

9. The curable composition according to claim 1, wherein the curable compound includes a polyfunctional polymerizable monomer.

10. The curable composition according to claim 1, further comprising:

an organic solvent.

11. A method for producing the curable composition according to claim 1, the method comprising:

dispersing the pigment in a presence of the compound A having each of a coloring agent partial structure, an acid group or a basic group, and a curable group, and the resin.

12. A film which is formed from the curable composition according to claim 1.

13. A color filter comprising:

the film according to claim 12.

14. A method for manufacturing a color filter, comprising:
forming a curable composition layer on a support using the curable composition according to claim 1; and
forming a pattern on the curable composition layer by a photolithography method.

15. A solid-state imaging element comprising:
the film according to claim 12.

16. An image display device comprising:
the film according to claim 12.

17. The curable composition according to claim 1, wherein the compound A is a compound represented by Formula (A2).

\* \* \* \* \*